United States Patent
Uribe-Romo et al.

(10) Patent No.: US 11,964,992 B2
(45) Date of Patent: Apr. 23, 2024

(54) SOLID SOLUTION APPROACH FOR REDOX ACTIVE METAL ORGANIC FRAMEWORKS WITH TUNABLE REDOX CONDUCTIVITY

(71) Applicants: UNIVERSITY OF CENTRAL FLORIDA RESEARCH FOUNDATION, INC., Orlando, FL (US); THE BOARD OF TRUSTEES OF THE UNIVERSITY OF ILLINOIS, Urbana, IL (US)

(72) Inventors: Fernando Javier Uribe-Romo, Orlando, FL (US); Gavin Pour, Orlando, FL (US); David Fairchild, Orlando, FL (US); Joaquin Rodriguez Lopez, Urbana, IL (US)

(73) Assignees: UNIVERSITY OF CENTRAL FLORIDA RESEARCH FOUNDATION, INC., Orlando, FL (US); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 322 days.

(21) Appl. No.: 17/068,165

(22) Filed: Oct. 12, 2020

(65) Prior Publication Data

US 2021/0179652 A1 Jun. 17, 2021

Related U.S. Application Data

(60) Provisional application No. 62/913,470, filed on Oct. 10, 2019.

(51) Int. Cl.
C07F 17/02 (2006.01)
C25B 11/048 (2021.01)

(52) U.S. Cl.
CPC ............ *C07F 17/02* (2013.01); *C25B 11/048* (2021.01)

(58) Field of Classification Search
CPC ............................... C07F 17/02; C25B 11/048
See application file for complete search history.

(56) References Cited

U.S. PATENT DOCUMENTS 9,741,945 B1 * 8/2017 Nenoff ................. H10K 85/321

OTHER PUBLICATIONS

Pour, Gavin, "Synthetic Design and Characterization of Polycyclic Aromatic Compounds in Molecular and Extended System" (2019). Electronic Theses and Dissertations. 6389. (Year: 2019).*

(Continued)

*Primary Examiner* — Latosha Hines
(74) *Attorney, Agent, or Firm* — Timothy H. Van Dyke; WOLTER, VAN DYKE, DAVIS, PLLC

(57) ABSTRACT

Various embodiments relate to a method for producing a metal-organic framework (MOF) having a desired redox conductivity and including redox-active linkers, having ω-alkyl-ferrocene groups, via de novo solvothermal synthesis. Various embodiments relate to a metal-organic framework (MOF) linker comprising an ω-alkyl-ferrocene group. Various embodiments relate to a metal-organic framework (MOF), having a first plurality of redox-active linkers, each having an ω-alkyl-ferrocene group. The MOF according to various embodiments, may further have one or more redox-inactive linkers. Various embodiments relate to materials, apparatuses, and components that include the MOF according to various embodiments. For example, various embodiments relate to thin-films, bulk powders, or electrodes.

3 Claims, 32 Drawing Sheets

(56) References Cited

OTHER PUBLICATIONS

Schaate, A., Roy, P., Preuße, T., Lohmeier, S.J., Godt, A. and Behrens, P. (2011), Porous Interpenetrated Zirconium-Organic Frameworks (PIZOFs): A Chemically Versatile Family of Metal-Organic Frameworks. Chem. Eur. J., 17: 9320-9325. (Year: 2011).*
Lippk et al. "ExpandingtheGroupofPorousInterpenetratedZr-OrganicFrameworks(PIZOFs)withLinkersofDifferentLengths". Inorg.Chem. 2017,56,2,748-761. PublicationDate:Dec. 29,2016 (Year: 2016).*
Schaate,A.,Roy,P.,PreuRe,T.,Lohmeier,S.J.,Godt,A.andBehrens,P. (2011), PorousInterpenetratedZirconium—Organic Frameworks(PIZOFs):AChemicallyVersatileFamilyofMetal—OrganicFrameworks. Chem.Eur.J.,17:9320-9325. (Year: 2011).*
Fritsch-Faules, Ingrid et al., "A microscopic model for diffusion of electrons by successive hopping among redox in networks", J. Electroanal. Chem, Jan. 3, 1989, vol. 263, pp. 237-255.
Liu, Xiong et al., "Controlled ROMP Synthesis of Ferrocene-Containing Amphiphilic Dendronized Diblock Copolymers as Redox-Controlled Polymer Carriers", Macromol. Chem. Phys., 2018, vol. 219, No. 1800273, 14 pages.
Palmer, Rebecca H. et al., "Electroactive Ferrocene at or near the Surface of Metal—Organic Framework UiO-66", Langmuir, 2018, vol. 34, pp. 4707-4714.
Schaate, Andreas et al., "Porous Interpenetrated Zirconium—Organic Frameworks (PIZOFs) A Chemically Versatile Family of Metal-Organic Frameworks", Chem. Eur. J., vol. 17, pp. 9320-9325.
Mohammad-Pour et al., "A Solid-Solution Approach for Redox Active Metal-Organic Frameworks with Tunable Redox Conductivity", J. Am. Chem. Soc. 1029, vol. 141, pp. 19978-19982.

* cited by examiner

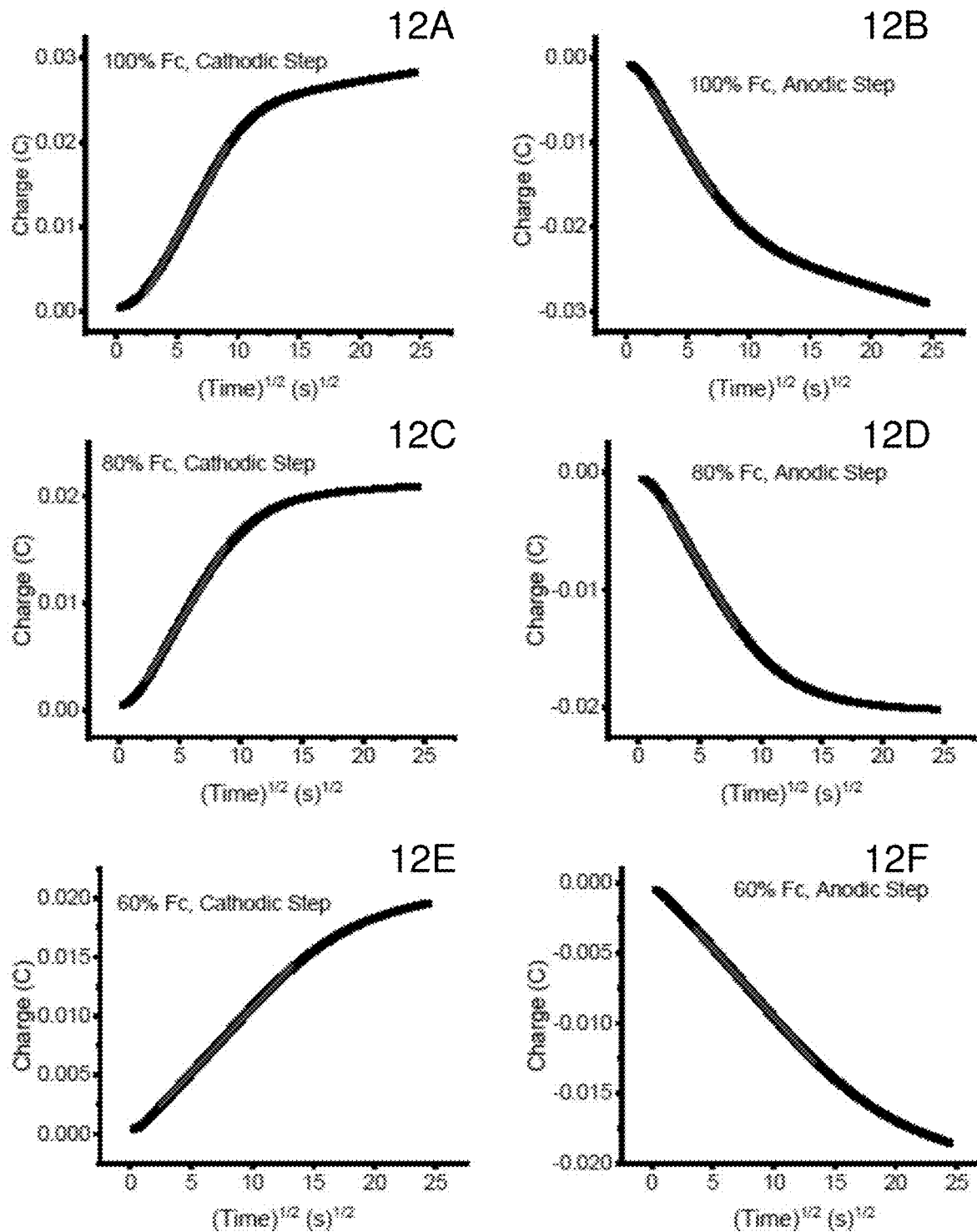
FIG. 12A-F

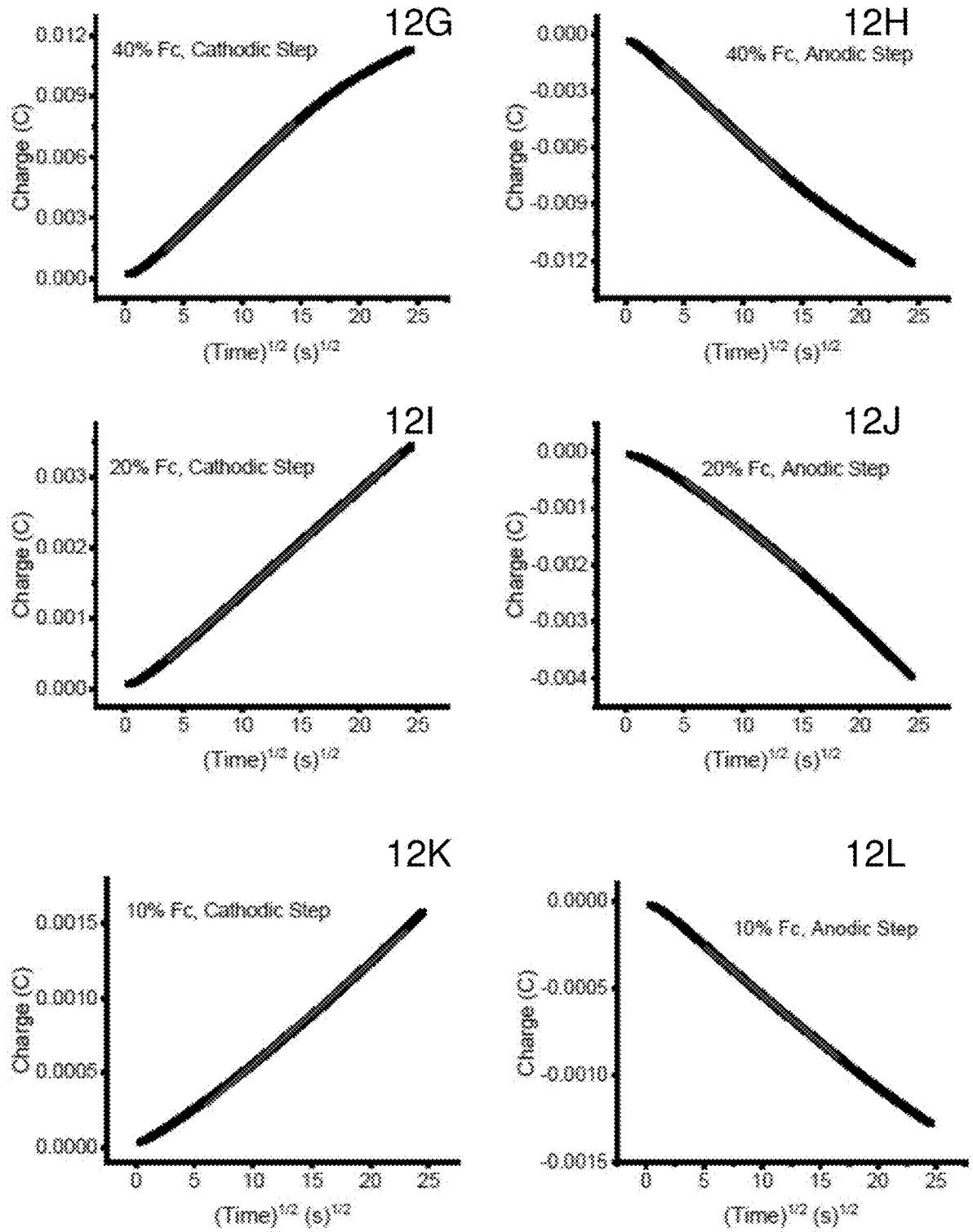
FIG. 12G-L

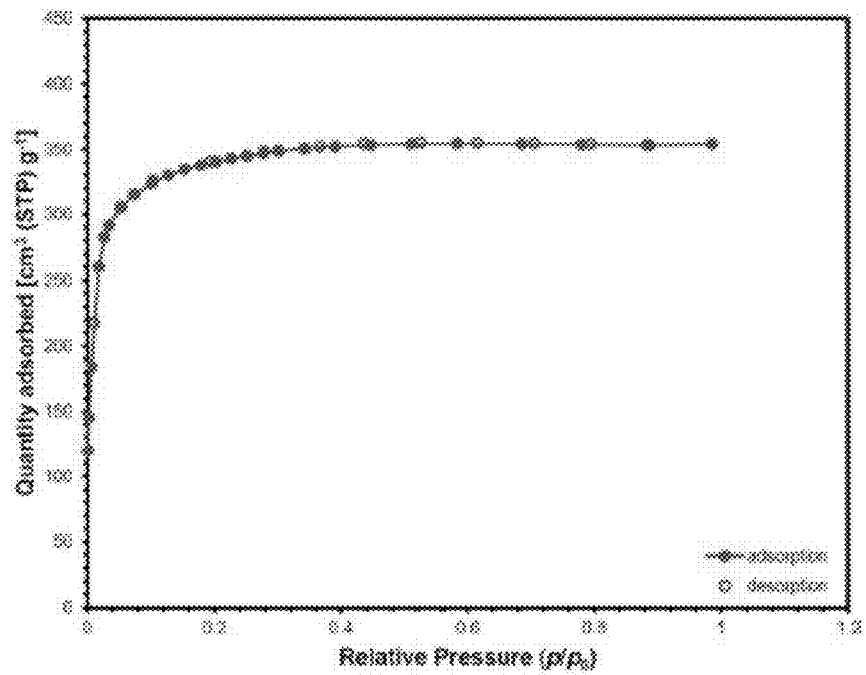
FIG. 19A
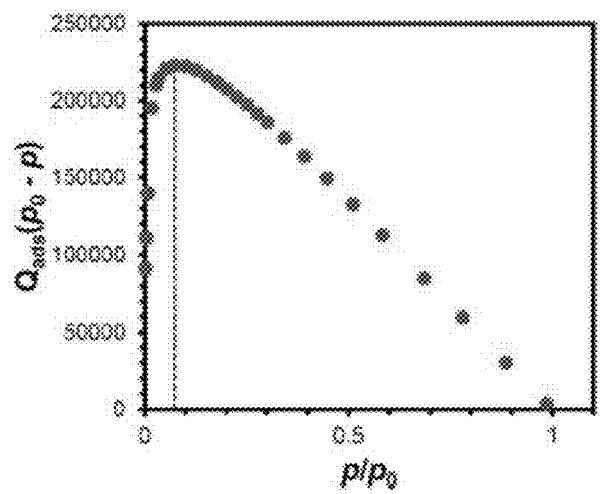 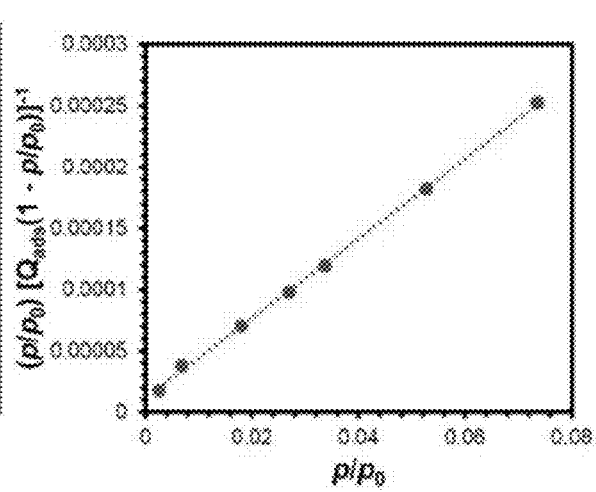
FIG. 19B  FIG. 19C

FIG. 24A
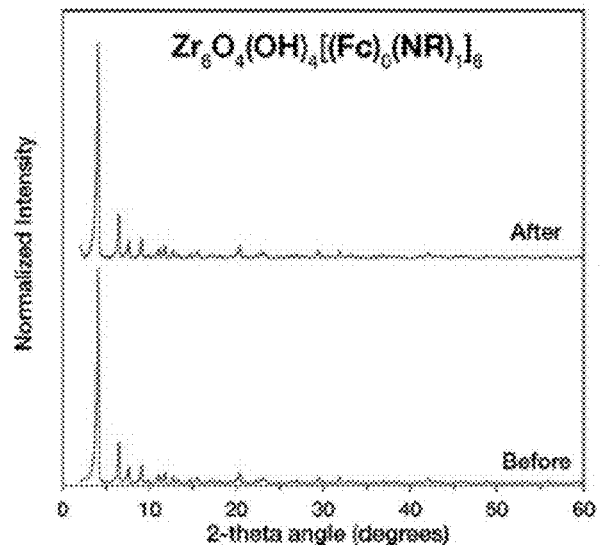
FIG. 24B
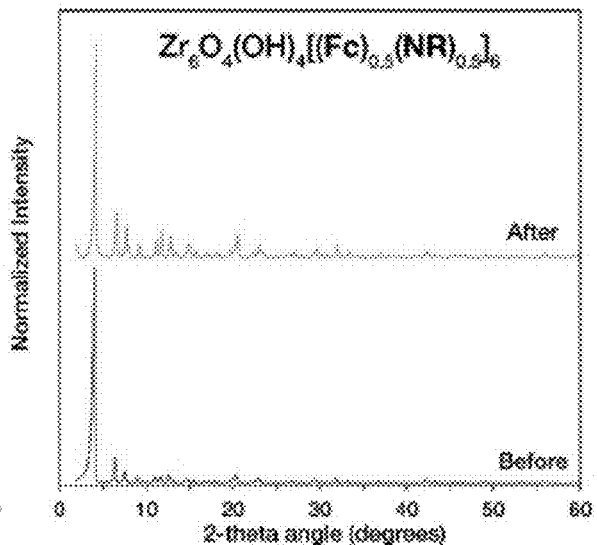
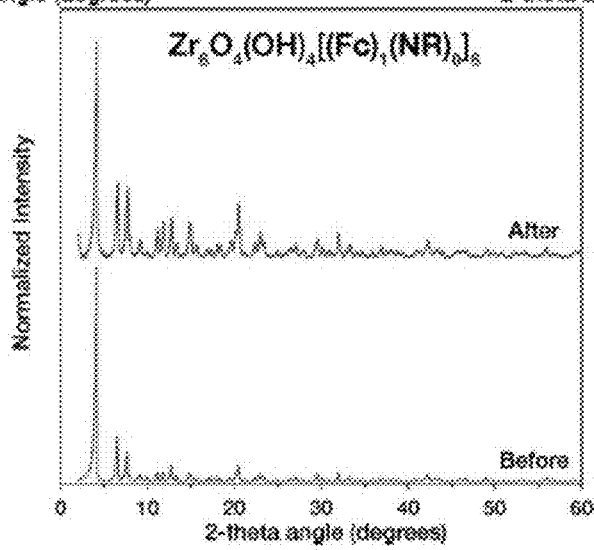
FIG. 24C

SOLID SOLUTION APPROACH FOR REDOX ACTIVE METAL ORGANIC FRAMEWORKS WITH TUNABLE REDOX CONDUCTIVITY

CROSS-REFERENCE TO RELATED APPLICATION

This application claims the benefit of U.S. Provisional Patent Application No. 62/913,470, filed Oct. 10, 2019, titled A SOLID SOLUTION APPROACH FOR REDOX ACTIVE METAL ORGANIC FRAMEWORKS WITH TUNABLE REDOX CONDUCTIVITY, which is incorporated by reference herein in its entirety.

BACKGROUND

There is a need for systematically tuning the conductivity of metal-organic frameworks (MOFs) to achieve desired combinations of porosity and electrochemical attributes. The discussion of shortcomings and needs existing in the field prior to the present invention is in no way an admission that such shortcomings and needs were recognized by those skilled in the art prior to the present disclosure.

BRIEF SUMMARY

Various embodiments relate to a method for producing a metal-organic framework (MOF) having a desired redox conductivity and comprising redox-active linkers, each having ω-alkyl-ferrocene groups, the method comprising: performing a de novo solvothermal synthesis of the MOF, using the redox-active linkers and redox-inactive linkers in a ratio sufficient to provide the MOF with the desired redox conductivity. The MOF so-produced may, according to various embodiments, display a maximum electron conductivity of about 122 mS cm$^{-1}$, and/or crystallographic and electrochemical stability upon a number of redox cycles greater than 1,000.

Various embodiments relate to a metal-organic framework (MOF) linker comprising an ω-alkyl-ferrocene group. For example, the metal-organic framework (MOF) linker according to various embodiments, may have a structure according to Formula I:

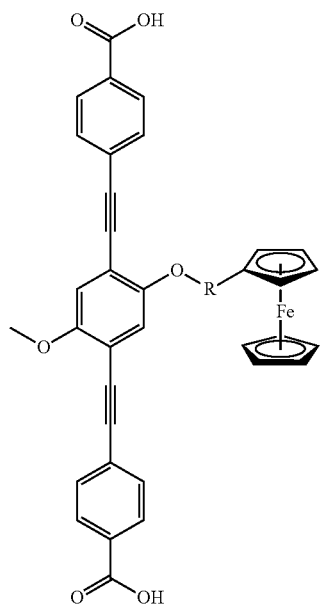

(I)

wherein R may be an alkyl of any suitable size and configuration, such as, for example, a $C_1$ to $C_{24}$ alkyl. The R group may be branched, cyclic, linear, or a combination thereof.

Various embodiments relate to a metal-organic framework (MOF), comprising a first plurality of redox-active linkers, each having an ω-alkyl-ferrocene group. The MOF according to various embodiments, may further comprise one or more redox-inactive linkers. For example, according to various embodiments, the MOF may comprise a repeating unit having a composition according to Formula II:

$$Zr_6O_4(OH)_4[Fc_xNR_{1-x}]_6 \qquad (II),$$

wherein Fc represents the plurality of redox-active linkers, wherein NR represents the one or more redox-inactive linkers, and wherein x is from 2 to 100. According to various embodiments, the MOF may displays a maximum electron conductivity of about 122 mS cm$^{-1}$, and/or crystallographic and electrochemical stability upon a number of redox cycles greater than 1,000.

Various embodiments relate to materials, apparatuses, and components that comprise the MOF according to various embodiments. For example, various embodiments relate to a thin-film comprising the MOF, a bulk powder comprising the MOF, or an electrode comprising the MOF.

These and other features, aspects, and advantages of various embodiments will become better understood with reference to the following description, figures, and claims.

BRIEF DESCRIPTION OF THE FIGURES

Many aspects of this disclosure can be better understood with reference to the following figures.

FIGS. 12A, 12B, 12C, 12D, 12E, 12F, 12G, 12H, 12I, 12J, 12K, and 12L are examples according to various embodiments illustrating anson plots for Fc MOFs for both charging (anodic) and discharging (cathodic) steps.

FIG. 19A is an example according to various embodiments illustrating 100% Fc nitrogen adsorption isotherm at 77 K.

FIG. 19B is an example according to various embodiments illustrating a Rouquerol plot of a 100% Fc sample.

FIG. 19C is an example according to various embodiments illustrating a BET plot of a 100% Fc sample.

FIG. 24A is an example according to various embodiments illustrating a PXRD of Fc MOFs having the formula $Zr_6O_4(OH)_4[(Fc)_0(NR)_1]_6$ before and after water adsorption isotherms.

FIG. 24B is an example according to various embodiments illustrating a PXRD of Fc MOFs having the formula $Zr_6O_4(OH)_4[(Fc)_{0.5}(NR)_{0.5}]_6$ before and after water adsorption isotherms.

FIG. 24C is an example according to various embodiments illustrating a PXRD of Fc MOFs having the formula $Zr_6O_4(OH)_4[(Fc)_1(NR)_0]_6$ before and after water adsorption isotherms.

Figure 1:
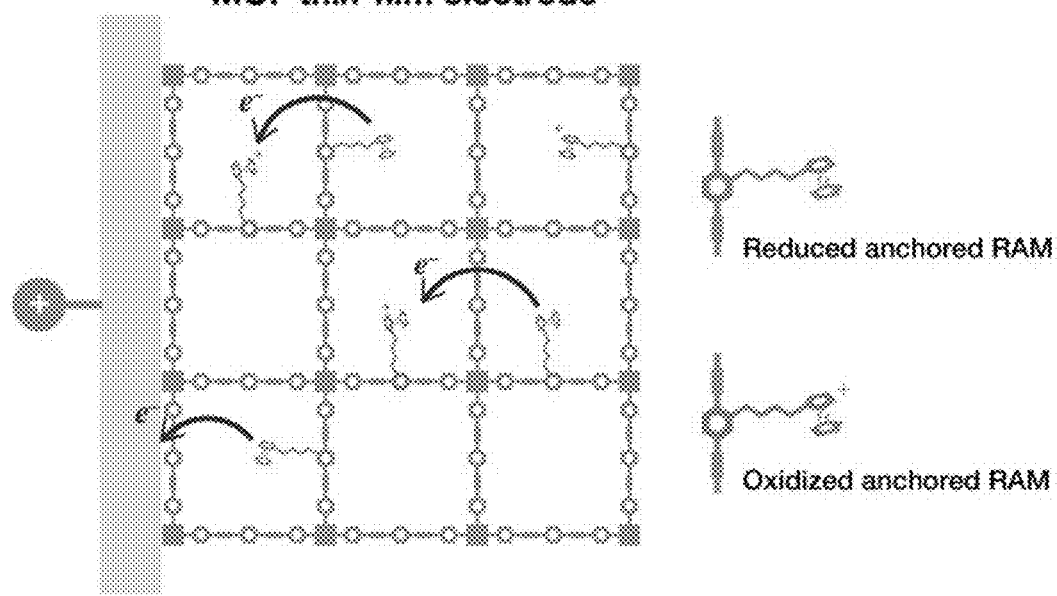
FIG. 1A is an example according to various embodiments, illustrating a schematic depiction of a MOF thin film electrode containing varied amounts of redox active links that enable fast re-dox conductivity via redox hopping.
FIG. 1B is an solution amounts of redox active links. example according to various embodiments, illustrating a synthesis of MOF thin film electrodes with a finely tuned substitutional solid.
Figure 1:
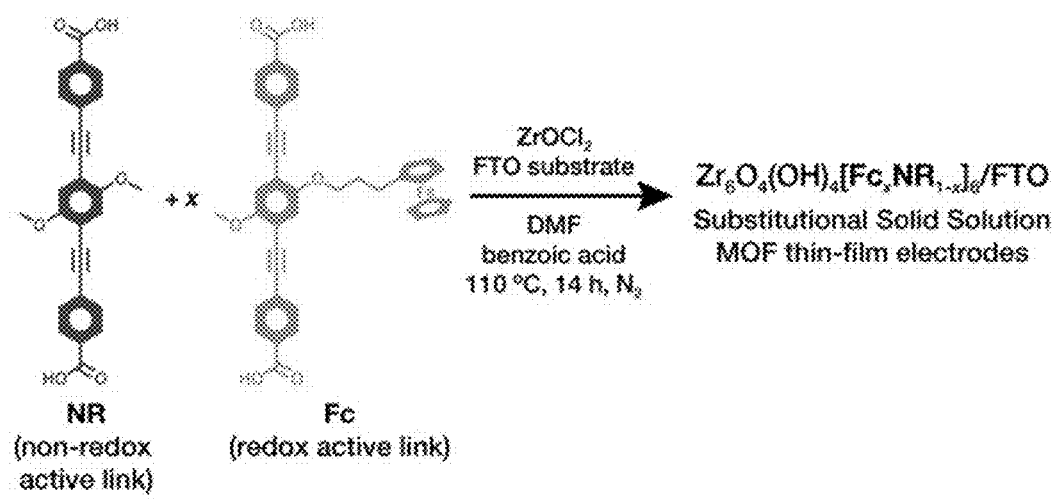

It should be understood that the various embodiments are not limited to the examples illustrated in the figures.

DETAILED DESCRIPTION

Introduction and Definitions

This disclosure is written to describe the invention to a person having ordinary skill in the art, who will understand that this disclosure is not limited to the specific examples or embodiments described. The examples and embodiments are single instances of the invention which will make a much larger scope apparent to the person having ordinary skill in the art. Unless defined otherwise, all technical and scientific terms used herein have the same meaning as commonly understood by the person having ordinary skill in the art. It is also to be understood that the terminology used herein is for the purpose of describing examples and embodiments only, and is not intended to be limiting, since the scope of the present disclosure will be limited only by the appended claims.

All the features disclosed in this specification (including any accompanying claims, abstract, and drawings) may be replaced by alternative features serving the same, equivalent, or similar purpose, unless expressly stated otherwise. Thus, unless expressly stated otherwise, each feature disclosed is one example only of a generic series of equivalent or similar features. The examples and embodiments described herein are for illustrative purposes only and that various modifications or changes in light thereof will be suggested to the person having ordinary skill in the art and are to be included within the spirit and purview of this application. Many variations and modifications may be made to the embodiments of the disclosure without departing substantially from the spirit and principles of the disclosure. All such modifications and variations are intended to be included herein within the scope of this disclosure. For example, unless otherwise indicated, the present disclosure is not limited to particular materials, reagents, reaction materials, manufacturing processes, or the like, as such can vary. It is also to be understood that the terminology used herein is for purposes of describing particular embodiments only and is not intended to be limiting. It is also possible in the present disclosure that steps can be executed in different sequence where this is logically possible.

All numeric values are herein assumed to be modified by the term "about," whether or not explicitly indicated. The term "about" generally refers to a range of numbers that one of skill in the art would consider equivalent to the recited value (for example, having the same function or result). In many instances, the term "about" may include numbers that are rounded to the nearest significant figure.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

As used herein, the term "standard temperature and pressure" generally refers to 25° C. and 1 atmosphere. Standard temperature and pressure may also be referred to as "ambient conditions." Unless indicated otherwise, parts are by weight, temperature is in ° C., and pressure is at or near atmospheric. The terms "elevated temperatures" or "high-temperatures" generally refer to temperatures of at least 100° C.

Unless otherwise specified, all percentages indicating the amount of a component in a composition represent a percent by weight of the component based on the total weight of the composition. The term "mol percent" or "mole percent" generally refers to the percentage that the moles of a particular component are of the total moles that are in a mixture. The sum of the mole fractions for each component in a solution is equal to 1.

Ferrocene is an organometallic compound with the formula $Fe(C_5H_5)_2$ and the structure:

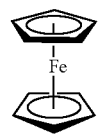

The molecule consists of two cyclopentadienyl rings bound on opposite sides of a central iron atom.

An alkyl substituent is an alkane missing one hydrogen. The term alkyl is intentionally unspecific to include many possible substitutions. An acyclic alkyl has the general formula of $C_nH_{2n+1}$. A is derived from a cycloalkane by removal of a hydrogen atom from a ring and has the general formula $C_nH_{2n-1}$. Typically an alkyl is a part of a larger molecule. In structural formula, the symbol R is used to designate a generic (unspecified) alkyl group. The smallest alkyl group is methyl, with the formula $CH_3$—.

Greek letters α, β, γ, and so on, may be used to designate successive positions along a hydrocarbon chain. The carbon directly attached to the principal function group is denoted as α, the second carbon is β, and so on down the chain. The omega (ω) position is sometimes used to designate the last position along the chain regardless of its length. Thus, for example, ω-bromohexanoic acid is 6-bromohexanoic acid. An "ω-alkyl-ferrocene" as used herein refers to a molecule of the following structure:

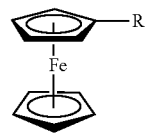

in which "R" represents an alkyl group. The alkyl group may be a linear, branched, or cyclic, and may have any number of carbon atoms. For example, the alkyl group may have 1, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more carbon atoms.

As used herein, "ω-alkyl-ferrocene group" refers to a moiety, which may be pendant to or part of a molecule, as illustrated by the following structure:

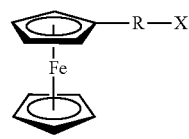

in which "R" represents an alkyl group. "X" represents any chemical structure to which the moiety may be covalently bonded. In other words, an "ω-alkyl-ferrocene group" refers to any "ω-alkyl-ferrocene" molecule that has been covalently bonded to another molecule via some part of its alkyl group. According to various embodiment described herein, the "X" structure may be a metal-organic framework (MOF).

As used herein, "metal-organic framework" or "MOF" refers to a class of compounds consisting of metal ions or clusters coordinated to organic ligands to form one-, two-, or three-dimensional structures. They are a subclass of coordination polymers, with the special feature that they are often porous. A metal-organic framework is a coordination network with organic ligands containing potential voids. A coordination network is a coordination compound extending, through repeating coordination entities, in one dimension, but with cross-links between two or more individual chains, loops, or spiro-links, or a coordination compound extending through repeating coordination entities in two or three dimensions; and finally a coordination polymer is a coordination compound with repeating coordination entities extending in one, two, or three dimensions. MOFs are composed of two major components: a metal ion or cluster of metal ions and an organic molecule called a "linker."

Various embodiments described herein relate to a "linker" for a metal-organic framework or a "MOF linker." More specifically, various embodiments relate to an MOF linker that comprises an ω-alkyl-ferrocene group. Other embodiments relate to MOFs prepared from or comprising the MOF linkers having ω-alkyl-ferrocene groups. Again, the MOF linkers are the organic portion of an MOF that also comprises at least one metal ion. Various embodiments relate to products, systems, or apparatuses that comprise the MOF, such as, for example, an electrode.

Reticular Chemistry is concerned with the linking of discrete molecular building units into crystalline porous extended structures through strong bonds. As used herein, a "reticular material" refers generally to a material produced via Reticular Chemistry, such as, for example a material comprising a metal-organic framework (MOF) and/or a covalent organic framework (COF).

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by prior disclosure. Further, the dates of publication provided could be different from the actual publication dates that may need to be independently confirmed.

General Discussion

Systematically tuning the conductivity of metal-organic frameworks (MOFs) is key to synergizing their attractive synthetic control and porosity with electrochemical attributes useful in energy and sensing technologies. A priori control of electron conductivity is possible by exploiting the solid-solution properties of MOFs together with electronic self-exchange enabled by redox pendants. Various embodiments described herein relate to a new strategy for preparing redox-active MOF thin film electrodes with finely tuned redox pendant content. Varying the ratios of alkyl-ferrocene containing redox-active and inactive links during MOF synthesis enabled the fabrication of electrodes with tunable redox conductivity. The prepared MOF electrodes, according to various embodiments, may display maximum electron conductivity of 122 mS cm$^{-1}$, and crystallographic and electrochemical stability upon thousands of redox cycles. Electroanalytical studies demonstrated that the conductivity follows solution-like, diffusion-controlled behavior with non-linear electron diffusion coefficients consistent with charge-hopping and percolation models with spatially fixed redox centers. Various embodiments provide new prospects in the design and synthesis of redox-active MOFs with targeted properties for the design of advanced electrochemical devices.

Understanding charge transport in reticular materials like metal-organic frameworks (MOFs) creates opportunities for advanced device design in photovoltaics, energy storage, electrocatalysts, and electrochemical sensors. Of the many strategies proposed to impose conductivity in MOFs, covalent incorporation of redox active mediators (RAMs) into otherwise dielectric MOFs offers the advantage of high modularity via synthesis, enabling systematic composition-property relationship studies. This strategy takes advantage of a diversity of available RAMs which display wide ranges of redox potentials and electron transfer kinetics. In this manner, charge transport in MOFs through the use of attached RAMs is attributed to electron "hopping" mediated by self-exchange reactions that result in diffusion of electrons within the MOF, creating an electric current. By incorporating RAMs with known fast self-exchange kinetics, it is possible to predesign MOFs that exhibit high redox-based conductivity. Several strategies have been explored to incorporate RAMs into MOFs, such as: non-covalent impregnation of guest RAMs in the pores, using RAMs in single-linker MOFs, and via post-synthetic covalent tethering of RAMs at the defect sites of the MOF. Various embodiments present a new strategy for tuning the redox conductivity of multivariate MOFs using the concept of substitutional solid solution (SSS) strategy, by incorporating varied amounts of links containing covalently bound RAMs that display fast electron exchange kinetics.

FIG. 1A is an example according to various embodiments, illustrating a schematic depiction of a MOF thin film electrode containing varied amounts of redox active links that enable fast redox conductivity via redox hopping. For this purpose, development of various embodiments involved anchoring ω-alkyl-ferrocene groups in the organic links of the zirconia based PEPEP-PIZOF-2 MOF, and preparing MOF SSS thin-film electrodes to observe how the electron hopping between alkyl-ferrocene changes with varied ferrocene content. This was achieved by simply varying the ratios of redox-active and inactive links such as Fc and NR (Fc=alkyl-ferrocene containing link and NR=non-redox active link, FIG. 1B), respectively, leading to observable changes in redox conductivity that resemble electrochemical behavior in solution. FIG. 1B is an example according to various embodiments, illustrating a synthesis of MOF thin film electrodes with finely tunes substitutional solid solution amounts of redox active links.

Cyclic voltammetry (CV) and potential-controlled chronocoulometry (CC) showed that the conductivity is diffusion controlled and is completely dependent on the Fc link content. Since the ferrocene RAMs are covalently attached to the MOF, their long-range mobility is restricted, thus the diffusion-controlled conductivity arises solely from electron exchange between ferrocene pendants. The prepared MOF thin-film electrodes display the expected spectroelectrochemical response from the ferricenium/ferrocene pair. Subjection of the MOF films to over 1,000 CV cycles in aqueous acidic electrolyte (0.1 M $H_2SO_4$) demonstrate their chemical and structural stability during the electrochemical experiment and observed clear retention of both their crystal structure and redox activity. Thus, the MOF-based SSS platform presented here offers controllable modulation of electron conductivity along with excellent stability, making it an ideal candidate for both fundamental charge transport studies and MOF-based devices.

Thin films of MOFs with formula $Zr_6O_4(OH)_4[Fc_xNR_{1-x}]_6$ containing varied SSS x input amounts of redox active and inactive linkers were grown onto fluorine-doped tin oxide (FTO) substrates via solvothermal synthesis in N,N-dimethylformamide (DMF) with $ZrOCl_2$ and benzoic acid for 14 h at 110° C. (FIG. 1B). Treating the clean FTO substrates by immersing them in a Fc solution for 24 h before solvothermal growth ensured the formation of films with complete coverage and thicknesses between 5-7 µm, as determined by optical profilometry. Scanning electron microscopy coupled with electron dispersive X-ray spectroscopy (SEM/EDXS) analysis of the films showed homogeneous distribution of octahedrally shaped crystallites with homogeneously dispersed Fe throughout the film. The Zr/Fe ratio measured from EDXS displayed a near 1:1 input/output incorporation of Fc links in the matrix.

Figure 2A:
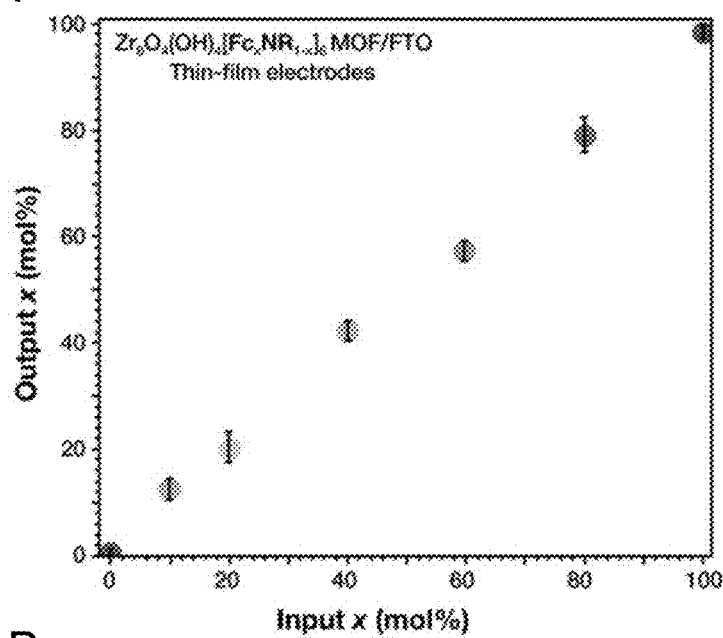
FIG. 2A is an example according to various embodiments illustrating a plot of the SSS input-output mol % ratio of the Fc link incorporated in the thin film MOFs as determined by EDXS evidencing 1:1 input-outpou incorporation.
Figure 2B:
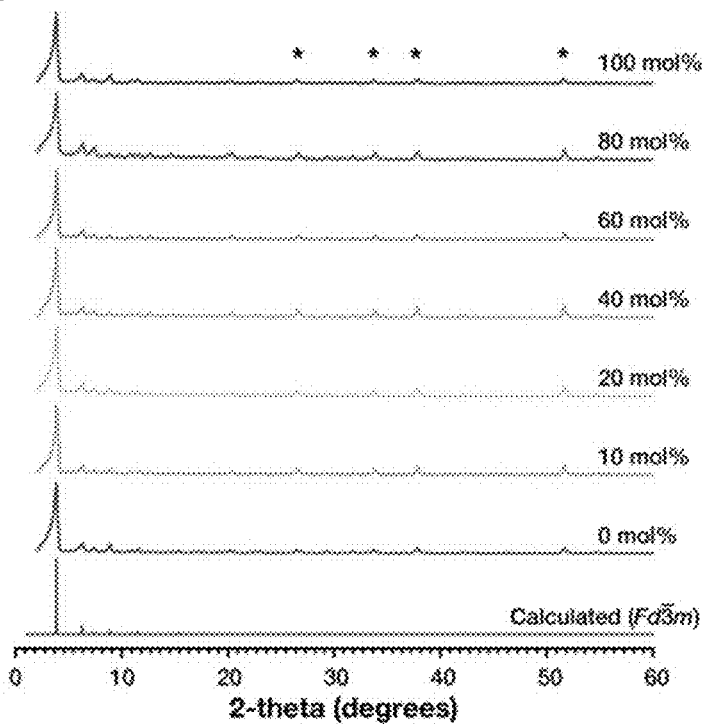
FIG. 2B is an example according to various embodiments illustrating GIXD of MOF thin films grown on FTO substrates, in which stars denote peaks corresponding to FTO.

FIG. 2A is an example according to various embodiments, illustrating a plot of the SSS input-output mol % ratio of the Fc link incorporated in the thin film MOFs as determined by EDXS evidencing 1:1 input-output incorporation. FIG. 2B is an example according to various embodiments, illustrating GIXD of MOF thin films grown on FTO substrates, in which stars denote peaks corresponding to FTO. Powder X-ray diffraction in grazing incidence mode (GIXD, FIG. 2b) showed that the films are highly crystalline and isotropic and exhibit sharp diffraction lines that were assigned to the MOF and FTO. High intensity peaks at low angle (4.08° 2-theta, CuKa) confirmed the formation of the Fd-3m cubic phase of PIZOF-2 matrix throughout the series. The thin-film growing media also produced bulk powders that, after base digestion and $^1H$ NMR spectroscopy analysis, exhibited same linker incorporation ratio as in the thin films. The bulk powders exhibit high porosity, with $N_2$ adsorption uptakes and Brunauer-Emmett-Teller (BET) surface areas consistent with increased alkyl-ferrocene loading between 1860-1048 $m^2 g^{-1}$. Interestingly, increasing Fc content also results in change in isotherm type from mesoporous in x=0 mol %, to microporous in x=100 mol % as result of pore filling by the alkyl-ferrocene pendants. The MOF powders are also stable to humidity, retaining their crystallinity and BET surface area even after $H_2O$ vapor adsorption cycles at 300 K.

Figure 3A:
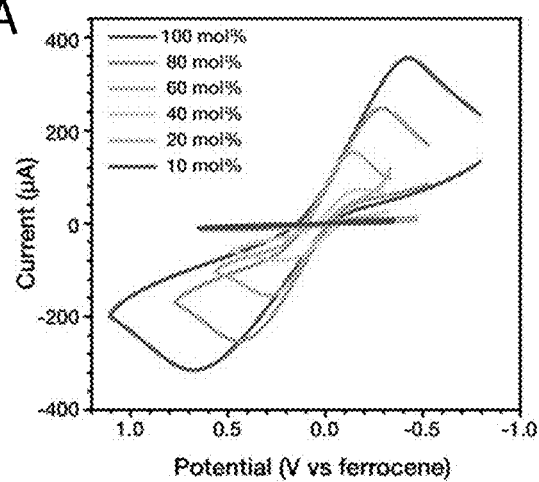
FIG. 3A is an example according to various embodiments illustrating cyclic voltammetry data of Fc containing MOF electrodes, specifically, cyclic voltammograms at various Fc link content (scan rate of 20 mV s−1, in 0.1 M LiBF4 in MeCN and Pt counter electrode).
Figure 3B:
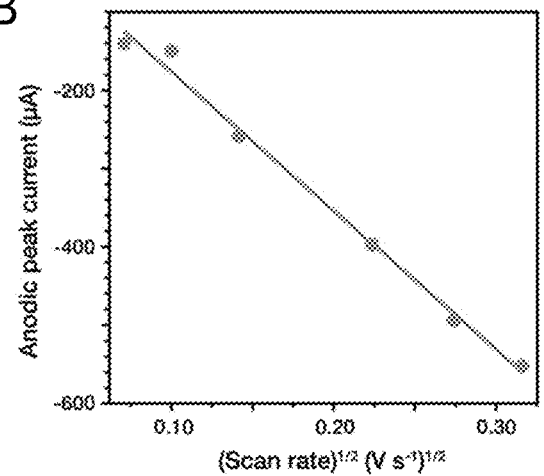
FIG. 3B is an example according to various embodiments illustrating cyclic voltammetry data of Fc containing MOF electrodes, specifically, peak current of the 100% Fc MOF electrode as a func-tion of the square root of scan rate.
Figure 3C:
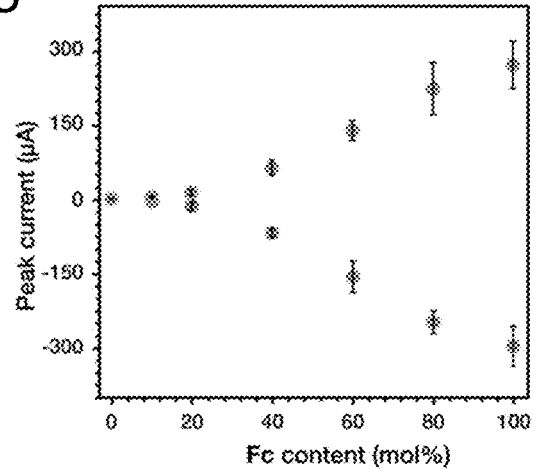
FIG. 3C is an example according to various embodiments illustrating cyclic voltammetry data of Fc containing MOF electrodes, specifically, peak currents of the MOF electrodes as a function of their ferrocene content (scan rate of 20 mV s−1).

Cyclic voltammetry of the prepared MOF thin-film electrodes is reminiscent of a redox system undergoing linear diffusion. FIG. 3A is an example according to various embodiments, illustrating cyclic voltammetry data of Fc containing MOF electrodes, specifically, cyclic voltammograms at various Fc link content (scan rate of 20 mV s−1, in 0.1 M LiBF4 in MeCN and Pt counter electrode). In contrast to a surface-confined redox species with instantaneously accessible RAMs, which displays symmetrical Gaussian-shaped peaks and a linear dependence of peak current with scan rate, the MOFs according to various embodiments display peak splitting and a square dependence on scan rate, characteristic of diffusive systems. FIG. 3B is an example according to various embodiments, illustrating cyclic voltammetry data of Fc containing MOF electrodes, specifically, peak current of the 100% Fc MOF electrode as a function of the square root of scan rate. The larger peak splitting observed in these CVs compared to an ideal diffusive system, i.e., 57 mV for a one-electron exchange, is ascribed to be the sum of resistances derived from the non-metallic character of the film. A fundamental difference between the behaviors of ferrocene dissolved in $Zr_6O_4(OH)_4[Fc_xNR_{1-x}]_6$ MOFs and a freely diffusing redox species in liquid solution is that the redox centers in the former are spatially fixed, restricting the charge diffusion mechanism to electron hopping between neighboring RAM sites. This condition allows for strong modulation of electron transport properties by means of redox center loading, which in this case is controlled a priori by the input ratios of Fc/NR linkers. FIG. 3C is an example according to various embodiments, illustrating cyclic voltammetry data of Fc containing MOF electrodes, specifically, peak currents of the MOF electrodes as a function of their ferrocene content (scan rate of 20 mV s−1). FIG. 3c shows the effects of Fc loading in the $Zr_6O_4(OH)_4[Fc_xNR_{1-x}]_6$ films on voltammetric peak currents displaying non-linear trends, in strong contrast to the linear dependence of peak current versus concentration in freely diffusive redox systems. This trend of reduced electroactivity for dilute ferrocene MOFs also manifested in their UV-visible absorption spectra. After 15 min of oxidative charging, films with high Fc content display a clear absorbance peak near 630 nm (FIG. 3a inset), indicating a change from ferrocene to ferricenium ion. This absorbance peak coincides with a visible color change in the more concentrated films from orange-yellow (ferrocene) to bluish-green (ferricenium, FIG. S3). FIG. 3a displays a plot of absorbance versus x (mol % Fc content) that matches the voltammetric peak trend, where more dilute samples displayed a lower electrochemical accessibility in the 15 min timeframe.

Changes in redox hopping dynamics resulting from redox center dilution were probed by evaluating the diffusion coefficient of charge transfer ($D_e$). In this system, the tunneling distance for electron hopping between sites was expected to be higher for more dilute samples, causing $D_e$ values to lower with decreasing Fc loading. To test this hypothesis, diffusion coefficients of oxidative and reductive charging in the film were measured through chronocoulometry by subsequent oxidizing and reducing potential steps. Anson plots, which graph charge collected versus square root of time, were used to extract diffusion coefficients that have concentration dependence similar to the voltammetric peak currents. Various embodiments may use a model developed for redox-active polymeric films to predict theoretical diffusion coefficients of charge transfer as a function of concentration (FIG. 3b). This model derives diffusion coefficients in redox pendant networks from charge transfer dynamics via the Dahms-Ruff expression with restricted physical diffusion of redox species (Eq. 1), and the exchange kinetics expression (Eq. 2):

$$D_e = \tfrac{1}{6} k_{et} r_{NN}^2 \quad (1)$$

$$k_{et} = k'e^{-(r_{NN}-r_o)/\delta} \quad (2)$$

where $k_{et}$ is the electron self-exchange rate constant, and $r_{NN}$ is the average distance between nearest neighboring pendants, k' is the intrinsic facility of charge transfer between pendants, δ is a characteristic length representing electronic coupling strength in the medium, and $r_0$ is the contact radius of the pendant. The model predicts that $D_e$ increases exponentially at low concentrations, eventually becoming roughly linear. Values for k' and δ were found by fitting the theoretical curve to the experimental data points. The k' value obtained, $1.2 \times 10^7$ s$^{-1}$, is one order of magnitude larger than the rate observed on ferrocene anchored to a metal electrode (k'=$1.6 \times 10^6$ s$^{-1}$). The δ value, 1.1 Å, is similar to the analogous distance dependence constant for electron transfer through saturated alkane chains.

The prediction that high pendant-pendant distance at low concentrations causes sluggish charge diffusion aligns with percolation theory, which applies to the conductivity of networks in which the nodes are a random distribution of conductors (pendants) and insulators (unmodified linkers). Percolation theory predicts that there is some critical ratio of conductors in a given network below which the network ceases to effectively conduct. Indeed, the critical ratios for 3D networks related to the MOF (isotropic cubic lattice with 6-12 nearest neighbors) are in the range of 20-30%, similar to the Fc content percentages in MOFs above which large increases in peak currents and UV-visible absorption are observed. The redox conductivity of the MOFs was obtained from the Einstein-Stokes equation for charged diffusive systems resulting in composition-dependent redox conductivity with a maximum conductivity of $\sigma_e$=122 mS cm$^{-1}$ in the 100% Fc MOF (FIG. 4d), comparable to the intrinsic electron conductivity of undoped germanium.

Figure 4A:
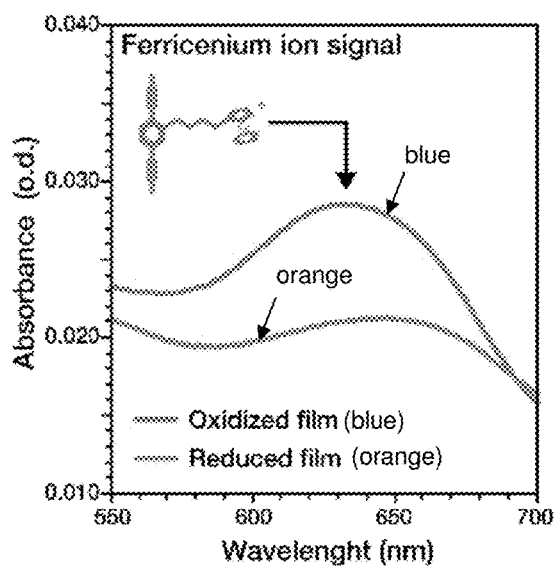
FIG. 4A is an example according to various embodiments illustrating UV-visible absorption spectra of 100 mol % Fc MOF thin film before (orange trace) and after oxidation (blue trace), evidencing the formation of ferricenium ion.
Figure 4B:
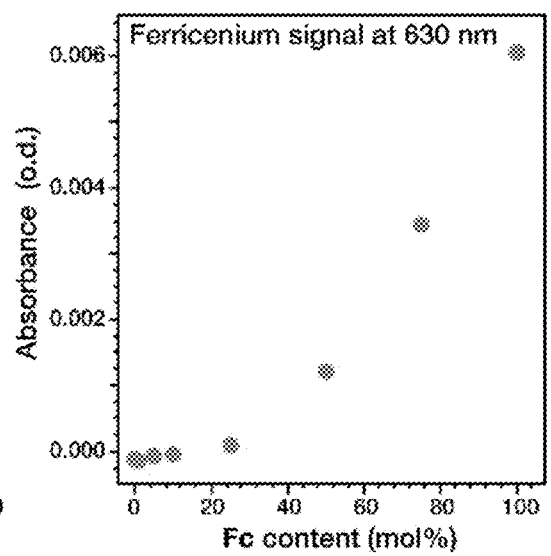
FIG. 4B is an example according to various embodiments illustrating Ab-sorbance of ferricenium as a function of Fc content in the MOF thin films.
Figure 4C:
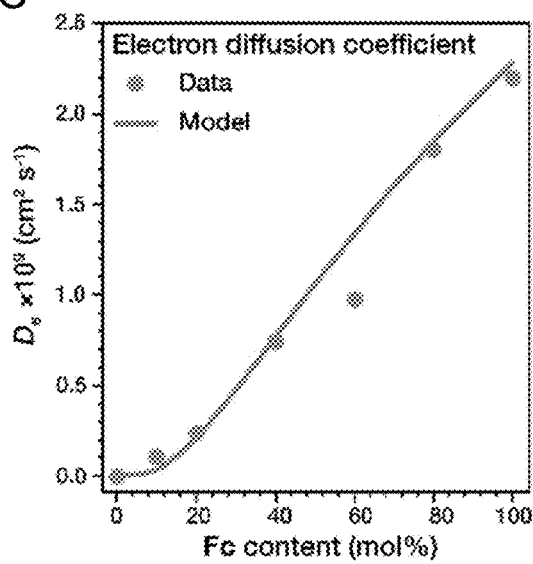
FIG. 4C is an example according to various embodiments illustrating diffusion coefficient of electron transfer derived from Anson plots as function of Fc content (orange symbols), compared to modeled De from Eqs. (1) and (2) (blue line).
Figure 4D:
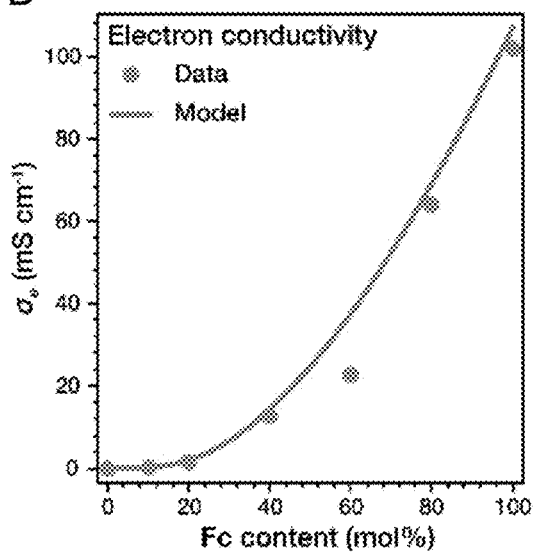
FIG. 4D is an example according to various embodiments illustrating tunable electron conductivity of the MOF electrodes at varied Fc content (orange symbols) derived from Einstein-Stokes equation compared to model (blue line).

FIG. 4A is an example according to various embodiments, illustrating UV-visible absorption spectra of 100 mol % Fc MOF thin film before (orange trace) and after oxidation (blue trace), evidencing the formation of ferricenium ion. FIG. 4B is an example according to various embodiments, illustrating Ab-sorbance of ferricenium as a function of Fc content in the MOF thin films. FIG. 4C is an example according to various embodiments, illustrating diffusion coefficient of electron transfer derived from Anson plots as function of Fc content (orange symbols), compared to modeled De from Eqs. (1) and (2) (blue line). FIG. 4D is an example according to various embodiments, illustrating tunable electron conductivity of the MOF electrodes at varied Fc content (orange symbols) derived from Einstein-Stokes equation compared to model (blue line).

The structural and electrochemical stability of the prepared films was probed by exposing the 100 mol % Fc MOF electrode to multiple CV charge-discharge cycles in 0.1 M $H_2SO_4$(aq). After 1400 cycles, the only observable change in the voltammogram is a slight shift in peak current over time, related to improved wetting of the electrolyte over time. GIDX of the cycled film showed very little changes in diffraction pattern, evidencing retention of the MOF architecture. Various embodiments provide a new metal-organic framework design with capabilities for fine-tuning of redox pendant concentration. This tunability was exploited to study the effect of redox pendant concentration on electroactivity. Results imply there is a set of parameters that determine electrochemical accessibility in redox-modified MOG films: pendant RAM concentration and self-exchange kinetics.

EXAMPLES

Introduction

The following examples are put forth to provide those of ordinary skill in the art with a complete disclosure and description of how to perform the methods, how to make, and how to use the compositions and compounds disclosed and claimed herein. Efforts have been made to ensure accuracy with respect to numbers (e.g., amounts, temperature, etc.), but some errors and deviations should be accounted for. The purpose of the following examples is not to limit the scope of the various embodiments, but merely to provide examples illustrating specific embodiments.

Materials and Methods

All starting materials and solvents, unless otherwise specified, were obtained from commercial sources (Aldrich, Fisher, VWR) and used without further purification. Anhydrous tetrahydrofuran (THF), N,N-dimethylformamide (DMF), and $CH_2Cl_2$ were purified using a custombuilt alumina column based solvent purification system (Innovative Technology). Deuterated solvents CDCl$_3$ and DMSO-d$_6$ were obtained from Cambridge Isotope Labs.

High-resolution $_1$H, and $_{13}$C, nuclear magnetic resonance (NMR) spectra were collected using a Bruker AVANCE-III 400 MHz spectrometer. $_1$H and $_{13}$C chemical shifts are referenced to TMS as 0 ppm and assigned using the residual solvent signal. NMR data processing was performed using MestReNova version 10.0.2-15465. High resolution mass spectra (HRMS) were recorded using an Agilent 6230 TOF coupled with an Agilent Zorbax SB-C18 analytical column. Column chromatography was performed using a Teledyne Isco Combiflash Rf$_+$. Infrared spectroscopy was performed with a Jasco FT/IR-6600. Thermogravimetric analysis was performed with a Shimadzu TGA-50H from 25° C. to 800° C. with a ramp speed of 5° C. min$_{-1}$.

Powder X-ray diffraction (PXRD) measurements were performed using a Rigaku Miniflex 600 diffractometer, with θ–2θ Bragg-Brentano geometry, and a 600 W (40 kV, 15 mA) Cu X-ray tube source using Kα (λ=1.5418 Å) radiation, samples were measures from 4 to 60 2θ-degrees with a step size of 0.02° and a scan rate of 1.5 s per step. Samples were prepared by dropping the powder sample in a silicon zero background sample holder and pressing the powder gently with a clean glass slide. Thin-film grazing incidence X-ray diffraction (GIXD) were performed using a PANanalytical Empyrean diffractometer in grazing incidence mode with θ–2θ Bragg-Brentano geometry, and a 1.8 kW (40 kV, 45 mA) Cu X-ray tube source using Kα radiation (λ=1.5418 Å), samples were measured from 2 to 60 2θ-degrees with a step size of 0.01671° with a motorized stage with Z and tilt adjustment utilizing X'Celerator multi-element detector. Film thickness measurements and optical images were acquired using a Keyence VK-X1000 3D Laser Scanning Confocal Microscope. Film and powder composition analysis was performed using a Zeiss ULTRA-55 SEM equipped with a Noran System 7 EDXS system with a Silicon Drift Detector xray detector. UV-vis spectroscopy was performed with an Agilent Cary 5000 spectrometer using diffuse transmittance mode. Voltammetric and chronoamperometric measurements were made with either a CH Instruments 760 or 601 potentiostat. $N_2$ gas adsorption isotherm analysis was performed using a Micromeritics ASAP 2020 porosimetry analyzer at 77 K.

NR link was prepared according to published procedures.

Synthetic Procedures

Scheme S1 shows a synthesis according to various embodiments of an MOF linker (Fc).

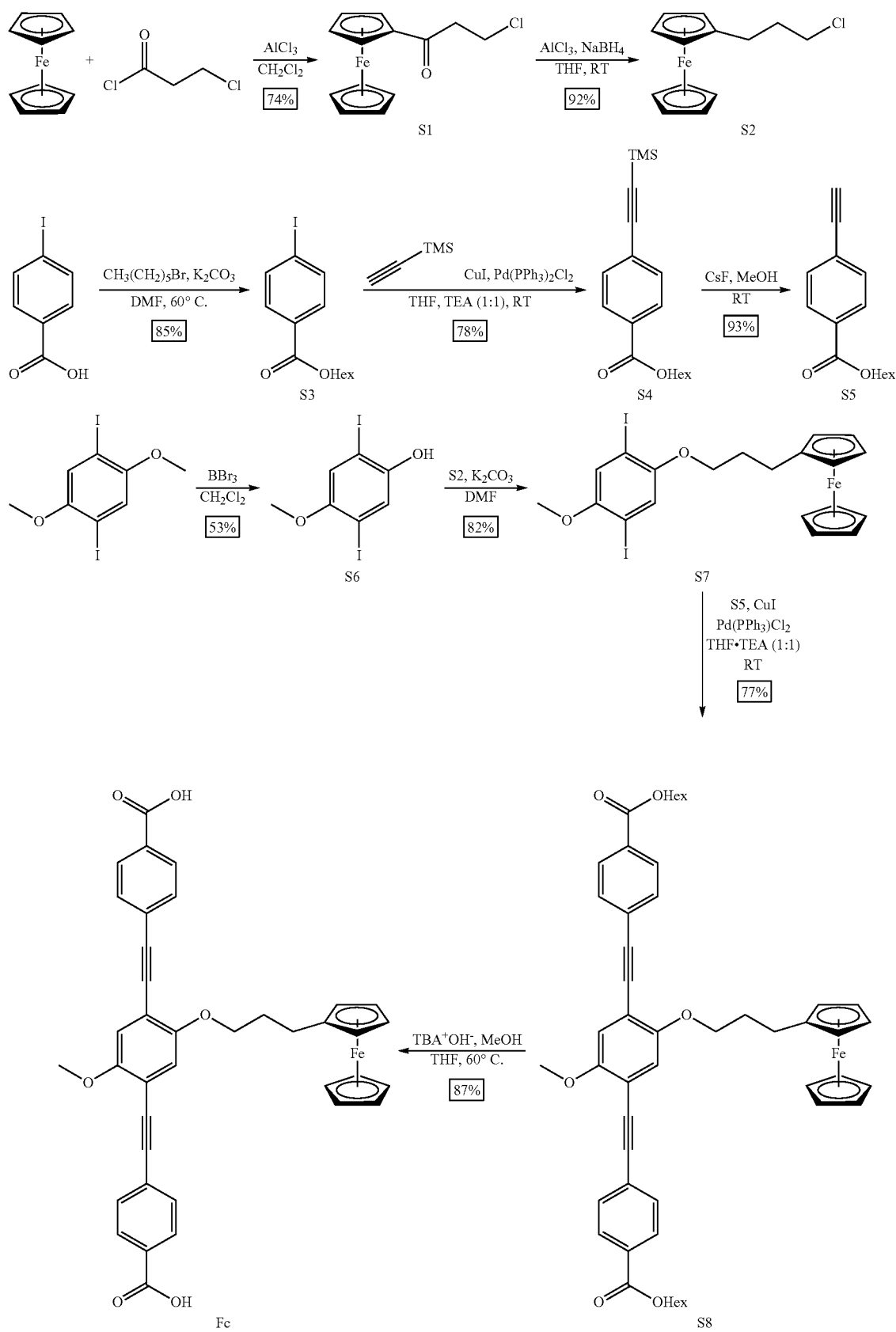

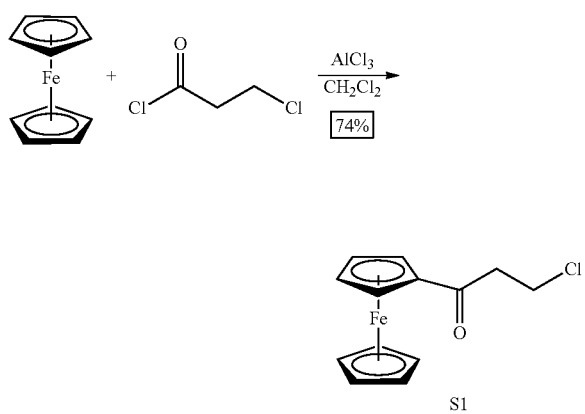

3-chloro-1-oxopropyl ferrocene (compound S1): Compound S1 synthesis was adapted from literature procedures$_{s1}$ from ferrocene. Ferrocene (3.0 g, 16.1 mmol, 1 eq) and anhydrous AlCl$_3$ (2.6 g, 19.4 mmol, 1.2 eq) were loaded into an oven-dried 100 mL Schlenk flask equipped with a magnetic stirbar. The flask was evacuated to an internal pressure of 100 mTorr and backfilled with N$_2$ three times. Anhydrous CH$_2$Cl$_2$ (20 mL) was added via syringe under N$_2$ and stirred at room temperature. 3-Chloropropionyl chloride (2.0 g, 16.1 mmol, 1 eq) was added via syringe under N$_2$ at 0° C. and the reaction was stirred for 5 hours monitored by TLC until the starting material was no longer observed. The mixture was then poured into 1 M HCl (20 mL) below 5° C. and extracted with CH$_2$Cl$_2$ (3×20 mL). The combined organic extracts were washed with brine (20 mL) and dried over Na$_2$SO$_4$ (anhydrous). The solvent was removed under reduced pressure at 50° C. in a rotary evaporator and the residue was purified via column chromatography (SiO$_2$, 1% v/v MeOH/CH$_2$Cl$_2$) affording compound S1 as a brown solid. Yield: 74%, 3.3 g. $_1$H NMR (400 MHz, CDCl$_3$, 25° C.) δ (ppm) 4.79 (t, J=2.0 Hz, 2H), 4.53 (t, J=2.0 Hz, 2H), 4.24 (s, 5H), 3.91 (t, J=6.5 Hz, 2H), 3.17 (t, J=6.5 Hz, 2H). $_{13}$C NMR (100 MHz, CDCl$_3$, 25° C.) δ (ppm) 200.47, 78.53, 72.69 (2C), 70.05 (5C), 69.36 (2C), 42.23, 38.93. HRMS (ESI-TOF) m/z: [M]$_+$ Calculated for C$_{13}$H$_{13}$ClFeO 276.0004; Found 276.0018.

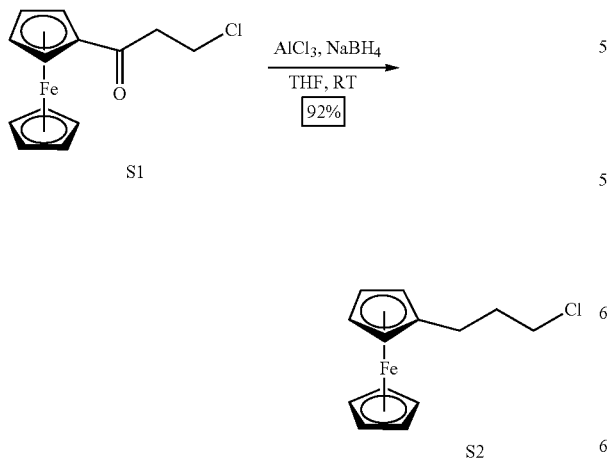

3-chloro-1-propyl ferrocene (compound S2): Compound S2 synthesis was adapted from literature procedures$_{s1}$ from S1. Compound S2 (3.0 g, 10.8 mmol, 1 eq) was loaded into an ovendried 100 mL Schlenk flask equipped with a magnetic stirbar. The flask was evacuated to an internal pressure of 100 mTorr and backfilled with N$_2$ three times. Anhydrous THF (20 mL) was added via syringe under N$_2$ and stirred at room temperature. Anhydrous AlCl$_3$ (1.7 g, 13.0 mmol, 1.2 eq) and NaBH$_4$ (1.2 g, 32.5 mmol, 3 eq) were added portion-wise under N$_2$ at 0° C. The mixture was stirred overnight at room temperature, then poured into 1 M HCl (20 mL) and extracted with CH$_2$Cl$_2$ (3×20 mL). The combined organic extracts were washed with brine (20 mL) and dried over Na$_2$SO$_4$ (anhydrous). The solvent was removed under reduced pressure at 50° C. in a rotary evaporator and the residue was purified via column chromatography (SiO$_2$, 1% v/v EtOAc/hexanes) affording compound S2 as a yellow oil. Yield: 92%, 2.6 g. $_1$H NMR (400 MHz, CDCl$_3$, 25° C.) δ (ppm) 4.14 (s, 5H), 4.11-4.08 (m, 4H), 3.55 (t, J=6.4 Hz, 2H), 2.49 (t, J=7.5 Hz, 2H), 2.01-1.90 (m, 2H). $_{13}$C NMR (100 MHz, CDCl$_3$, 25° C.) δ (ppm) 87.79, 78.92 (5C), 68.47 (2C), 67.67 (2C), 44.84, 33.95, 26.86. HRMS (ESI-TOF) m/z: [M]$_+$ Calculated for C$_{13}$H$_{15}$ClFe 262.0212; Found 262.0214.

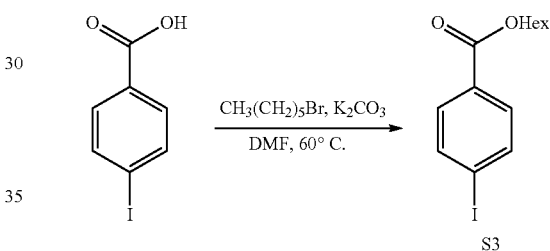

4-iodo hexyl benzoate (compound S3): 4-iodo benzoic acid (10 g, 40.3 mmol, 1 eq) and K$_2$CO$_3$ (16.7 g, 120 mmol, 3 eq) were loaded into an oven-dried 250 mL Schlenk flask equipped with a magnetic stirbar. The flask was evacuated to an internal pressure of 100 mTorr and backfilled with N$_2$ three times. Anhydrous DMF (80 mL) was added via syringe under N$_2$ and stirred for 20 min at room temperature. 1-bromohexane (18.2 mL, 120 mmol, 3 eq) was added via syringe under N$_2$ and the reaction was heated to 60° C. for 1 h, monitored by TLC until the starting material was no longer observed. The reaction was cooled to room temperature, water (50 mL) was added and the crude mixture was extracted using CH$_2$Cl$_2$ (3×50 mL). The combined organic extracts were then rinsed with water (2×50 mL), brine (50 mL), dried over Na$_2$SO$_4$(anhydrous) and filtered. The solvent was removed under reduced pressure at 50° C. in a rotary evaporator and the residue was purified via column chromatography (SiO$_2$, 10% v/v EtOAc/hexanes) affording compound S3 as a colorless oil. Yield: 11.9 g, 89%. $_1$H NMR (400 MHz, CDCl$_3$, 25° C.) δ (ppm) 7.83-7.78 (d, 2H), 7.78-7.73 (d, 2H), 4.31 (t, J=6.7 Hz, 2H), 1.76 (dq, J=8.0, 6.7 Hz, 2H), 1.47-1.31 (m, 6H), 0.91 (td, J=5.8, 4.6, 2.8 Hz, 3H). $_{13}$C NMR (100 MHz, CDCl$_3$, 25° C.) δ (ppm) 166.49, 138.02 (2C), 131.34 (2C), 130.39, 100.81, 65.74, 31.78, 28.98, 26.01, 22.87, 14.31. HRMS (ESI-TOF) m/z: [M]$_+$ Calculated for C$_{13}$H$_{17}$IO$_2$ 332.0273; Found 332.0284.

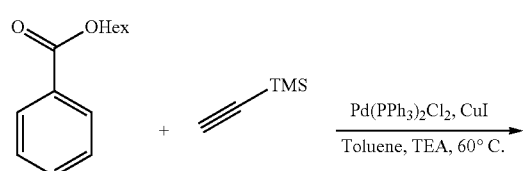

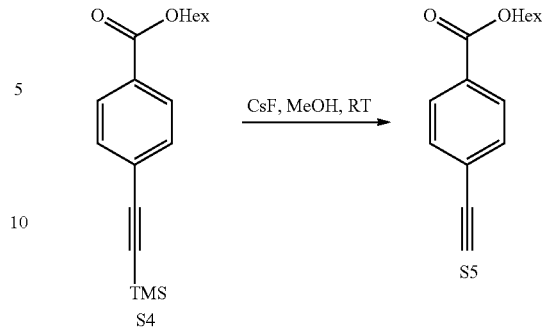

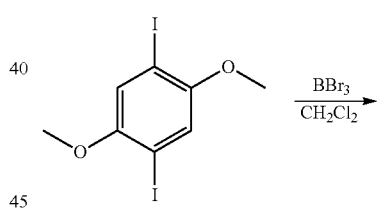

4-(2-trimethylsilyl)-ethynyl hexyl benzoate (compound S4): Compound S3 (4.0 g, 12.0 mmol, 1 eq), copper(I) iodide (0.14 g, 0.72 mmol), and Pd(PPh₃)₂Cl₂ (0.25 g, 0.36 mmol) were added to a 250 mL Schlenk flask equipped with a magnetic stirbar and a reflux condenser. The flask was evacuated to an internal pressure of 100 mTorr and backfilled with $N_2$ three times. THF (40 mL) and triethylamine (40 mL) were bubbled for ca. 30 min before being added via syringe, followed by trimethylsilyl acetylene (2.6 mL, 18.1 mmol). The reaction mixture was then heated to 70° C. for 8 h, monitored by TLC until the starting material was no longer observed. The reaction vessel was cooled to room temperature, water (100 mL) was added, and the resulting solution was extracted with $CH_2Cl_2$ (3×50 mL). The combined organic phase was washed with 0.5 M HCl (2×50 mL), water (50 mL), brine (50 mL), dried over $Na_2SO_4$ (anhydrous), and filtered. The solvent was removed under reduced pressure in a rotary evaporator at 45° C. and the resulting crude was purified via column chromatography (SiO₂, 5% v/v EtOAc:hexanes) affording compound S4 as a brown oil. Yield: 3.35 g, 92%. ₁H NMR (400 MHz, CDCl₃, 25° C.) δ (ppm) 8.04-7.92 (dd, J=8.3, 2.0 Hz, 2H), 7.58-7.48 (dd, J=8.2, 2.1 Hz, 2H), 4.31 (t, J=6.7 Hz, 2H), 1.77 (dt, J=14.4, 6.8 Hz, 2H), 1.48-1.27 (m, 6H), 0.97-0.84 (m, 3H), 0.27 (s, 9H). ₁₃C NMR (100 MHz, CDCl₃, 25° C.) δ (ppm) 166.44, 132.18 (2C), 130.43, 129.66 (2C), 127.97, 104.47, 97.91, 65.70, 31.8'1, 29.00, 26.04, 22.89, 14.36, 0.20 (3C). HRMS (ESI-TOF) m/z: [M]₊ Calculated for $C_{18}H_{26}O_2Si$ 302.1702; Found 302.1717.

4-ethynyl hexyl benzoate (compound S5): Compound S4 (1.8 g, 6.0 mmol, 1 eq) was added to a 150 mL round-bottom flask equipped with a magnetic stirbar. Methanol (30 mL) was added and the solution was stirred at room temperature for 20 min. Cesium fluoride (2.3 g, 1.2 mmol) was added at room temperature and the flask was stirred for an additional 2 h, monitored by TLC until the starting material was no longer observed. The reaction mixture was then poured over 50 mL of ice-water causing the precipitation of a brown solid. The solid was isolated via filtration and dried under reduced pressure affording S5 as a brown solid. Yield: 1.15 g, 83%. ₁H NMR (400 MHz, CDCl₃, 25° C.) δ (ppm) 8.00 (d, J=8.0 Hz, 1H), 7.55 (d, J=8.0 Hz, 1H), 4.32 (td, J=6.7, 0.7 Hz, 1H), 1.85-1.68 (m, 1H), 1.52-1.22 (m, 3H), 0.97-0.84 (m, 2H). 13C NMR (100 MHz, CDCl₃, 25° C.) δ (ppm) 166.13, 132.18 (2C), 130.69, 129.55 (2C), 126.75, 83.00, 80.07, 65.54, 31.60, 28.80, 25.84, 22.69, 14.15. HRMS (ESI-TOF) m/z: [M+H]₊ Calculated for $C_{15}H_{17}O_2$ 231.1379; Found 231.1380.

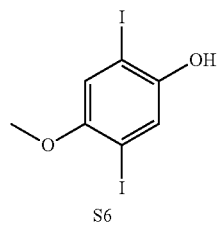

2,5-diiodo-4-methoxy phenol (compound S6): Compound S6 was synthesized according to literature procedures₂₉ from 1,4-diiodo-2,5-dimethoxy benzene. Yield 1.5 g, 53%. ₁H NMR (400 MHz, CDCl₃, 25° C.) δ (ppm) 7.42 (s, 1H), 7.03 (s, 1H), 4.88 (s, 1H), 3.82 (s, 3H). ₁₃C NMR (101 MHz, CDCl₃) δ 153.46, 150.33, 125.37, 120.06, 87.11, 84.71, 57.55. HRMS (ESI-TOF) m/z: [M]₊ Calculated for $C_7H_6I_2O_2$ 375.8452; Found 375.8451.

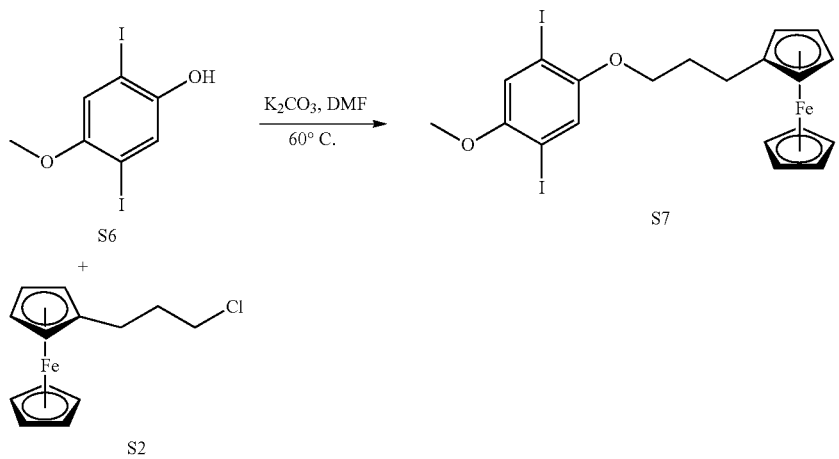

1,4-diiodo-5-methoxy-2-(3-propoxyferrocenyl)-benzene (compound S7): Compound S6 (1.12 g, 3.0 mmol, 1 eq), compound S2 (1.0 g, 3.3 mmol, 1.1 eq), and $K_2CO_3$ (1.3 g, 9.0 mmol, 3 eq) were loaded into a 50 mL Schlenk flask equipped with a magnetic stirbar and reflux condenser. The flask was evacuated to an internal pressure of 100 mTorr and backfilled with $N_2$ gas three times. DMF (6 mL) was added via syringe and the flask was heated to 60° C. for 8 h, monitored by TLC until the starting material was no longer observed. The reaction vessel was cooled to room temperature and subsequently quenched with water (20 mL) causing the product to crash out of solution. The mixture was cooled in an ice-water bath for 20 min before being filtered. The solid was filtered and air-dried yielding compound S7 as a yellow solid. Yield: 1.5 g, 82%. $_1$H NMR (400 MHz, $CDCl_3$, 25° C.) δ (ppm) 7.22 (s, 1H), 7.18 (s, 1H), 4.14 (s, 5H), 4.11 (t, J=1.8 Hz, 2H), 4.07 (t, J=1.8 Hz, 2H), 3.96 (t, J=6.1 Hz, 2H), 3.84 (s, 3H), 2.61 (t, J=8.5 Hz, 2H), 2.06-1.99 (m, 2H). $_{13}$C NMR (100 MHz, $CDCl_3$, 25° C.) δ (ppm) 153.65, 153.12, 123.21, 121.84, 88.37, 86.65, 85.83, 69.77, 68.94 (5C), 68.55 (2C), 67.64 (2C), 57.54, 30.68, 26.28. HRMS (ESI-TOF) m/z: $[M]_+$ Calculated for $C_{20}H_{20}FeI_2O_2$ 601.8902; Found 601.8909.

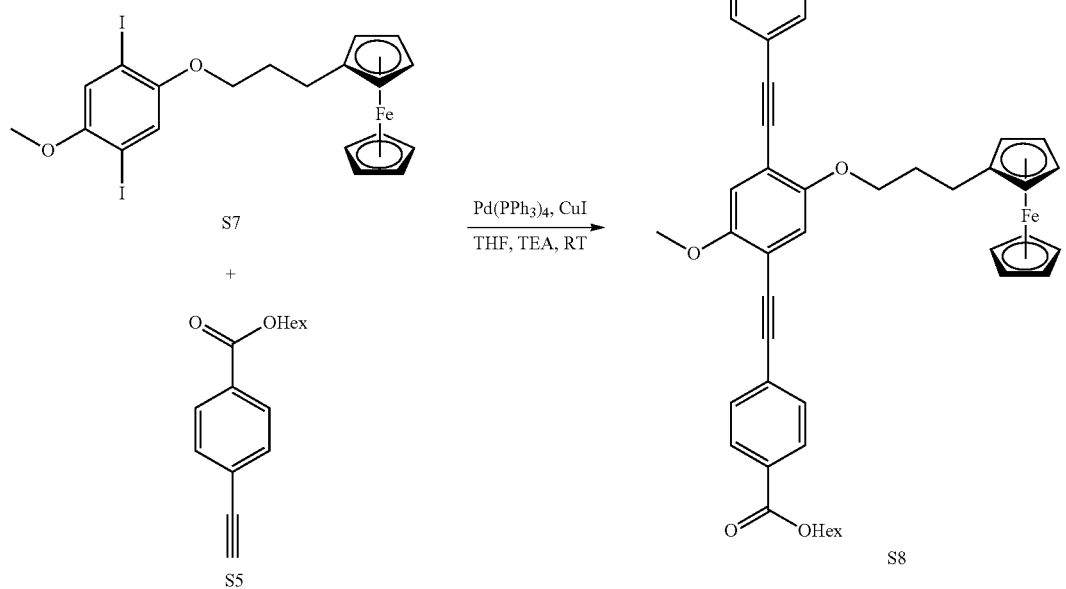

4,4'-[(2-(3-ferrocenylpropoxy)-5-methoxy-1,4-phenylene)di-2,2-ethynediyl]bis-, 1,1'-dihexyl ester benzoic acid (compound S8): Compound S7 (1.68 g, 2.80 mmol, 1 eq), compound S5 (1.42 g, 6.20 mmol, 2.2 eq), $Pd(PPh_3)_4$ (98 mg, 0.084 mmol, 0.03 eq), and copper(I) iodide (16 mg, 0.084 mmol, 0.03 eq) were loaded into a 250 mL Schlenk flask equipped with a magnetic stirbar and a reflux condenser. The flask was evacuated to an internal pressure of 100 mTorr and backfilled with $N_2$ three times. THF (15 mL)

and triethylamine (15 mL) were bubbled for ca. 30 min before being added via syringe. The flask was heated to 60° C. for 8 h, monitored by TLC until the starting material was no longer observed. The reaction vessel was cooled to room temperature, water (40 mL) was added, and the resulting solution was extracted with $CH_2Cl_2$ (3×50 mL). The combined organic phase was washed with 0.5 M HCl (2×50 mL), water (50 mL), brine (50 mL), dried over $Na_2SO_4$ (anhydrous), and filtered. The solvent was removed under reduced pressure in a rotary evaporator at 45° C. and the resulting crude was purified via column chromatography ($SiO_2$, 60% v/v $CH_2Cl_2$/hexanes) yielding S8 as a yellow solid. Yield: 1.67 g, 76%. $_1$H NMR (400 MHz, $CDCl_3$, 25° C.) δ (ppm) 8.05 (d, J=8.2 Hz, 2H), 8.02 (d, J=8.1 Hz, 2H), 7.64 (d, J=8.1 Hz, 2H), 7.61 (d, J=8.0 Hz, 2H), 7.06 (s, 1H), 7.05 (s, 1H), 4.33 (t, J=6.7 Hz, 4H), 4.09 (t, J=1.8 Hz, 2H), 4.08-4.02 (m, 9H), 3.93 (s, 3H), 2.64 (t, J=8.5 Hz, 2H), 2.12-2.01 (m, 2H), 1.83-1.73 (m, 4H), 1.49-1.31 (m, 12H), 0.96-0.87 (m, 6H). $_{13}$C NMR (100 MHz, $CDCl_3$, 25° C.) δ 166.47, 166.43, 154.42, 154.01, 131.90 (2C), 131.79 (2C), 130.38, 130.35, 129.90 (2C), 129.79 (2C), 128.21, 128.06, 117.68, 115.64, 114.30, 113.73, 94.87, 94.80, 89.13, 88.81, 88.37, 69.04, 68.88 (5C), 68.58 (2C), 67.68 (2C), 65.72 (2C), 56.83, 31.82 (2C), 31.00, 29.03 (2C), 26.26, 26.06 (2C), 22.91 (2C), 14.37 (2C). HRMS (ESI-TOF) m/z: $[M]_+$ Calcd for $C_{50}H_{54}FeO_6$ 806.3270; Found 806.3265.

causing the formation of a yellow precipitate. The solid was collected via filtration, washed with water (3×20 mL) and dried under high vacuum yielding Fc link as a yellow solid. Yield: 1.16 g, 87%. $_1$H NMR (400 MHz, DMSO-$d_6$, 25° C.) δ (ppm) 8.00 (d, J=8.8 Hz, 2H), 7.98 (d, J=8.9 Hz, 2H), 7.69 (d, J=8.5 Hz, 2H), 7.65 (d, J=8.5 Hz, 2H), 7.26 (s, 1H), 7.25 (s, 1H), 4.11 (t, J=1.7 Hz, 2H), 4.07 (t, J=6.0 Hz, 2H), 4.04-4.00 (m, 7H), 3.87 (s, 3H), 2.56 (dd, J=8.9, 6.4 Hz, 2H), 2.02-1.88 (m, 2H). $_{13}$C NMR (100 MHz, DMSO-$d_6$, 25° C.) δ 167.45, 167.43, 154.49, 153.94, 132.22 (2C), 132.14 (2C), 131.39, 131.37, 130.41 (2C), 130.37 (2C), 127.57, 127.44, 117.99, 116.13, 113.99, 113.37, 94.98, 94.88, 89.62, 89.44, 88.75, 69.08, 69.02 (5C), 68.63 (2C), 67.76 (2C), 57.11, 30.69, 26.02. HRMS (ESI-TOF) m/z: $[M]_+$ Calcd for $C_{38}H_{30}FeO_6$ 638.1392; Found 638.1403.

General Procedure for FTO Substrate Cleaning and Pre-Treatment

The as received FTO glass was cut into 2 cm×1 cm slides, then immersed in an ultrasound bath in soapy water, deionized water, acetone, and isopropanol for 20 min each solvent and left to dry in air. In a 20 mL vial, Fc (192 mg, 0.3 mmol) and pyridine (20 µL, 0.3 mmol) were dissolved in anhydrous DMF (15 mL). The clean and dry FTO glass slides were immersed in the Fc solution for 24 h, rinsed with fresh DMF (2 mL), and air dried.

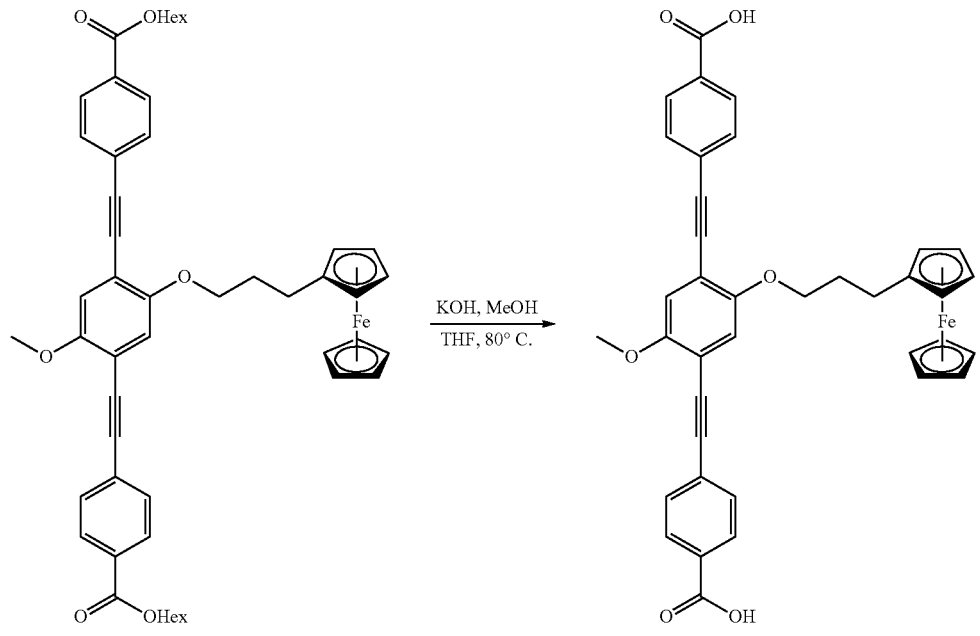

S8 → Fc 4,4'-[(2-(3-ferrocenylpropoxy)-5-methoxy-1,4-phenylene)di-2,2-ethynediyl]bis-benzoic acid (Fc): Compound S8 (1.65 g, 2.1 mmol) was added to a 100 mL round-bottom flask equipped with a magnetic stirbar. THF (15 mL) was added and the solution was stirred at room temperature for 20 min before the addition of 5 M KOH in methanol (2 mL). The reaction was heated to 80° C. for 8 h until the reaction was complete, monitored by TLC until the starting material was no longer observed. The reaction mixture was cooled to room temperature and the THF was removed under reduced pressure in a rotary evaporator at 45° C. The resulting crude was then dissolved in water (20 mL) and neutralized with the dropwise addition of 2 M HCl until a pH of 3-4 is achieved, General Procedure for $Zr_6O_4(OH)_4[Fc_xNR_{1-x}]_6$ MOF Synthesis as Thin Films Over FTO and Bulk Powders In an Ar-filled glovebox, benzoic acid (330 mg, 2.70 mmol) and $ZrOCl_2 \cdot 8H_2O$ (29 mg, 0.09 mmol) were added to a 20 mL scintillation vial equipped with a magnetic stirbar. DMF (5 mL) was added and the reaction mixture was stirred at 80° C. for 20 min. Mixtures of NR and Fc at varied mol ratios (0.06 mmol total) were added, and the reaction was stirred for another 20 min at 80° C. The mixture was then transferred to an 8 mL conical reaction vial containing a pretreated FTO glass slide with its conductive side facing down. The vial was capped with a glass stopper, removed from the glovebox, and placed in an isothermal oven heated to 110° C. for 48 h. The vial was removed from the oven and cooled to room temperature for 30 min. The OF covered FTO slide was removed from the reaction vessel, rinsed with fresh DMF, and stored in a desiccator. This procedure also produced the bulk powders, which were isolated via filtration, rinsed with DMF, $CH_2Cl_2$, and dried in air and stored in a dessicator.

Table 1 shows stoichiometric linker quantities for solid-state synthesis. As used herein "x" refers to the "x" in the formula $Zr_6O_4(OH)_4[Fc_xNR_{1-x}]_6$ for the MOF according to various embodiments.

TABLE 1

| x (mol % Fc) | mmol Fc | mmol NR | mg Fc | mg NR |
|---|---|---|---|---|
| 0 | 0 | 0.060 | 0 | 25.6 |
| 10 | 0.006 | 0.054 | 3.8 | 23.0 |
| 20 | 0.012 | 0.048 | 7.7 | 20.5 |
| 40 | 0.024 | 0.036 | 15.3 | 15.4 |
| 60 | 0.036 | 0.024 | 23.0 | 10.2 |
| 80 | 0.048 | 0.012 | 30.6 | 5.1 |
| 100 | 0.060 | 0 | 38.3 | 0 |

FIG. 2B provides a PXRD of Fc MOF bulk powders.

NMR and EDXS Composition Analysis

General procedure for MOF digestion and composition analysis via NMR. 2.0 mg of MOF powder were placed in a 4 mL vial containing 50 μL of 0.1 M NaOD in $D_2O$, followed by 0.6 mL of DMSO-$d_6$. The vial was immersed in an ultrasonic bath for 10 min and the digested mixture was transferred to an NMR tube. The tube was left to settle for 24 h. $_1$H NMR spectra were collected with 50 transients at 25° C. The NMR data was processed using MNova version 9.0.1. The DMSO peak was set to a chemical shift of 2.500 ppm. Zero filling was set to 256K, exponential multiplication was set to 0.15 Hz, baseline correction was done with a Whittaker function with manual phase correction. Peak deconvolution was performed in the aromatic region (7.4-7.8 ppm) extracting peak areas at 7.49, 7.44, and 7.43 ppm to determine output linker ratios.

General procedure for MOF composition analysis via EDXS. MOF thin films and bulk powders were analyzed via SEM-EDXS using a working distance of 13 mm and a beam energy of 15 kV with a 60 μm aperture. The atomic compositions were determined using the iron K lines at 6.4 keV and 7.1 keV and the zirconium L lines at 2.0 keV.

Figure 5:
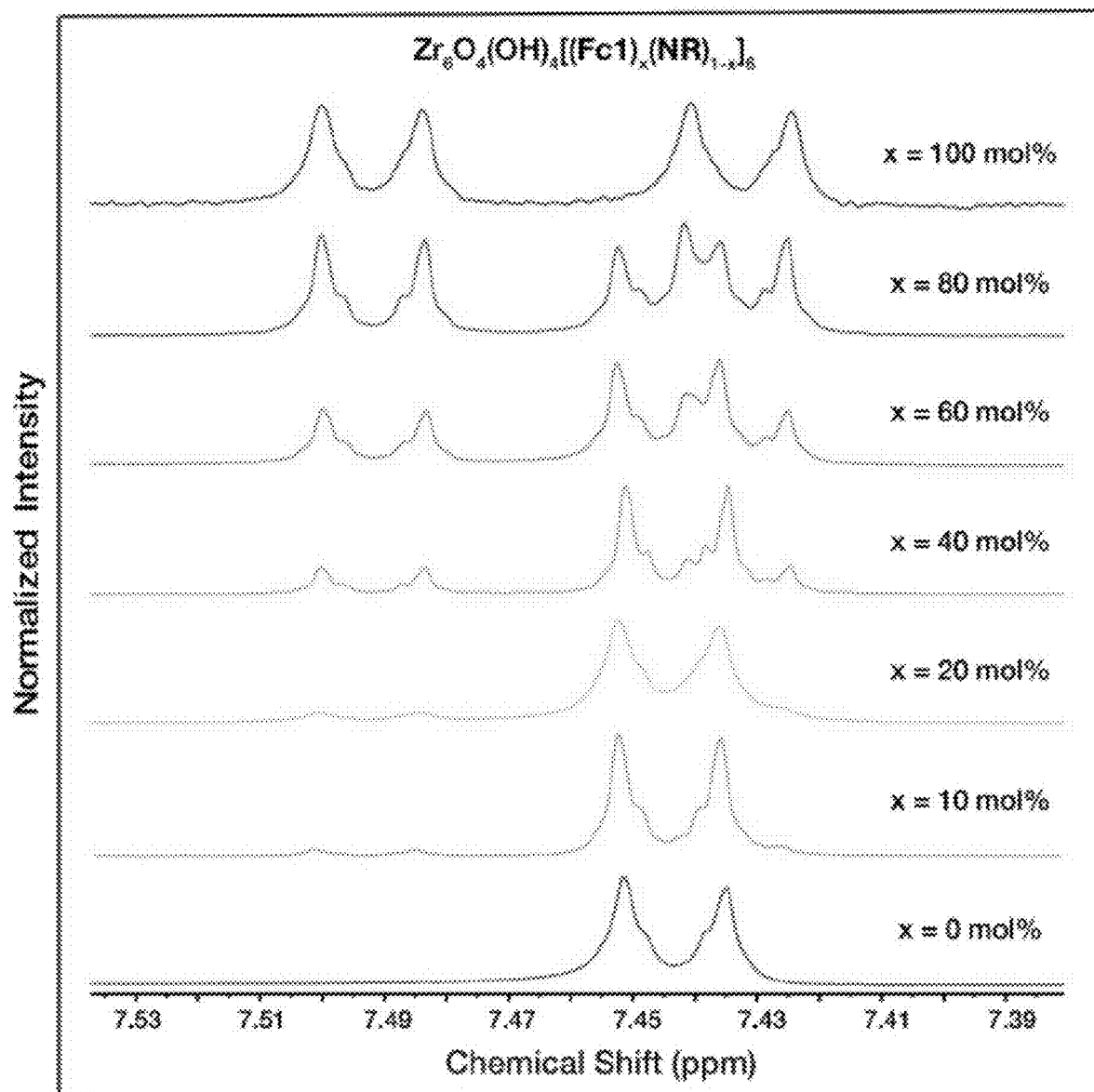
FIG. 5 is an example according to various embodiments illustrating stacked $_1$H NMR from MOF decomposition in DMSO-$d_6$.

FIG. 5 is an example according to various embodiments illustrating stacked $_1$H NMR from MOF decomposition in DMSO-$d_6$. Integration values from the chemical shifts at 7.49, 7.44, and 7.43 were used to calculate the output ratios of Fc to NR.

Table 2 shows Fe and Zr concentrations from EDXS analysis.

TABLE 2

| Fc content (mol %) | Fe (atom %) | Zr (atom %) | Fe/Zr Ratio |
|---|---|---|---|
| 0 | 0 | 3.5 ± 0.10 | 0 |
| 10 | 0.2 ± 0.03 | 1.9 ± 0.09 | 0.12 ± 0.02 |
| 20 | 0.3 ± 0.03 | 1.8 ± 0.03 | 0.19 ± 0.03 |
| 40 | 0.8 ± 0.01 | 2.0 ± 0.06 | 0.40 ± 0.02 |
| 60 | 1.0 ± 0.07 | 1.8 ± 0.10 | 0.57 ± 0.03 |
| 80 | 1.3 ± 0.03 | 1.7 ± 0.06 | 0.79 ± 0.06 |
| 100 | 2.2 ± 0.07 | 2.2 ± 0.06 | 0.98 ± 0.03 |

EDXS Atom Mapping.

Figures 6A, 6B:
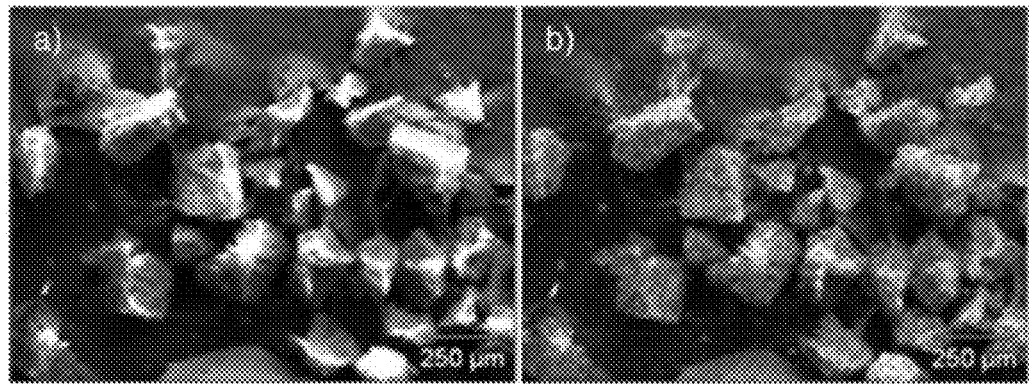
FIG. 6A is an example according to various embodiments illustrating an SEM image of 0% Fc powder.
FIG. 6B is an example according to various embodiments illustrating a Zr mapping overlay of the SEM image of the 0% Fc powder referenced in FIG. 6A.

FIGS. 6A and B are examples according to various embodiments illustrating EDXS of 0% Fc powder. More specifically, FIG. 6A is an example according to various embodiments illustrating an SEM image of 0% Fc powder; and FIG. 6B is an example according to various embodiments illustrating a Zr mapping overlay of the SEM image of the 0% Fc powder referenced in FIG. 6A.

Figures 7A, 7B:
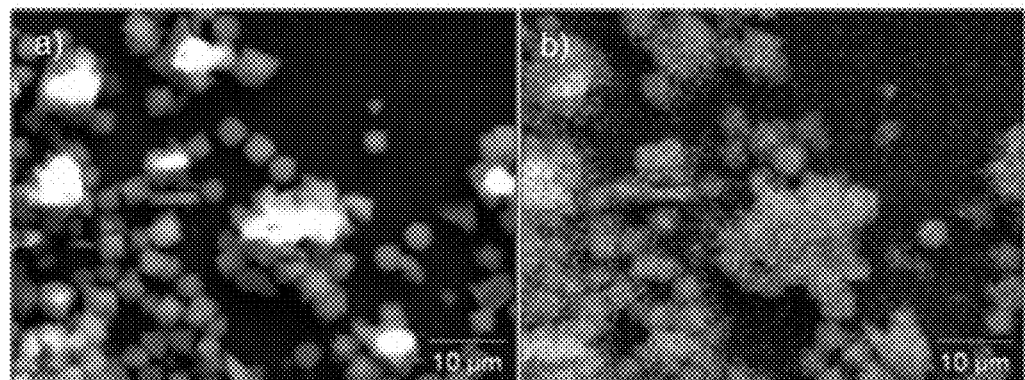
FIG. 7A is an example according to various embodiments illustrating an SEM image of 50% Fc powder.
FIG. 7B is an example according to various embodiments illustrating a Zr mapping overlay of the SEM image of the 50% Fc powder referenced in FIG. 7A.
Figures 7C, 7D:
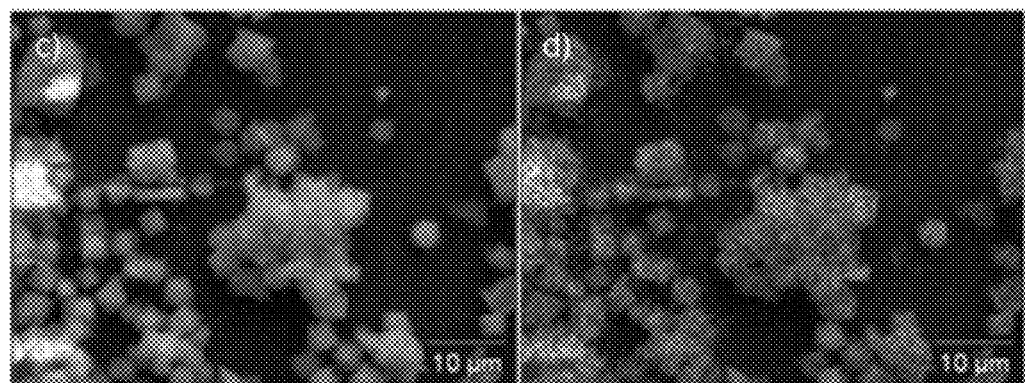
FIG. 7C is an example according to various embodiments illustrating a Fe mapping overlay of the SEM image of the 50% Fc powder referenced in FIG. 7A.
FIG. 7D is an example according to various embodiments illustrating a Zr and Fe mapping overlay of the SEM image of the 50% Fc powder referenced in FIG. 7A.

FIGS. 7A, 7B, 7C, and 7D are examples according to various embodiments illustrating EDXS of 50% Fc powder. More specifically, FIG. 7A is an example according to various embodiments illustrating an SEM image of 50% Fc powder; FIG. 7B is an example according to various embodiments illustrating a Zr mapping overlay of the SEM image of the 50% Fc powder referenced in FIG. 7A; FIG. 7C is an example according to various embodiments illustrating a Fe mapping overlay of the SEM image of the 50% Fc powder referenced in FIG. 7A; and FIG. 7D is an example according to various embodiments illustrating a Zr and Fe mapping overlay of the SEM image of the 50% Fc powder referenced in FIG. 7A.

Figure 8A:
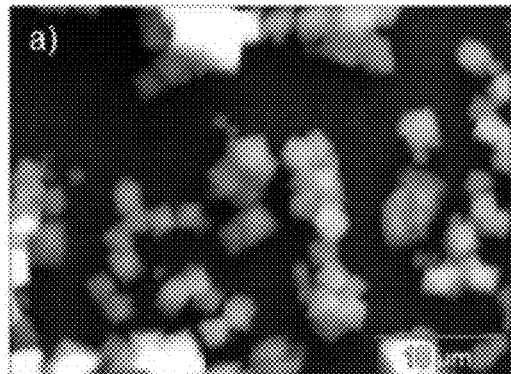
FIG. 8A is an example according to various embodiments illustrating an SEM image of 100% Fc powder.
Figure 8B:
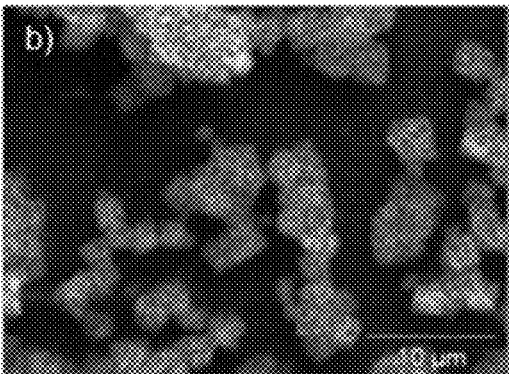
FIG. 8B is an example according to various embodiments illustrating a Zr mapping overlay of the SEM image of the 100% Fc powder referenced in FIG. 8A.
Figure 8C:
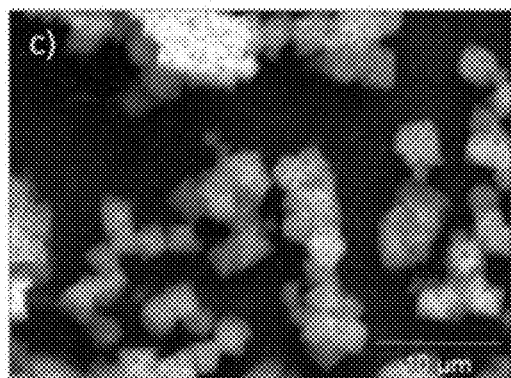
FIG. 8C is an example according to various embodiments illustrating a Fe mapping overlay of the SEM image of the 100% Fc powder referenced in FIG. 8A.
Figure 8D:
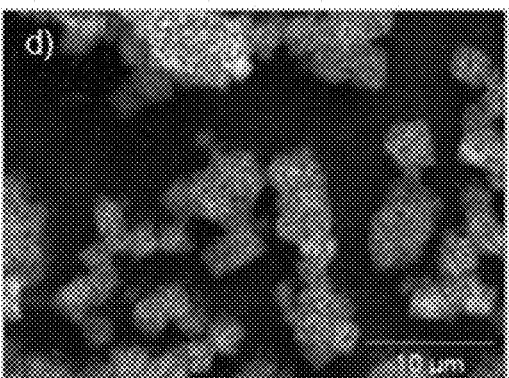
FIG. 8D is an example according to various embodiments illustrating Zr and Fe mapping overlay of the SEM image of the 100% Fc powder referenced in FIG. 8A.
Figure 9A:
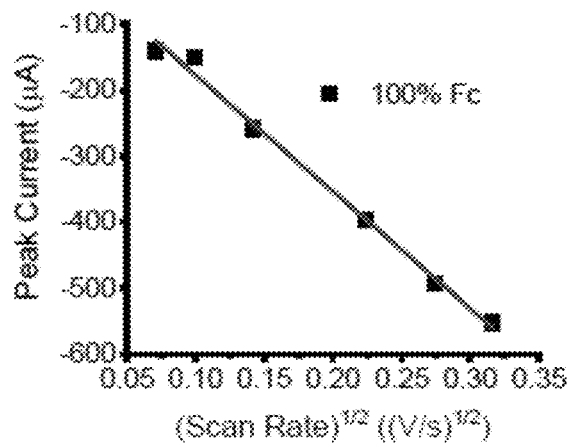
FIGS. 9A, 9B, 9C, and 9D are examples according to various embodiments illustrating square root scan rate dependence of peak current for 40-100% Fc samples.
Figure 9B:
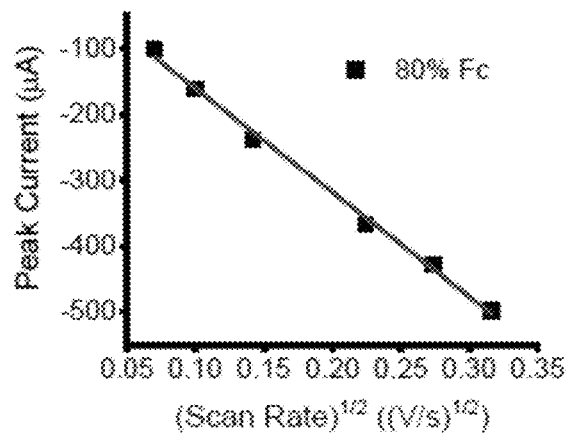
Figure 9C:
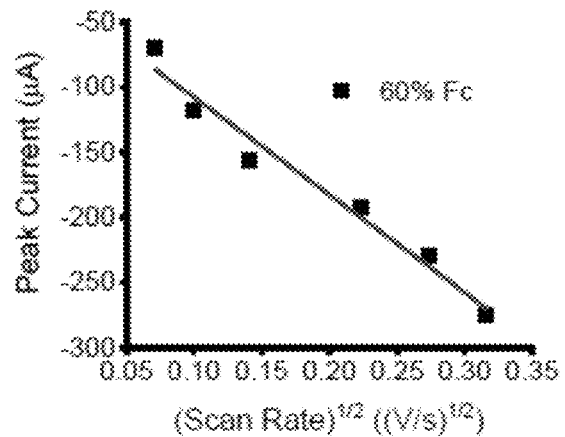
Figure 9D:
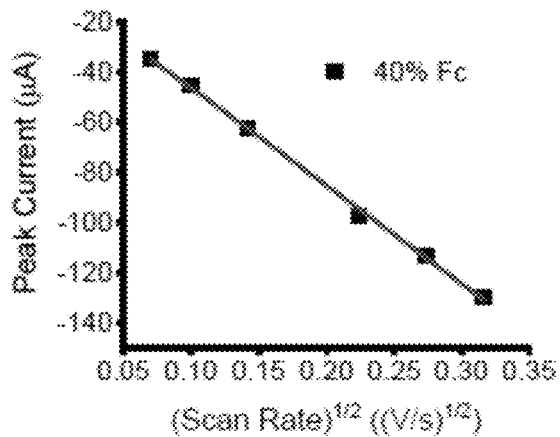

FIGS. 8A, 8B, 8C, and 8D are an examples according to various embodiments illustrating EDXS of 100% Fc powder. More specifically, FIG. 8A is an example according to various embodiments illustrating an SEM image of 100% Fc powder; FIG. 8B is an example according to various embodiments illustrating a Zr mapping overlay of the SEM image of the 100% Fc powder referenced in FIG. 8A; FIG. 8C is an example according to various embodiments illustrating a Fe mapping overlay of the SEM image of the 100% Fc powder referenced in FIG. 8A; and FIG. 8D is an example according to various embodiments illustrating Zr and Fe mapping overlay of the SEM image of the 100% Fc powder referenced in FIG. 8A.

Electrochemical Methods

For electrochemical analysis, the MOF-coated FTO slides were mounted into Teflon electrochemical cells. The films would be allowed to soak for at least six hours in the solvent/electrolyte system (0.1 M $LiBF_4$ in acetonitrile) before analysis. A platinum counter electrode and a silver quasireference electrode were used, with the MOF-modified FTO as the working electrode. After analysis, molecular ferrocene was added to the cell and used a 25 μm diameter gold ultramicroelectrode to properly reference the system.

The charge transport behavior of MOF electrodes was studied via cyclic voltammetry. The voltammetric peak currents were observed to be a function of the square root of scan rate, implying diffusive behavior rather than thin film behavior, which would result in a linear dependence of peak current on scan rate.[31] Below in FIG. S6 are the plots of anodic peak current vs the square root of scan rate for the 40-100% Fc samples; the cathodic peak heights were harder to accurately quantify due to the heavily sloping background of the reductive sweep. The 10% and 20% Fc samples did not have well defined peaks, and thus accurate peak heights were immeasurable. FIG. S7 shows voltammograms for the 100% Fc sample at each different scan rate and sample voltammograms of the 20% and 10% samples showing the lack of welldefined peaks.

FIGS. 9A, 9B, 9C, and 9D are examples according to various embodiments illustrating square root scan rate dependence of peak current for 40-100% Fc samples.

Figure 10A:
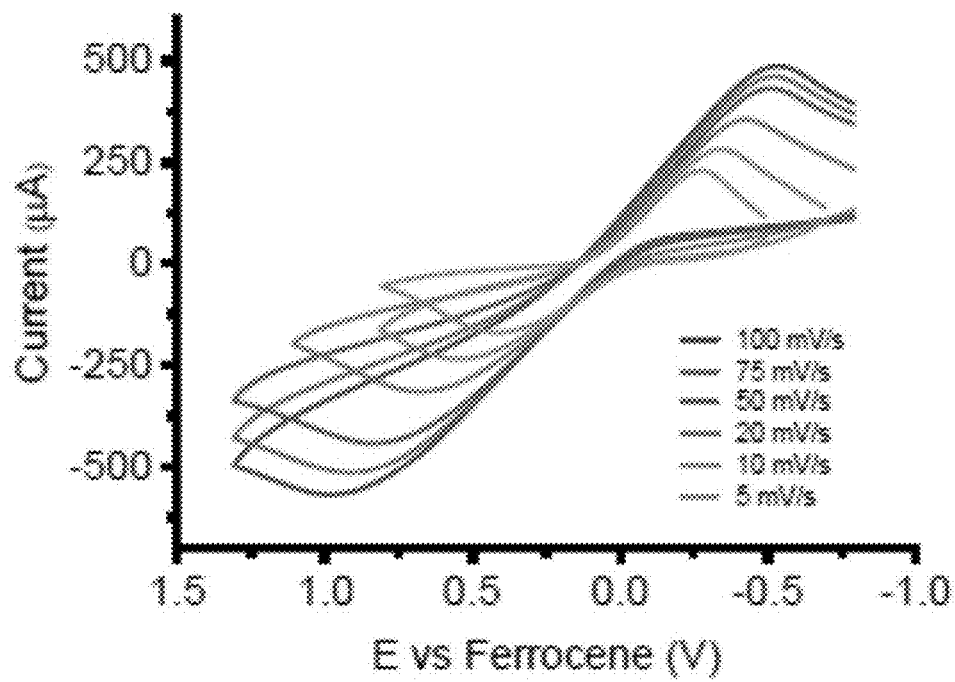
FIGS. 10A, 10B, and 10C are examples according to various embodiments illustrating scan rate dependence voltammograms of 100% Fc, 20% Fc, and 10% Fc, respectively (scan rate: 20 mV $s_{-1}$).
Figure 10B:
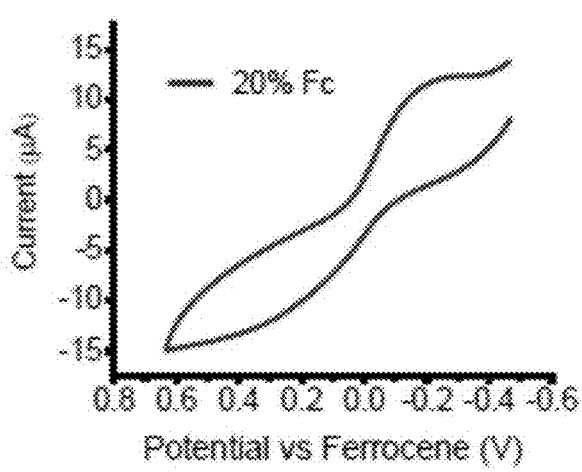
Figure 10C:
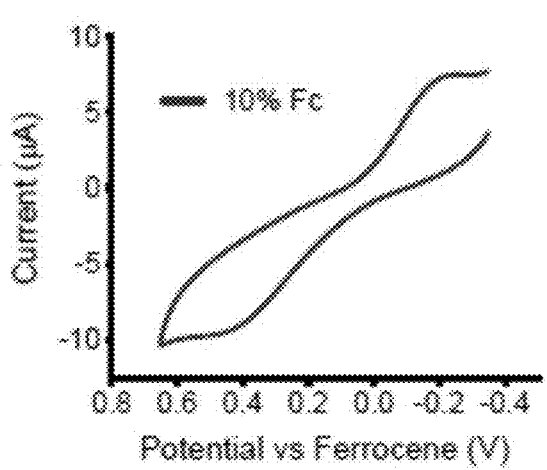

FIGS. 10A, 10B, and 10C are examples according to various embodiments illustrating scan rate dependence voltammograms of 100% Fc, 20% Fc, and 10% Fc, respectively (scan rate: 20 mV $s_{-1}$).

To both confirm the theoretical concentrations of ferrocene in the MOFs and to measure charge diffusion coefficients, the films were subjected to highly oxidizing and reducing potential steps, allowing chronocoulometric analysis. The charge vs. square root of time curves (Anson plots) below in FIG. S9 show charge leveling off with time in the higher concentrated samples (40-100% Fc). This was attributed to bulk depletion of ferrocene in the films. The more concentrated films have higher diffusion coefficients, leading to faster bulk electrolysis of the films. For the 40-100% Fc films, ferrocene concentrations can be estimated by converting charge electrolyzed at the leveling-off point to moles of ferrocene via Faraday's law:

$$Q = nN_{fc}F$$

where Q is the total charge passed, n is the number of electrons per redox event (one in this case), $N_{Fc}$ is the number of moles of ferrocene, and F is Faraday's constant. Moles of ferrocene are then divided by the volume of film exposed to solution. This volume was assumed to be a cylinder with height equal to the film thickness obtained by optical profilometry. The radius of the exposed film area was measured by observing the films after oxidation, whereupon they gained a bluish tint from the conversion of ferrocene to ferricinium. A picture of one of the films after oxidation is shown in FIG. S8. This area was larger than the hole in the electrochemical cell, likely due to the swelling of the cell O-ring and the porosity of the films.

Figure 11:
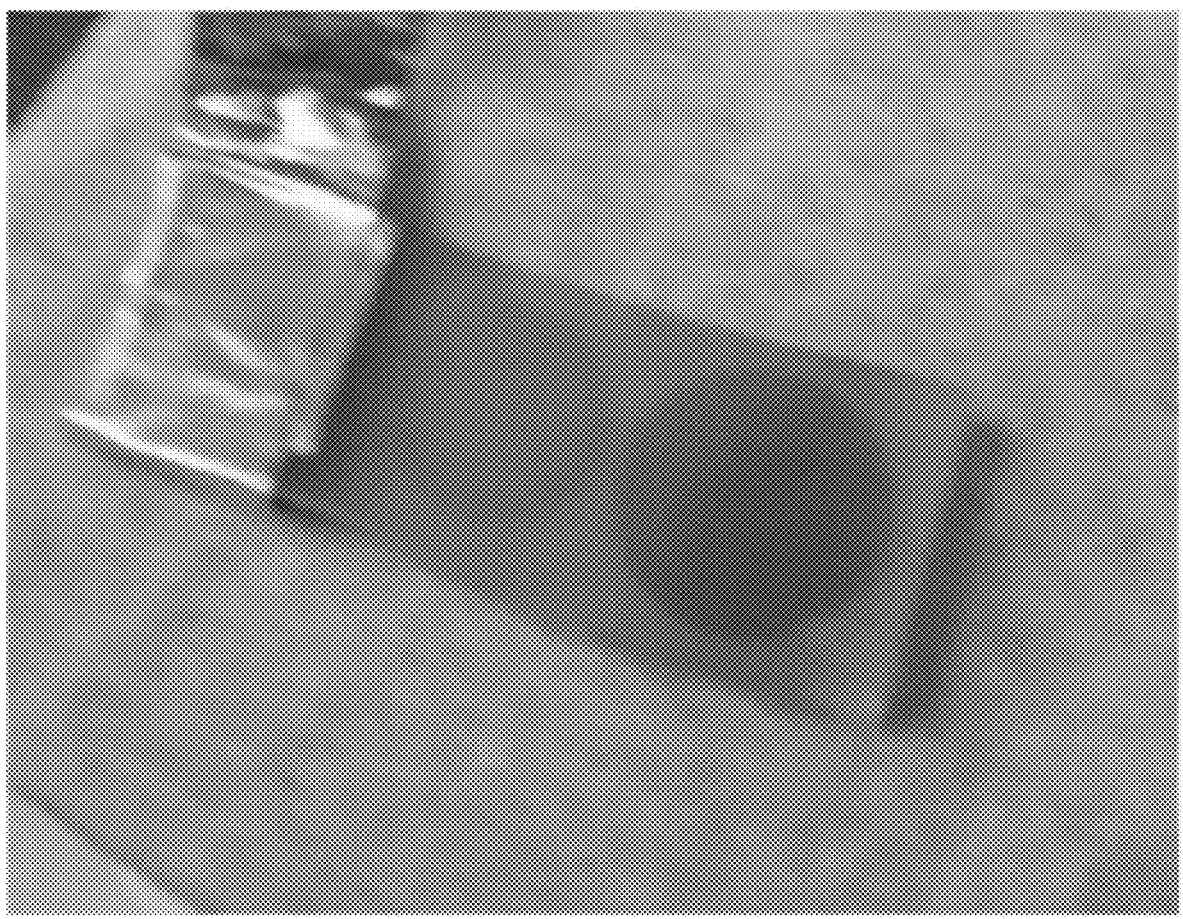
FIG. 11 is an example according to various embodiments illustrating an image of a charged/oxidized Fc thin film.
Figure 13A:
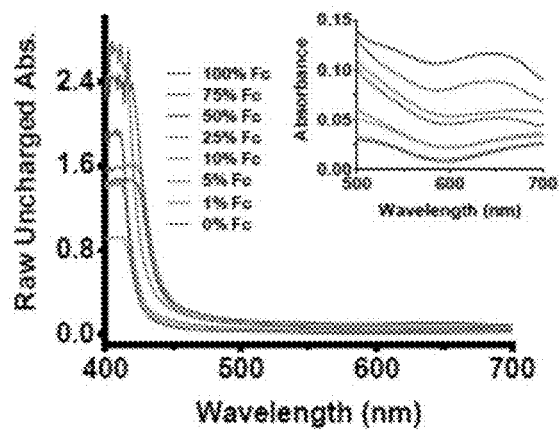
FIGS. 13A, 13B, 13C, and 13D are examples according to various embodiments illustrating UV-vis spectra of charged and uncharged Fc MOFs. Zoomed portions of the spectra near 630 nm appear in the insets.
Figure 13B:
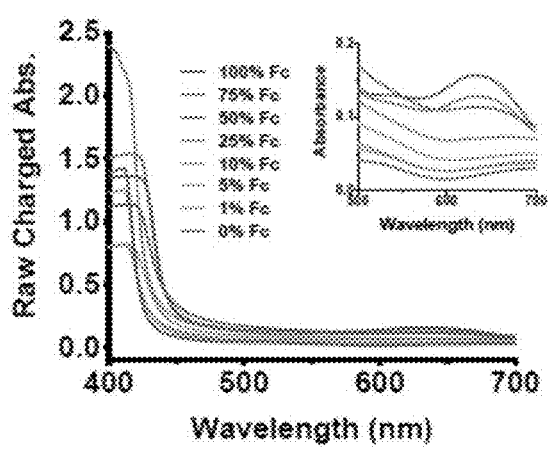
Figure 13C:
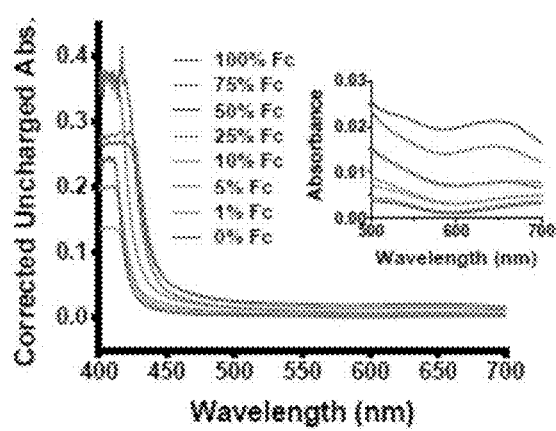
Figure 13D:
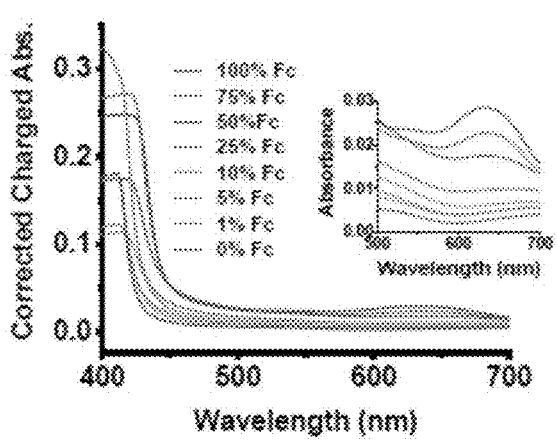

FIG. 11 is an example according to various embodiments illustrating an image of a charged/oxidized Fc thin film. The dark blue circle clearly displays the oxidation of ferrocene within the exposed film area.

Table 3 demonstrates how closely the theoretical values of ferrocene concentration match those obtained experimentally for the 20-100% samples, with the 10% samples only showing 42% of the theoretical ferrocene capacity (Q values for the 10/20% samples were taken as the charge electrolyzed at the end of the 10 min charging steps). This strongly suggests that the entire thickness of the more concentrated films is electrochemically accessible, and not simply the area near the FTO. The striking hue difference between oxidized and unoxidized portions of the film (along with the UV-vis spectroscopy of the oxidized films) also imply that a significant portion of the film is being electrolyzed.

Example Ferrocene Concentration Calculation:

This calculation is for a 100% Fc sample, anodic step. The thickness of film is 5.4 µm. The approximate radius of exposed area of MOF is 3.5 mm. The thickness of films is given by:

$$V_{exposed \; MOF} = 5.4 \times 10^{-6} m * \pi * (3.5 \times 10^{-3} m)^2 = 2.08 \times 10^{-10} m^3 = 2.08 \times 10^{-7} L$$

The approximate charge reached before leveling of current is 0.025 C.

$$0.025 \; C = 1 * N_{Fc} * 96485 \frac{C}{mol}$$

$$N_{Fc} = \frac{0.025 \; C}{96485 \frac{C}{mol}} = 2.59 \times 10^{-7} \text{ moles of ferrocene}$$

$$C_{Fc} = \frac{2.59 \times 10^{-7} \text{ mol}}{2.087 \times 10^{-7} \; L} = 1.25 \; M$$

TABLE 3

| Fc content (mol %) | [Fc], Theory (M) | [Fc], Experiment (M) | $[Fc]_{exp}/[Fc]_{theory}$ |
|---|---|---|---|
| 100 | 1.25 | 1.20 ± 0.15 | 0.96 |
| 80 | 1.00 | 0.97 ± 0.17 | 0.97 |
| 60 | 0.75 | 0.74 ± 0.14 | 0.99 |
| 40 | 0.5 | 0.42 ± 0.08 | 0.84 |
| 20 | 0.25 | 0.27 ± 0.12 | 1.08 |
| 10 | 0.125 | 0.052 ± 0.018 | 0.42 |

In addition to concentration calculations, the Anson plots were also used to calculate experimental diffusion coefficients. Both oxidizing and subsequent reducing potential steps were applied to the films, resulting in a current-time curve which follows the Cottrell equation. Integrating the Cottrell equation yields the trend of charge with time:

$$Q(t) = \frac{2nFAD^{\frac{1}{2}}C^*t^{\frac{1}{2}}}{\pi^{\frac{1}{2}}}$$

where n is the number of electrons per charge transfer, F is Faraday's constant, A is the area of the electrode, D is the diffusion coefficient of the species being electrolyzed, and C• is the bulk concentration of redox species. Theoretical concentrations of Fc based off 1.25 M for the 100% Fc sample were used (Table S3). Plotting charge vs the square root of time should yield a straight line. The slope of that line can be used to calculate the diffusion coefficient of the species of interest, given that concentration and the area of the electrode are known. These experiments included both oxidizing steps (corresponding to effective diffusion of the reduced species) and reductive steps (corresponding to effective diffusion of the oxidized species). The experimentally derived diffusion coefficients are plotted as a function of ferrocene percentage along with the simulated values from DigiElch software and theoretical values calculated from redox polymer theory in FIG. S12.

Example Diffusion Coefficient Calculation:

This calculation is for 100% Fc, Cathodic Step. Slope of Q vs t½ curve (obtained by linear regression; linear portion marked in red in Anson plots) is 0.0026 C s-1/2

$$0.0026 \frac{C}{s^{\frac{1}{2}}} = \frac{2nFAD^{\frac{1}{2}}C}{\pi^{\frac{1}{2}}}$$

$$D = \left( \frac{0.0026 \frac{C}{s^{\frac{1}{2}}} * \pi^{\frac{1}{2}}}{2 * 96485 \frac{C}{mol} * 3.6 \times 10^{-5} m^2 * 1250 \frac{mol}{m^3}} \right)^2 = 2.8 \times 10^{-13} \frac{m^2}{s}$$

FIGS. 12A, 12B, 12C, 12D, 12E, 12F, 12G, 12H, 12I, 12J, 12K, and 12L are examples according to various embodiments illustrating anson plots for Fc MOFs for both charging (anodic) and discharging (cathodic) steps.

Films were analyzed with diffuse transmittance UV-vis spectroscopy before and after 15 minutes of oxidative charging. Visually, the more concentrated films turned blue upon oxidation, while the 20% Fc and more dilute samples showed little if any visual change. The intense light scattering from the films and high background of the base MOF lead to spectra that should be analyzed qualitatively. To correct for differing film coverages and thicknesses, the spectra may be divided by their thickness in microns and multiplied by their surface coverage percentage (both determined by optical profilometry). The raw and corrected spectra, both before and after charging, are shown below in FIG. S10 for all samples.

FIGS. 13A, 13B, 13C, and 13D are examples according to various embodiments illustrating UV-vis spectra of charged and uncharged Fc MOFs. Zoomed portions of the spectra near 630 nm appear in the insets.

Figure 14:
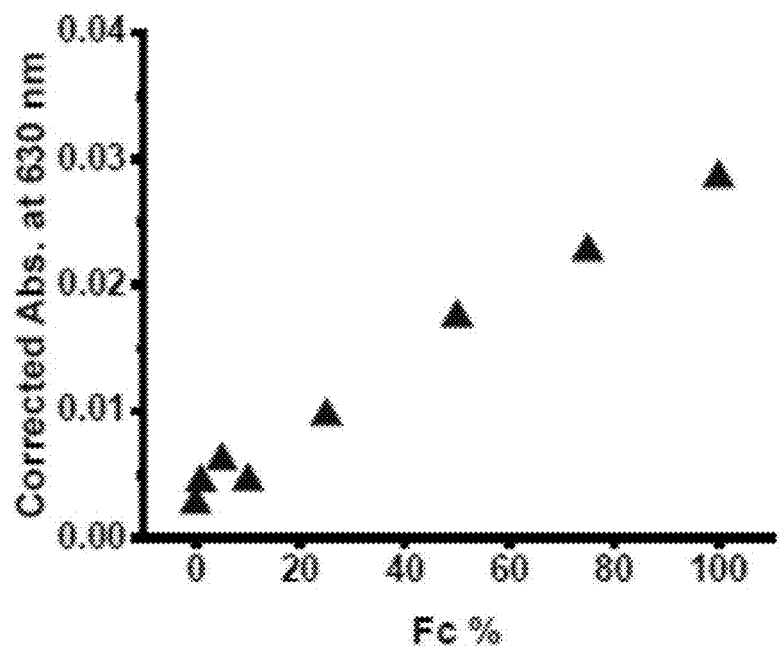
FIG. 14 is an example according to various embodiments illustrating Absorbance trend at 630 nm of the coverage/thickness-corrected charge films.

FIG. 14 is an example according to various embodiments illustrating Absorbance trend at 630 nm of the coverage/thickness-corrected charge films.

The more concentrated charged films show a clear absorbance peak near 630 nm compared to the uncharged spectra. Measuring the absorbance values of the coverage/thickness corrected spectra at 630 nm leads to a linear trend. A simple calculation shows that even the slowest diffusing films can be fully oxidized within 15 minutes. The following equation predicts how far a diffusing species travels in a given time:

$$\Delta = \sqrt{2D_{CT}t}$$

where $\Delta$ is the root-mean-square distance traveled by the diffusing species and t is time. Using the diffusion coefficient of the 10% Fc, it is possible to calculate how far the charge can percolate through the film within 15 minutes.

$$\Delta = 2 * 6.9 \times 10^{-11} cm^2/s * 900s = 3.5 \mu m$$

Since the films have thicknesses from 3-7 microns, this implies that even the slowest diffusing films should be able to be charged in 15 minutes.

Electrochemical Simulations and Theory

To confirm that the diffusion coefficients obtained from the Anson analysis were plausible, voltammograms of the MOFs were simulated with DigiElch (version 7) software. The 20 mV s$_{-1}$ scans were simulated for each concentration, and theoretical concentration values were used and were multiplied by the sample ferrocene ratios; for instance, the 80% Fc sample would have a Fc concentration of 1.25M× 0.8. A double capacitance of 50 μΩ was used for all simulations, and solution resistances obtained from the CHI 760 potentiostat for each sample were inputted to the software (these ranged from 700-1000Ω). A planar geometry was used, with an area of 0.385 cm$_2$. To simulate the film aspect of the MOFs, finite 1D diffusion was used in the simulation using thicknesses determined by optical profilometry. A closed right boundary condition (BRB in the DigiElch software) was used, which sets the concentration gradient at edge of the film to zero. The voltammograms were fitted by changing the diffusion coefficients of the reduced and oxidized species (film charging and discharging, respectively), kinetics of charge transfer at the electrode, and the transfer coefficient of the reaction.

Shown below in FIGS. 15A-F are the simulations overlaid with their respective experimental voltammograms. Note that the very low concentrations have a very poor fit, which is likely due to the poor overall electroactivity of these films. The simulation parameters used for these fits are shown in Table 4. The low $k_o$ values are possibly due the distance separation from the FTO substrate to the ferrocene moieties, since the pendants are located at the center of each linker and a monolayer of linkers was used to start the growth of these MOFs. These simulated diffusion coefficients are plotted alongside those obtained from Anson plots and from redox polymer theory in FIG. 16.

FIGS. 15A, 15B, 15C, 15D, 15E, and 15F are examples according to various embodiments illustrating overlaid simulated and experimental cyclic voltammograms of Fc MOFs. Table 4 shows parameters of MOFs Extracted from DigiElch Simulation.

TABLE 4

| Sample | $D_O$ (cm$^2$ s$^{-1}$) | $D_R$ (cm$^2$ s$^{-1}$) | α | k° (cm s$^{-1}$) |
|---|---|---|---|---|
| 100% Fc | 1.4 × 10$^{-9}$ | 2.3 × 10$^{-9}$ | 0.75 | 3 × 10$^{-6}$ |
| 80% Fc | 1.4 × 10$^{-9}$ | 1.2 × 10$^{-9}$ | 0.8 | 4 × 10$^{-6}$ |
| 60% Fc | 2.1 × 10$^{-9}$ | 3 × 10$^{-9}$ | 0.75 | 3 × 10$^{-6}$ |
| 40% Fc | 2.6 × 10$^{-10}$ | 5 × 10$^{-10}$ | 0.6 | 4 × 10$^{-6}$ |
| 20% Fc | 3.9 × 10$^{-11}$ | 6 × 10$^{-11}$ | 0.8 | 4 × 10$^{-7}$ |
| 10% Fc | 5.8 × 10$^{-11}$ | 8 × 10$^{-11}$ | 0.65 | 8 × 10$^{-8}$ |

Diffusion Coefficient Theory

In order to better understand the results of how the electroactivity (i.e. peak currents and diffusion coefficients) of the MOFs varied with ferrocene content, electron diffusion theory for electroactive polymers, developed by Fritsch-Faules and Faulkner, was used to model the diffusion coefficients of charge in the films. Since the ferrocene within the MOFs is spatially fixed, the diffusion coefficients of oxidized or reduced species are indicators of charge diffusion within the film via electron hopping between pendants. The model assumes that the redox species are randomly distributed throughout the framework, and that charge diffusion is controlled by the speed of electron exchange between nearest redox neighbors. This rate of electron transfer is exponentially dependent on the distance between neighboring redox pendants. The diffusion coefficient is given by the following equation:

$$D_E = \frac{k_{et} r_{NN}^2}{6}$$

where $D_E$ is the diffusion coefficient of electrons in the film, $k_{et}$ is the effective charge transfer rate between pendants, and $r_{NN}$ is the average distance between redox pendants. The transfer rate, $k_{et}$, is given by the following equation:

$$k_{et} = k' e^{-(r_{NN} - r_0)/\delta}$$

where k' is a constant for a given pendant species representing the intrinsic facility of electron transfer, $r_0$ is the contact radius (also molecular diameter of the pendant: 0.6 nm for ferrocene), and δ is a constant for the medium denoting the distance dependence of electronic coupling.

Ferrocene content in the film effects $r_{NN}$, giving a concentration dependence on the diffusion coefficient of electrons in the film. The equation for $r_{NN}$ is as follows:

$$r_{NN} = \left(\frac{3}{4\pi c}\right)^{1/3} e^{\gamma} \left[\Gamma\left(\frac{4}{3}\right) - \sum_{n=1}^{\infty} \frac{(-1)^n \gamma^{\left(n + \frac{4}{3}\right)}}{n!\left(n + \frac{4}{3}\right)}\right]$$

where c is the number concentration of redox pendants (calculated by multiplying the concentration in mM by Avogadro's number), γ is a dimensionless parameter that relates concentration of pendants to an excluded volume resulting from packing finitely sized pendants ($\gamma = (4/3)\pi r_0^3 c$), and Γ is the gamma function. The summation expression quickly approaches zero as n increases due to the factorial expression in the denominator, so the equation easily converges to a real number.

Thus, $D_e$ can be modeled as a function of concentration; this function increases exponentially at low concentrations, eventually becoming linear before leveling off. The data seems to follow this trend as seen in FIG. 2b in the main text. If experimental diffusion coefficients are known through experiment, these curves can be fitted to find k' and δ. Theoretical diffusion coefficients are plotted below in FIG. S13, alongside those found experimentally from Anson plots and those from DigiElch simulation software fitting.

One factor that is neglected in this theory is the relative ease/difficulty of counter-ion insertion, which is one possible cause of the differing $D_O$ and $D_R$ values for the MOFs. Palmer and coworkers[21] saw the same effect of different diffusion coefficients for film oxidation and reduction and suggested the differences may be a result of counter-ion insertion/expulsion dynamics.

Figure 16:
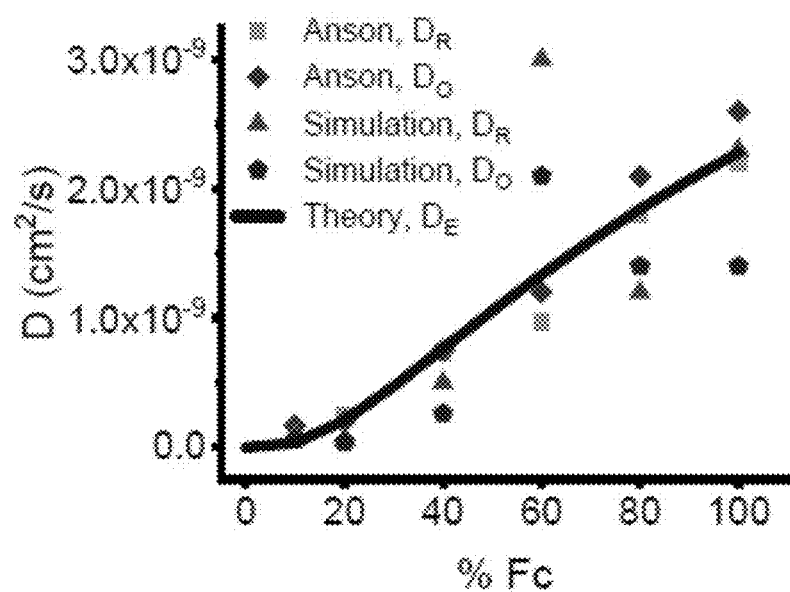
FIG. 16 is an example according to various embodiments illustrating Diffusion coefficients of Fc MOFs determined by Anson plots, simulation, and redox polymer theory.
Figure 15A:
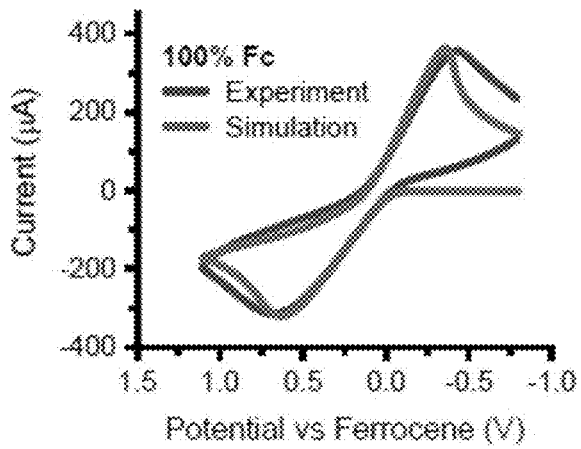
FIGS. 15A, 15B, 15C, 15D, 15E, and 15F are examples according to various embodiments illustrating overlaid simulated and experimental cyclic voltammograms of Fc MOFs.
Figure 15B:
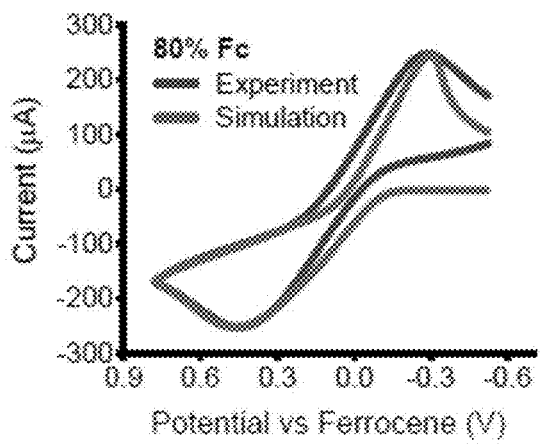
Figure 15C:
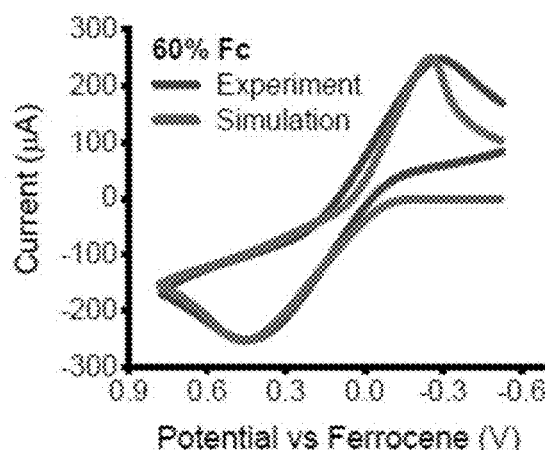
Figure 15D:
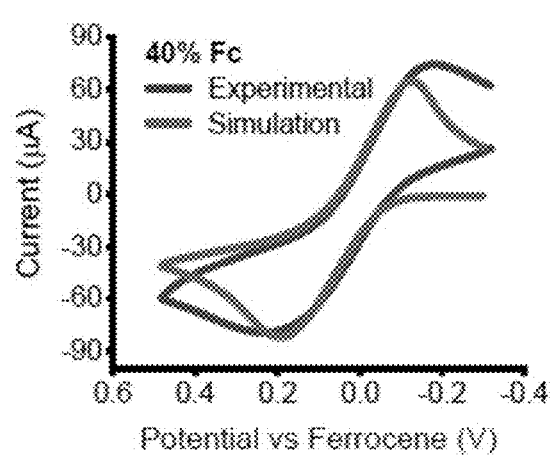
Figure 15E:
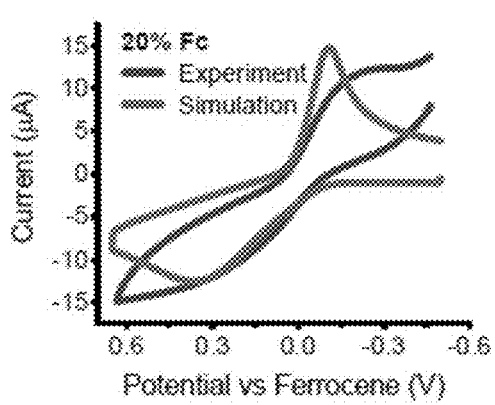
Figure 15F:
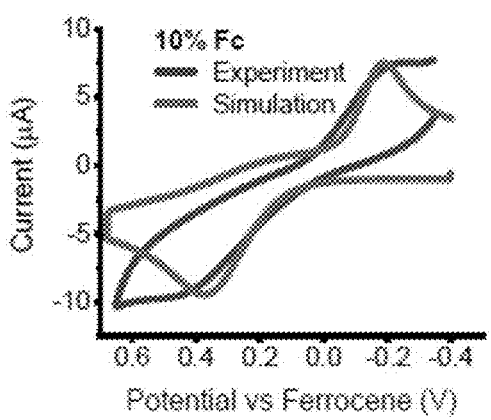

FIG. 16 is an example according to various embodiments illustrating Diffusion coefficients of Fc MOFs determined by Anson plots, simulation, and redox polymer theory. Table 5 shows tabulated diffusion coefficients from different methods.

TABLE 5

| Sample | $D_E$, Redox-Polymer Theory ($10^{-11}$ cm² s⁻¹) | $D_R$, Anson ($10^{-11}$ cm² s⁻¹) | $D_O$, Anson ($10^{-11}$ cm² s⁻¹) | $D_R$, DigiElch Simulation ($10^{-11}$ cm² s⁻¹) | $D_O$, DigiElch Simulation ($10^{-11}$ cm² s⁻¹) |
|---|---|---|---|---|---|
| 100% Fc | 228 | 230 ± 50 | 170 ± 100 | 160 ± 60 | 170 ± 40 |
| 80% Fc | 184 | 190 ± 9 | 210 ± 30 | 120 ± 20 | 140 ± 10 |
| 60% Fc | 134 | 130 ± 40 | 150 ± 30 | 60 ± 10 | 70 ± 10 |
| 40% Fc | 76.4 | 650 ± 150 | 66 ± 10 | 30 ± 20 | 27 ± 3 |
| 20% Fc | 20.9 | 24 ± 10 | 21 ± 11 | 13 ± 9 | 12 ± 10 |
| 10% Fc | 3.35 | 6.9 ± 3.7 | 15 ± 12 | 3.4 ± 4.0 | 2.7 ± 2.7 |

Determination of Redox Conductivity

The redox conductivity of the MOFs can be determined from the diffusion coefficient and the concentration of Fc using the Einstein-Nernst equation:

$$\sigma = \lambda_e^\circ [Fc]$$

where:

$$\lambda_e^\circ = \frac{F^2}{RT} D_e$$

$$[Fc] = x[\text{links}]_{max}$$

$x$ = fraction mol of $Fc$ links from $Zr_6O_6[(Fc)_x(NR)_{1-x}]_6$ and:

$$[\text{links}]_{max} = \frac{\text{links per unit cell}}{\text{crystallographic } u.c. \text{ volume}}$$

$$[\text{links}]_{max} = \frac{48 \text{ links}}{63414.7 \text{ Å}^3} \left(\frac{10^{30} \text{Å}^3}{1 \text{ m}^3}\right)\left(\frac{1 \text{ mol}}{6.024 \times 10^{23} \text{ links}}\right)$$

$$[\text{links}]_{max} = 1.26 \times 10^3 \text{ mol } m^{-3} = 1.26 \text{ M}$$

Then, the upper limit of conductivity is:

$$\sigma(x=1.0) = 1.10 \, mSm^{-1}$$

Optical Profilometry Images of MOF Thin-Films

Figure 17A:
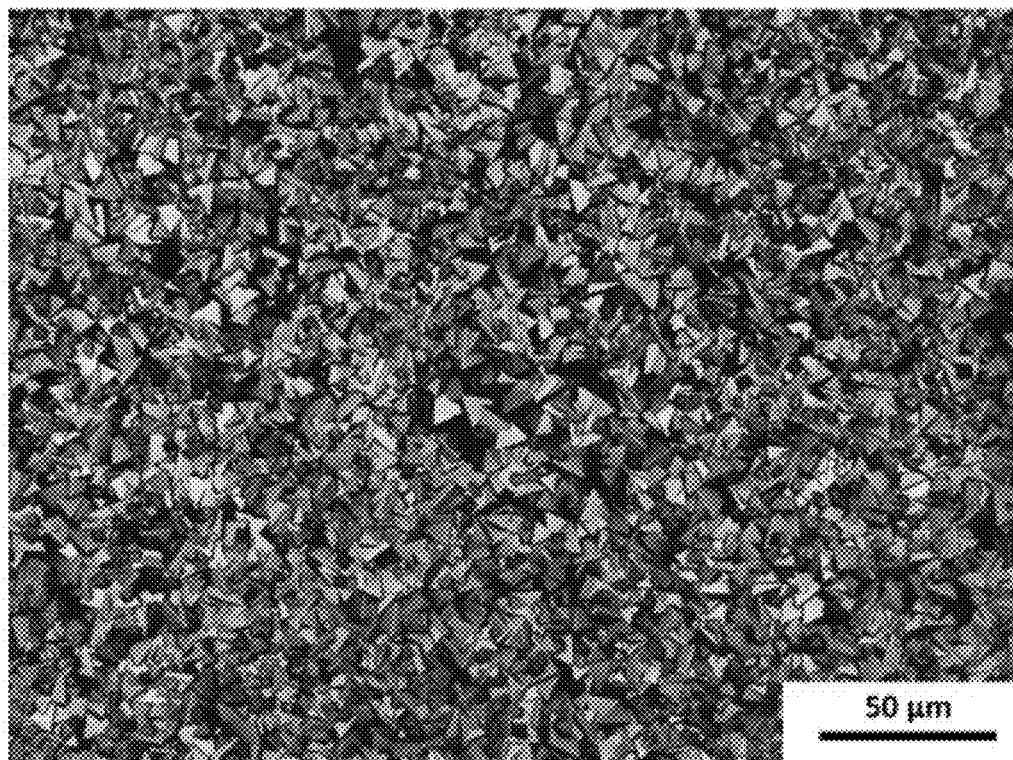
FIG. 17A is an example according to various embodiments illustrating Optical image of 10% Fc thin film.
Figure 17B:
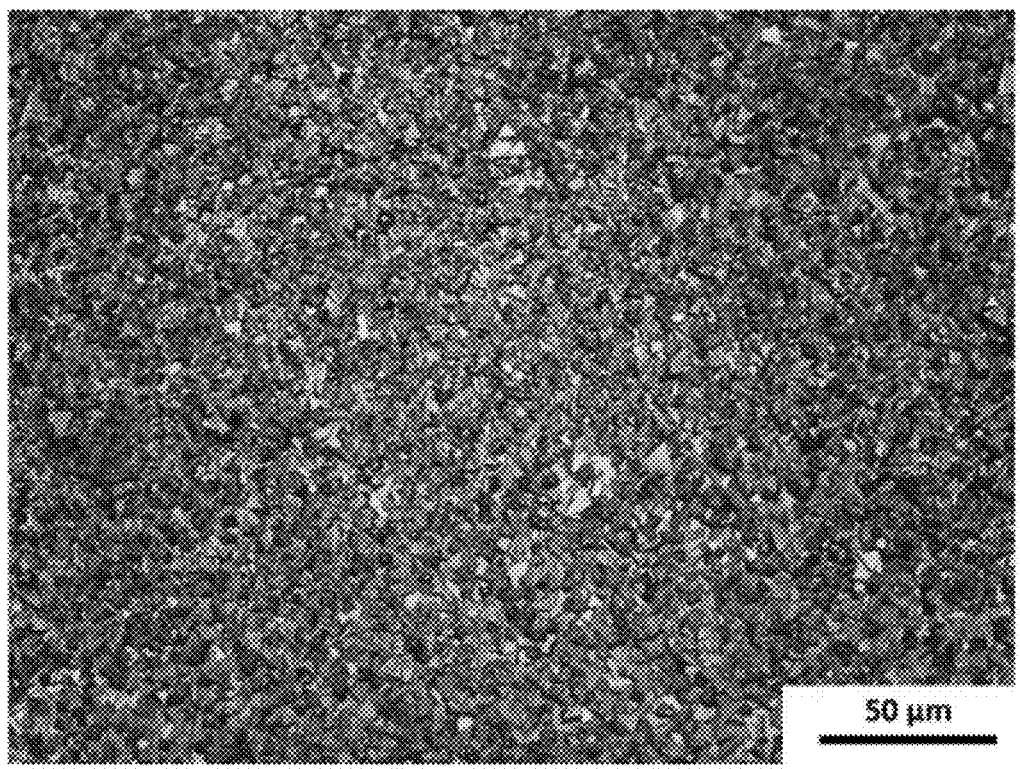
FIG. 17B is an example according to various embodiments illustrating Optical image of 20% Fc thin film.
Figure 17C:
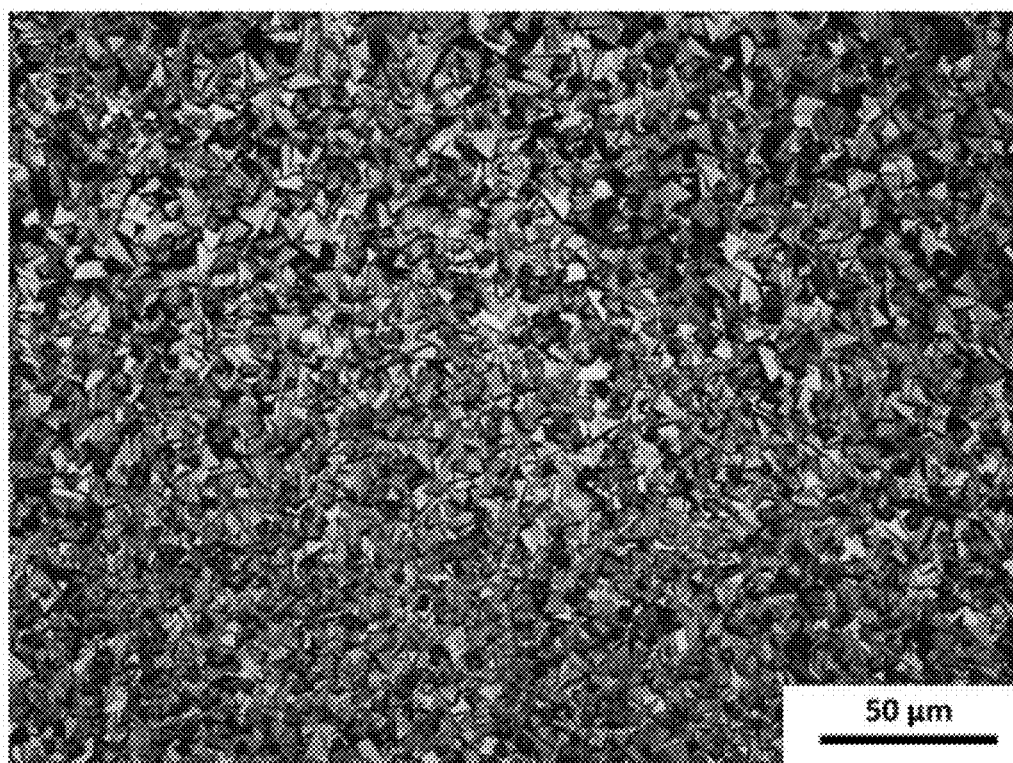
FIG. 17C is an example according to various embodiments illustrating Optical image of 40% Fc thin film.
Figure 17D:
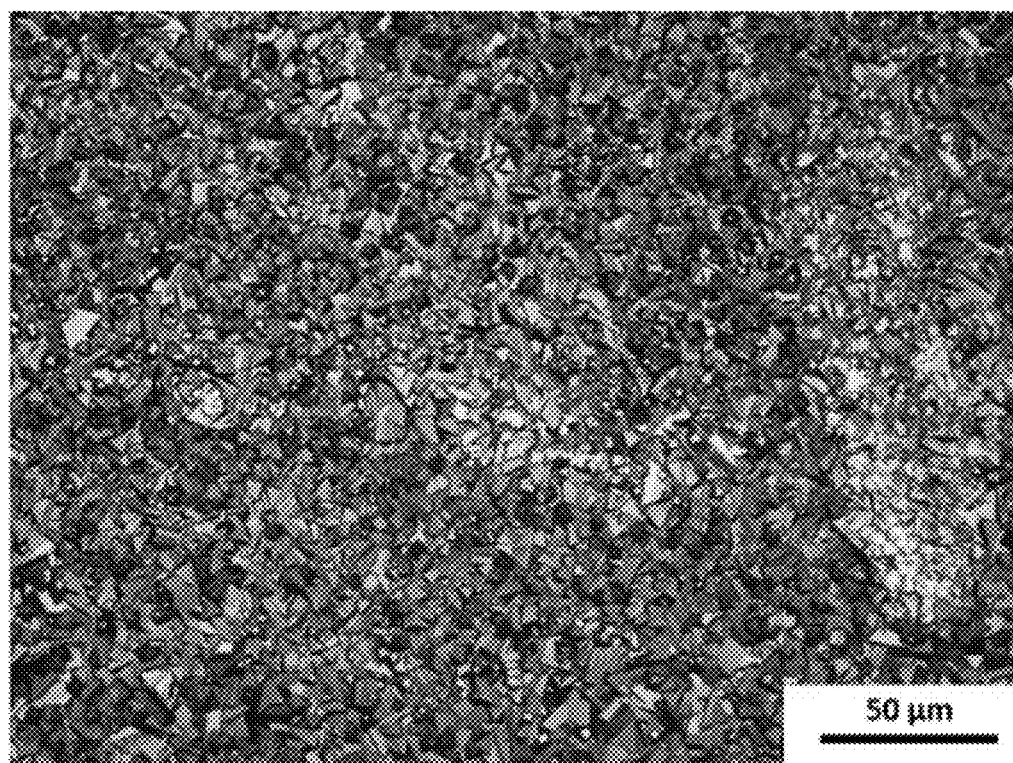
FIG. 17D is an example according to various embodiments illustrating Optical image of 60% Fc thin film.
Figure 17E:
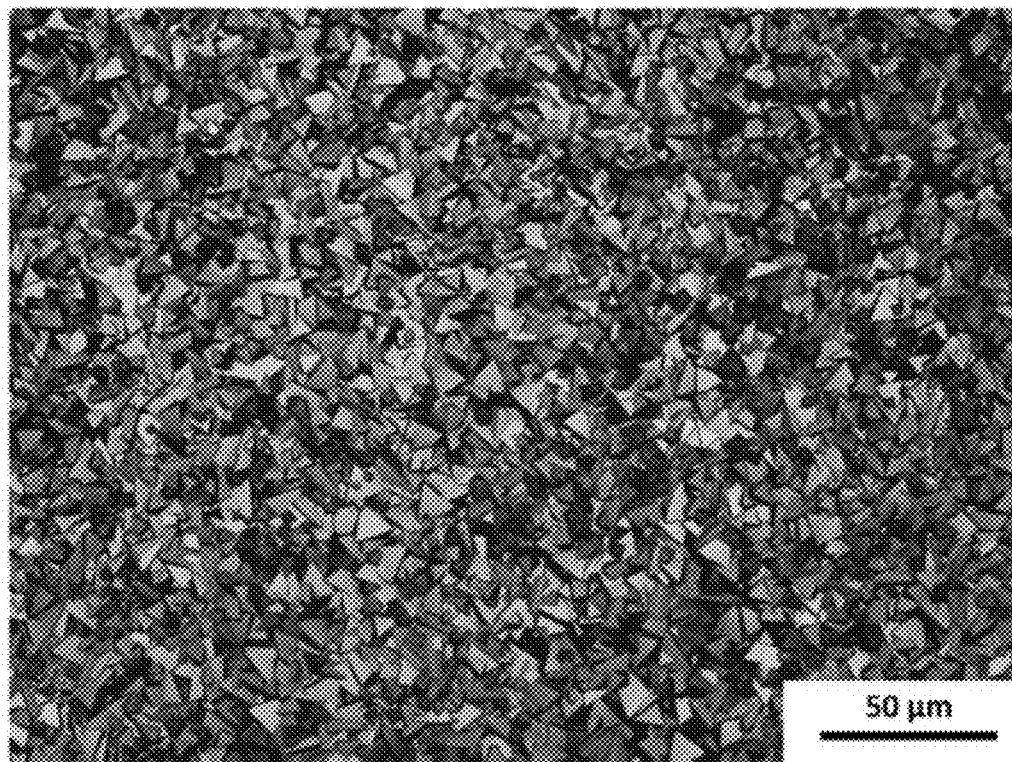
FIG. 17E is an example according to various embodiments illustrating Optical image of 80% Fc thin film.
Figure 17F:
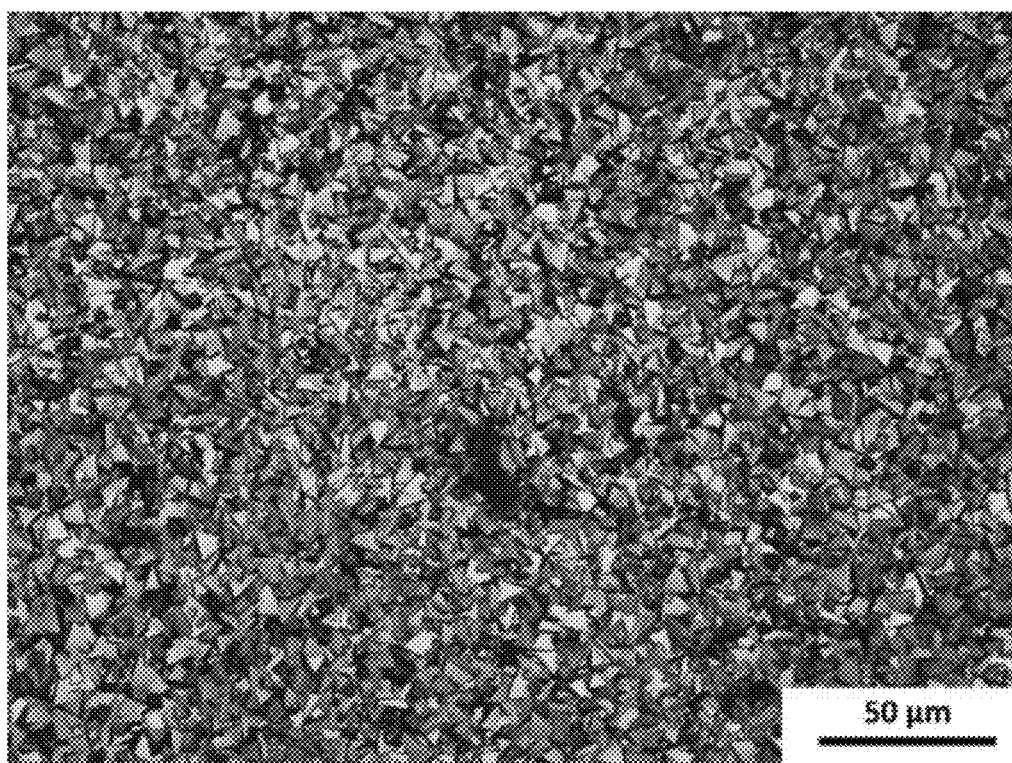
FIG. 17F is an example according to various embodiments illustrating Optical image of 100% Fc thin film.

FIG. 17A is an example according to various embodiments illustrating Optical image of 10% Fc thin film. FIG. 17B is an example according to various embodiments illustrating Optical image of 20% Fc thin film. FIG. 17C is an example according to various embodiments illustrating Optical image of 40% Fc thin film. FIG. 17D is an example according to various embodiments illustrating Optical image of 60% Fc thin film. FIG. 17E is an example according to various embodiments illustrating Optical image of 80% Fc thin film. FIG. 17F is an example according to various embodiments illustrating Optical image of 100% Fc thin film.

Gas Adsorption

Figure 18A:
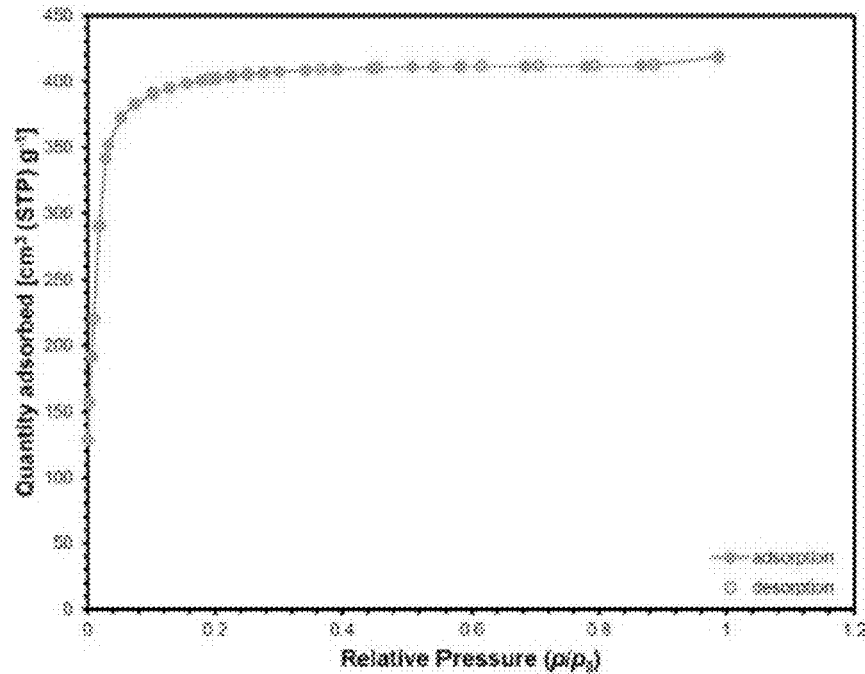
FIG. 18A is an example according to various embodiments illustrating 50% Fc nitrogen adsorption isotherm at 77 K.
Figure 18B:
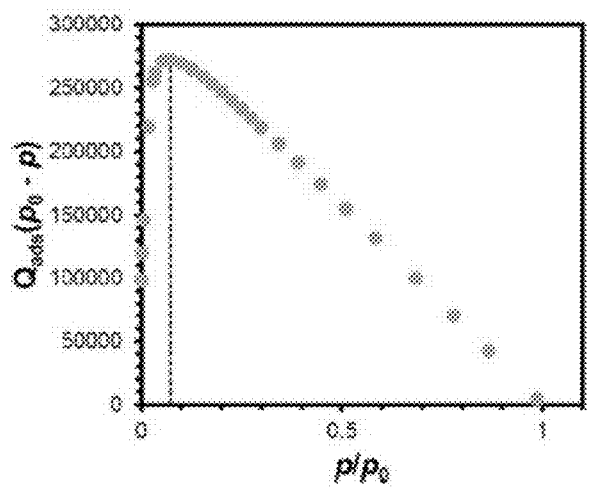
FIG. 18B is an example according to various embodiments illustrating 50% Fc in a Rouquerol plot.
Figure 18C:
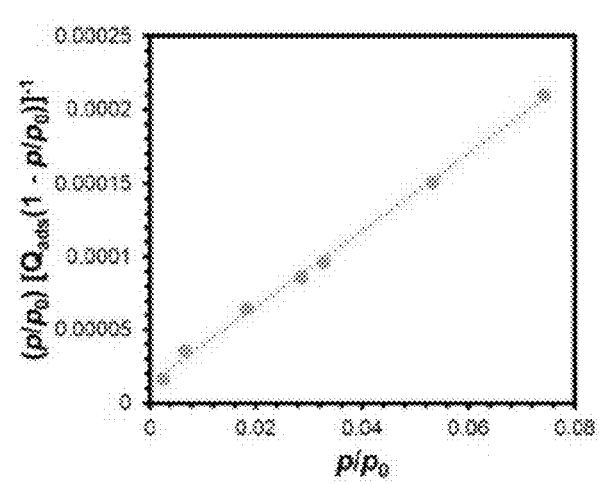
FIG. 18C is an example according to various embodiments illustrating 50% Fc in a BET plot.

FIG. 18A is an example according to various embodiments illustrating 50% Fc nitrogen adsorption isotherm at 77 K. FIG. 18B is an example according to various embodiments illustrating 50% Fc in a Rouquerol plot. FIG. 18C is an example according to various embodiments illustrating 50% Fc in a BET plot. FIG. 19A is an example according to various embodiments illustrating 100% Fc nitrogen adsorption isotherm at 77 K. FIG. 19B is an example according to various embodiments illustrating a Rouquerol plot of a 100% Fc sample. FIG. 19C is an example according to various embodiments illustrating a BET plot of a 100% Fc sample. Table 6 shows BET surface areas for various samples.

TABLE 6

| Sample | Surface Areas (m² g⁻¹) |
|---|---|
| 0% Fc | 1922 ± 46 |
| 50% Fc | 1652 ± 35 |
| 100% Fc | 1331 ± 15 |

Figure 20:
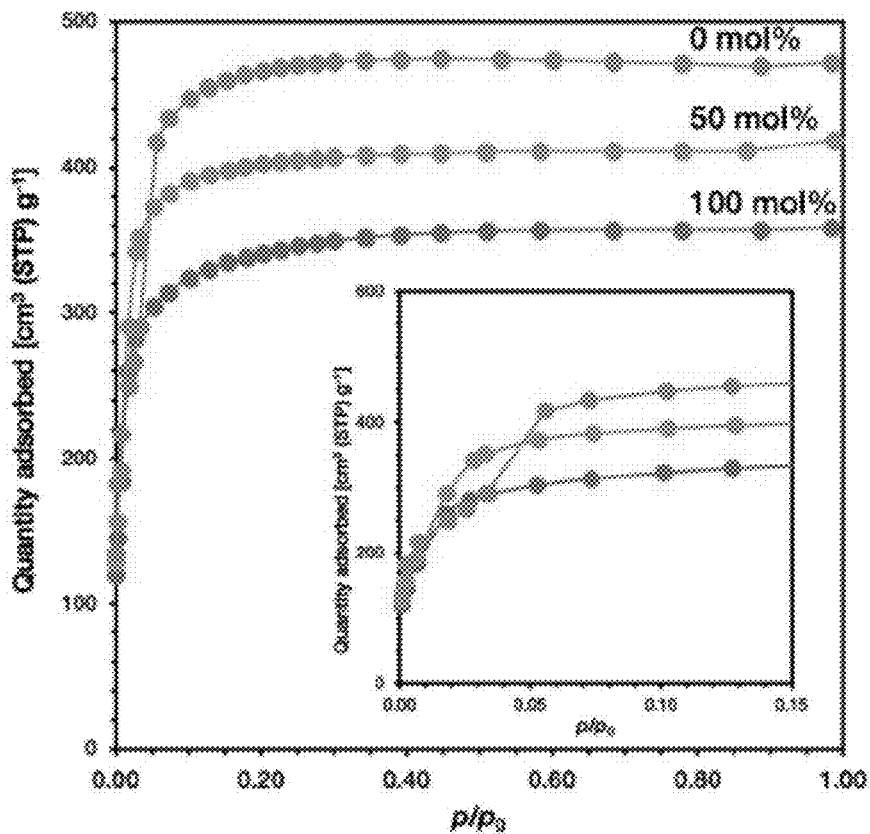
FIG. 20 is an example according to various embodiments illustrating Linear isotherms of three solid-solutions exhibiting the mesopore to micropore transition in the inset.
Figure 21:
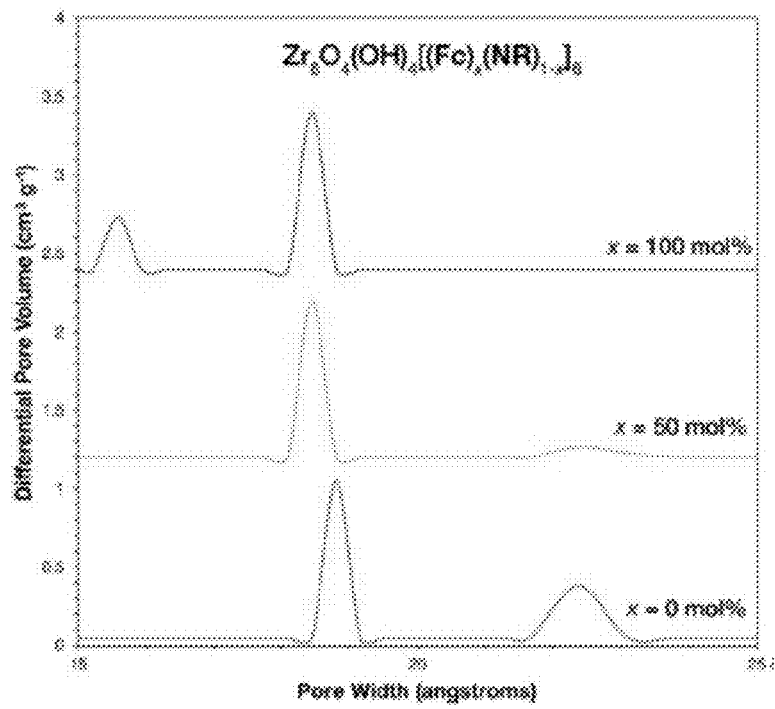
FIG. 21 is an example according to various embodiments illustrating Pore size distributions of Fc MOFs.

FIG. 20 is an example according to various embodiments illustrating Linear isotherms of three solid-solutions exhibiting the mesopore to micropore transition in the inset. FIG. 21 is an example according to various embodiments illustrating Pore size distributions of Fc MOFs.

Stability Studies

Figure 22:
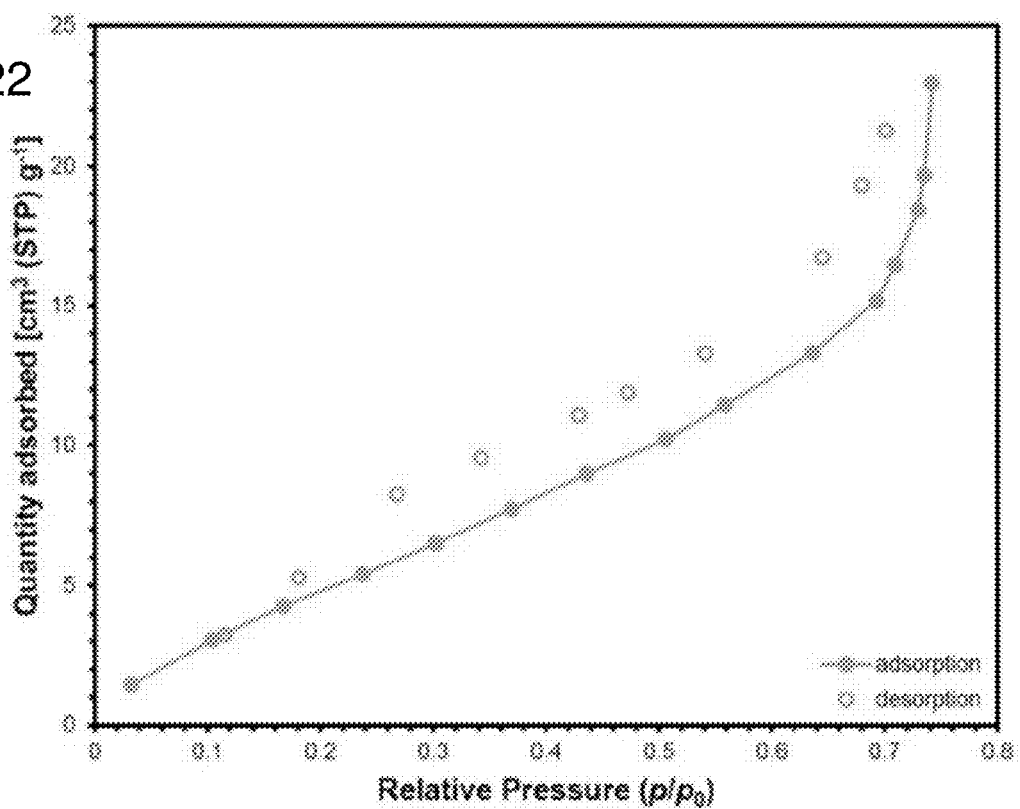
FIG. 22 is an example according to various embodiments illustrating 50% Fc water adsorption isotherm.
Figure 23:
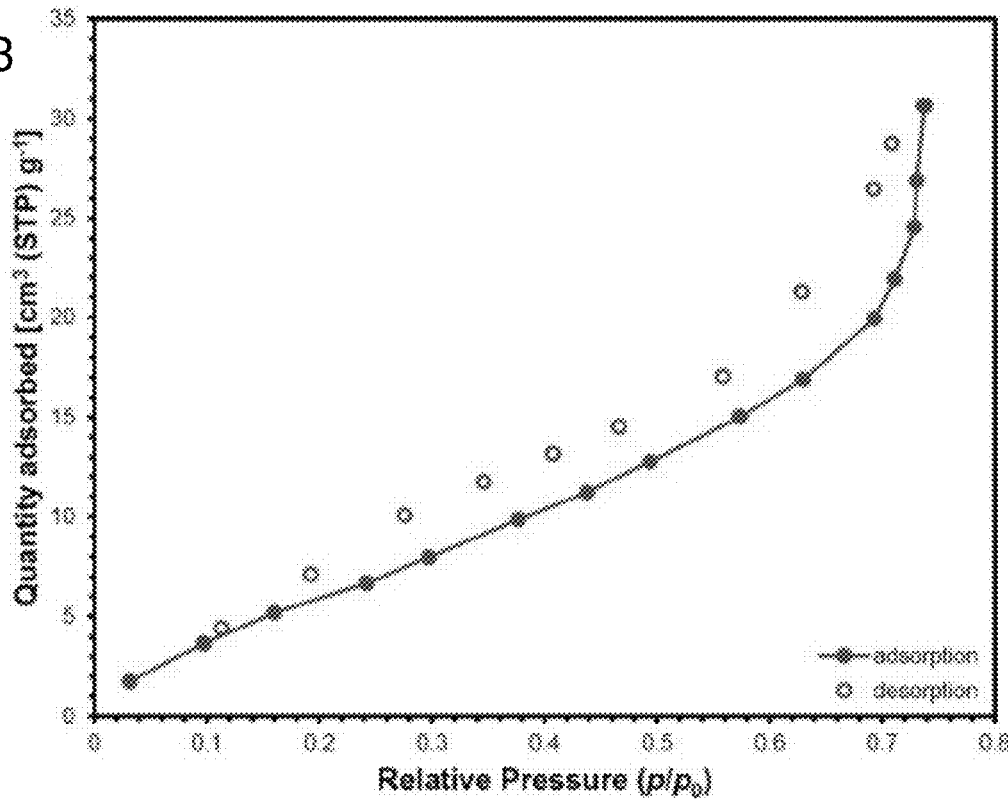
FIG. 23 is an example according to various embodiments illustrating 100% Fc water adsorption isotherm.

FIG. 22 is an example according to various embodiments illustrating 50% Fc water adsorption isotherm. FIG. 23 is an example according to various embodiments illustrating 100% Fc water adsorption isotherm. Table 7 shows BET surface areas of samples after water adsorption isotherms.

TABLE 7

| Sample | Surface Area - Before (m² g⁻¹) | Surface Area - After (m² g⁻¹) | Percent Decrease |
|---|---|---|---|
| 50% Fc | 1652 ± 35 | 1649 ± 35 | 0.2% |
| 100% Fc | 1331 ± 15 | 1327 ± 15 | 0.3% |

FIG. 24A is an example according to various embodiments illustrating a PXRD of Fc MOFs having the formula $Zr_6O_4(OH)_4[(Fc)_0(NR)_1]_6$ before and after water adsorption isotherms. FIG. 24B is an example according to various embodiments illustrating a PXRD of Fc MOFs having the formula $Zr_6O_4(OH)_4[(Fc)_{0.5}(NR)_{0.5}]_6$ before and after water adsorption isotherms. FIG. 24C is an example according to various embodiments illustrating a PXRD of Fc MOFs having the formula $Zr_6O_4(OH)_4[(Fc)_1(NR)_0]_6$ before and after water adsorption isotherms.

Figure 25:
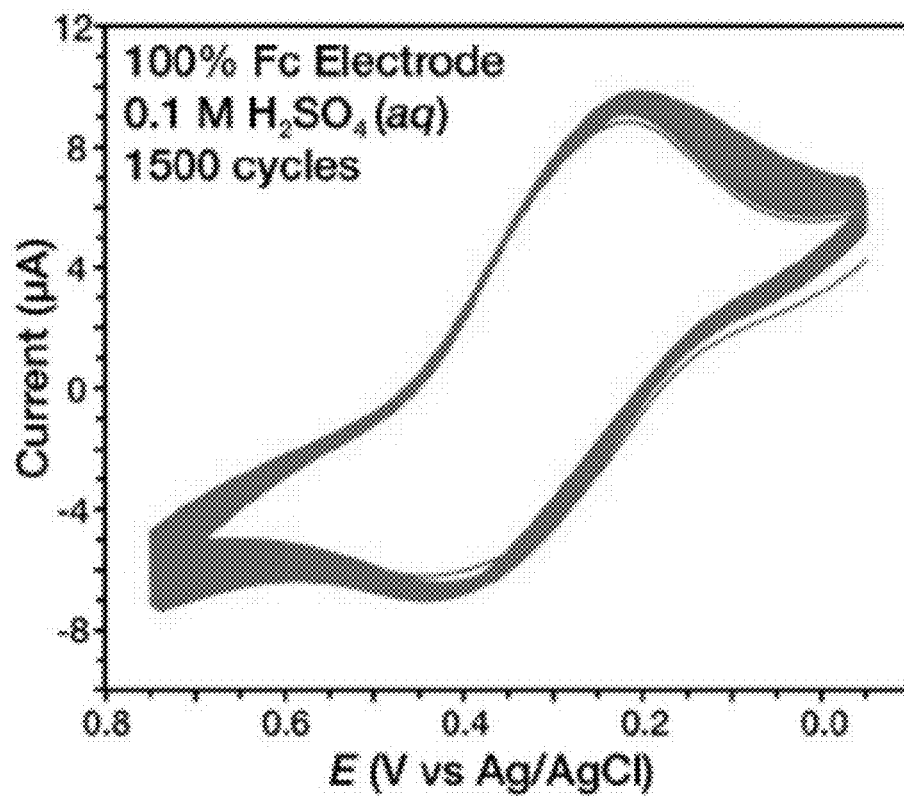
FIG. 25 is an example according to various embodiments illustrating 100% Fc MOF voltammogram in 0.1 M sulfuric acid medium run for 1500 cycles (scan rate: 50 mV $s_{-1}$).

FIG. 25 is an example according to various embodiments illustrating 100% Fc MOF voltammogram in 0.1 M sulfuric acid medium run for 1500 cycles (scan rate: 50 mV $s_{-1}$).

Figure 26:
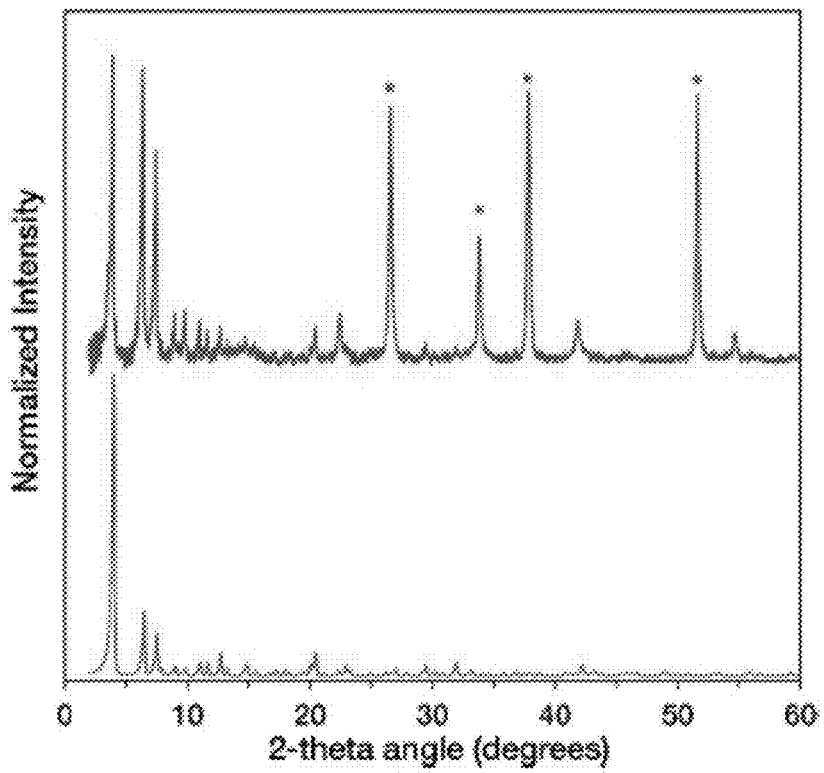
FIG. 26 is an example according to various embodiments illustrating 100% Fc PXRD before (bottom) and after (top) 1500 0.1 M sulfuric acid medium electrochemical cycles (*=FTO).
Figure 27A:
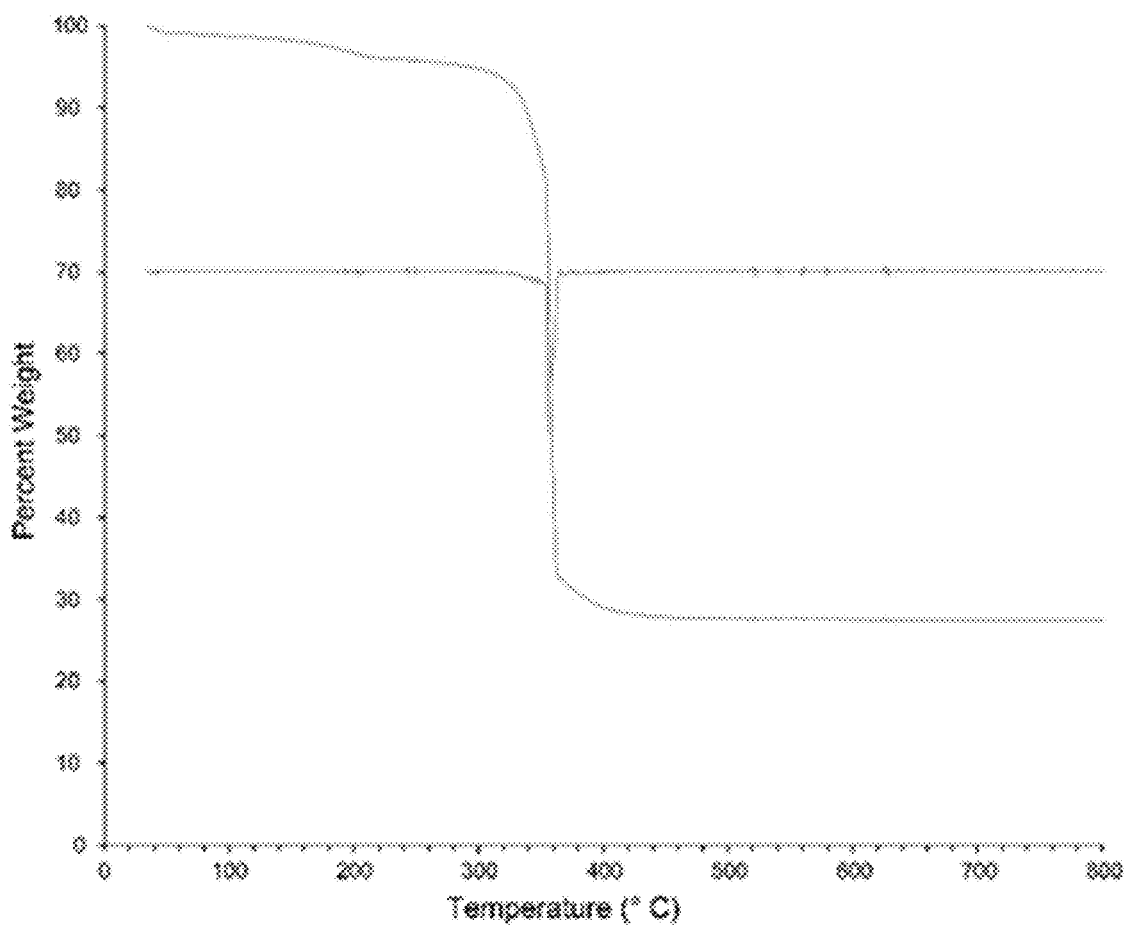
FIGS. 27A, 27B, 27C, 27D, 27E, 27F, and 27G are examples according to various embodiments illustrating TGA of Fc MOFs.
Figure 27B:
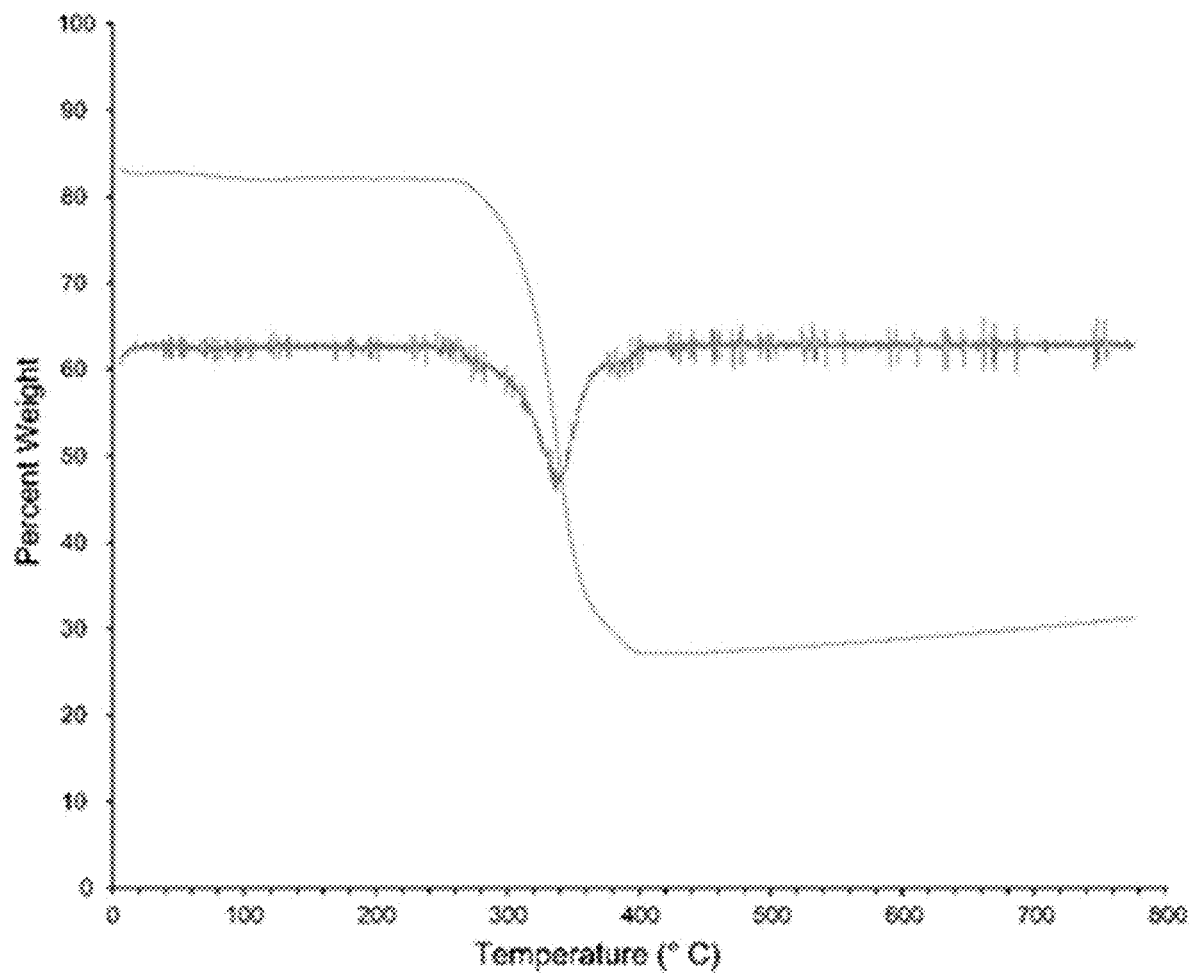
Figure 27C:
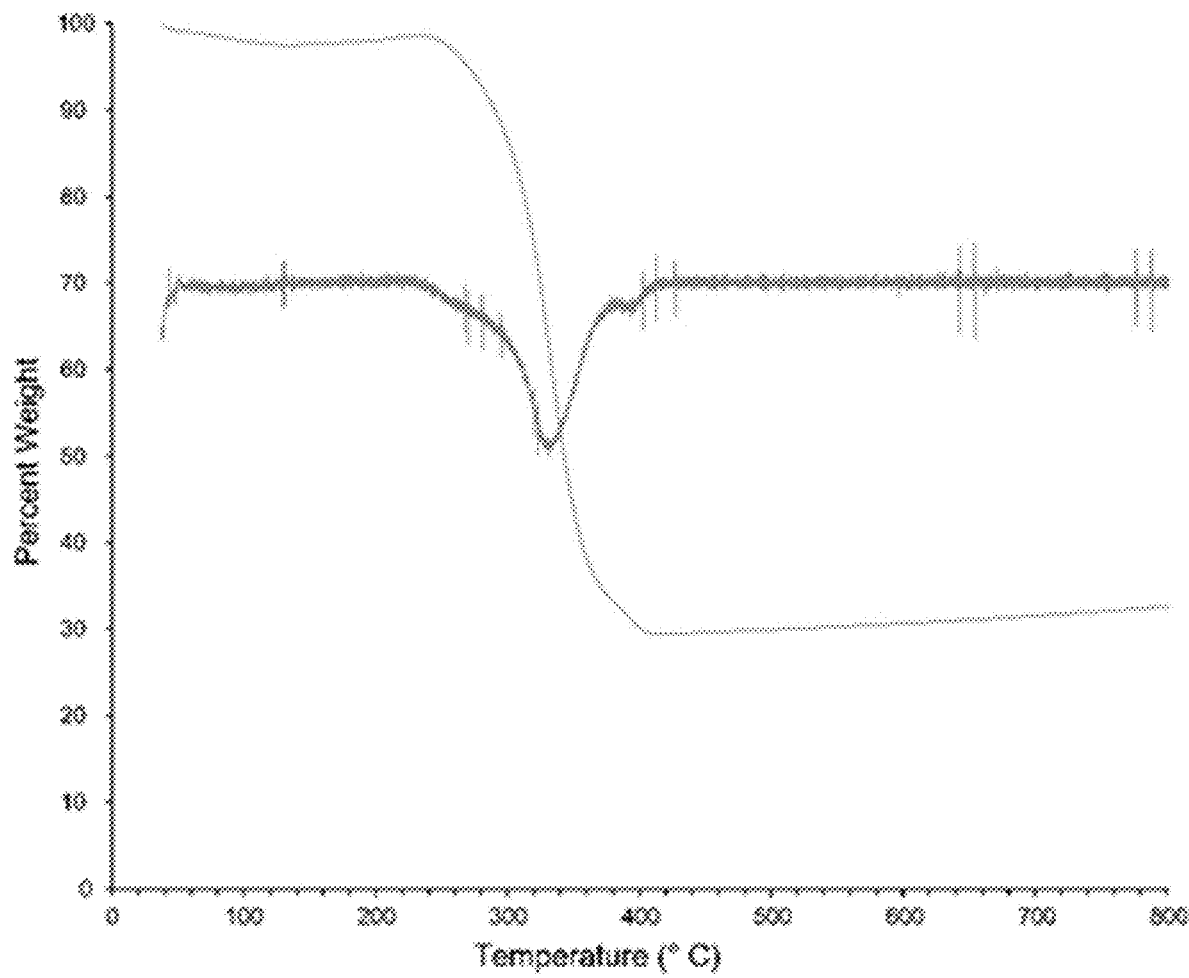
Figure 27D:
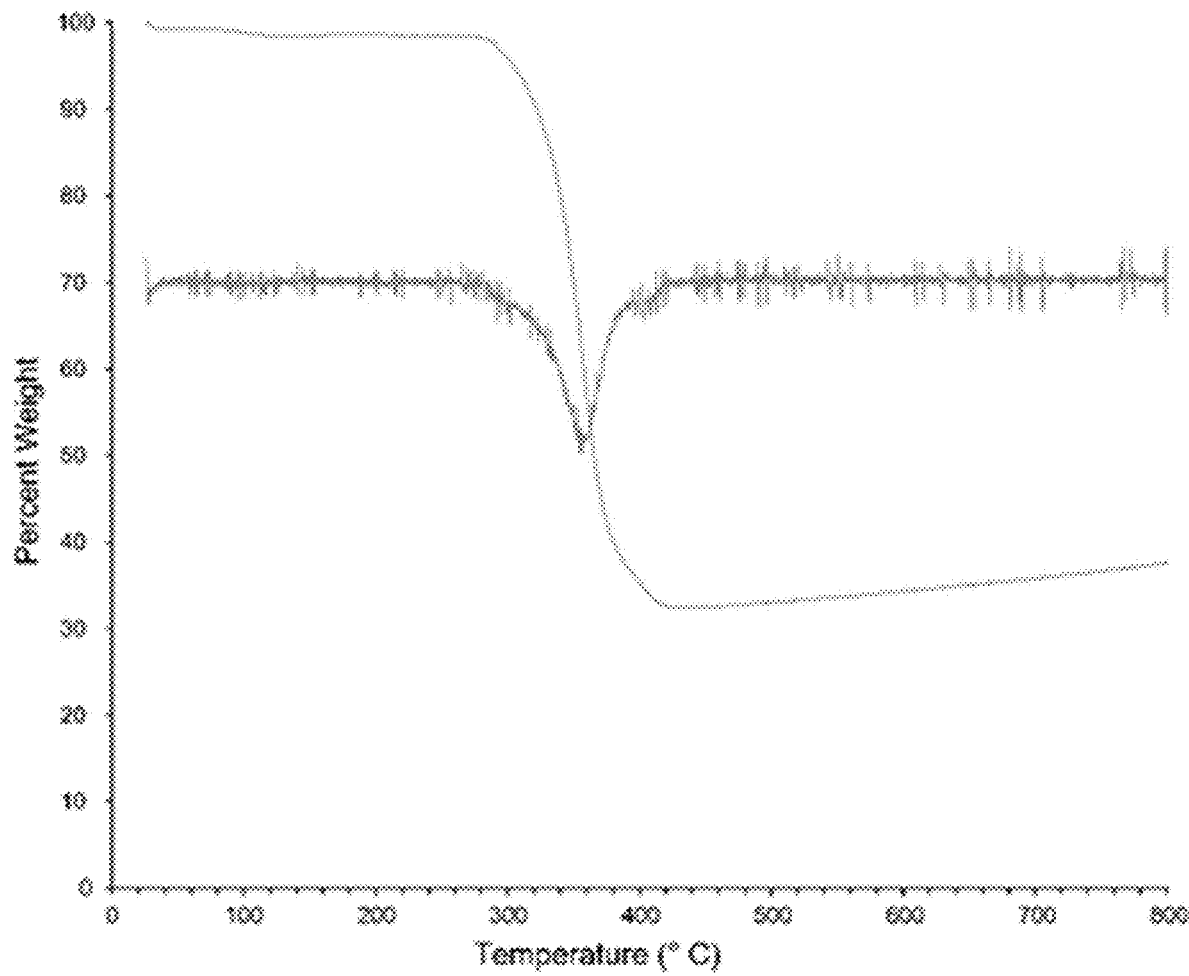
Figure 27E:
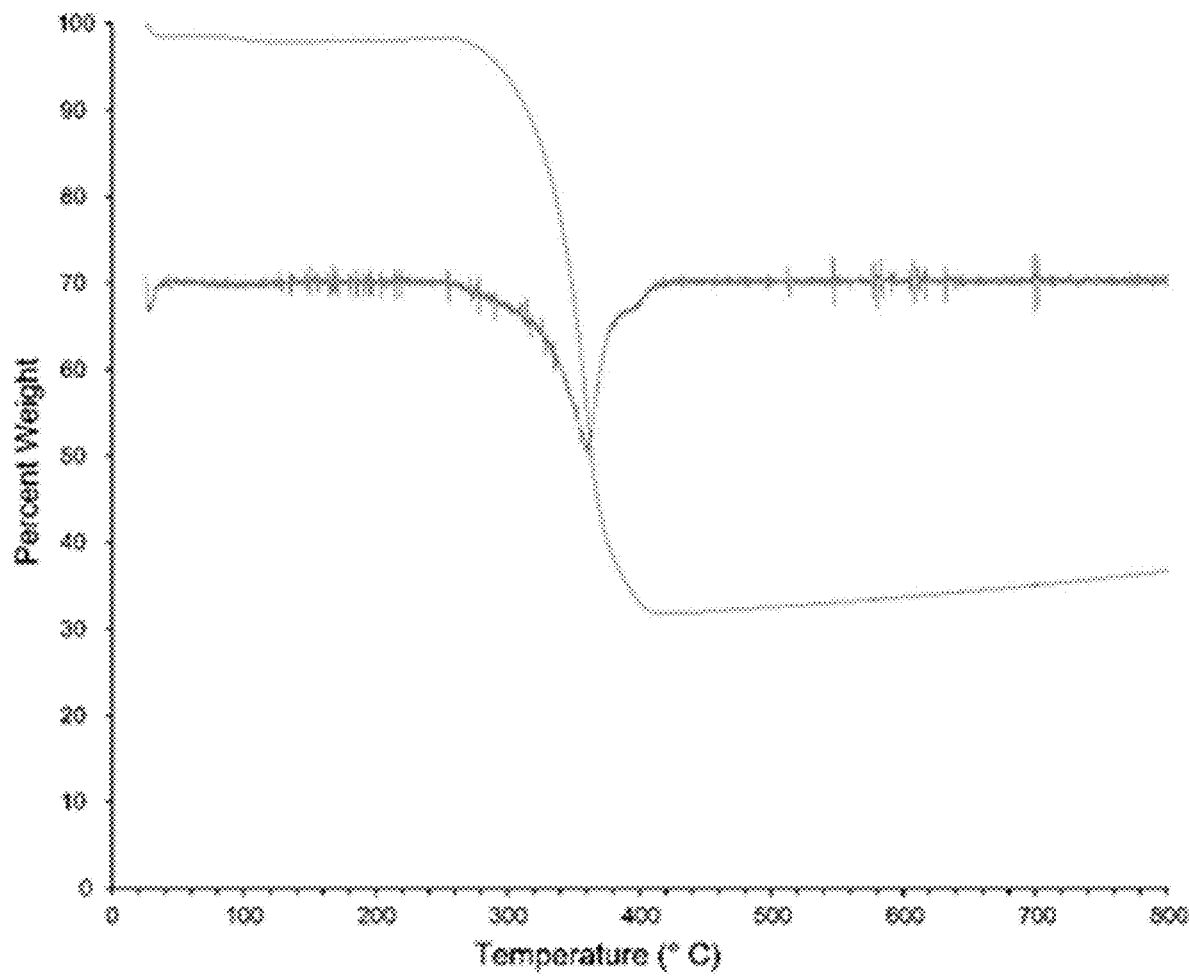
Figure 27F:
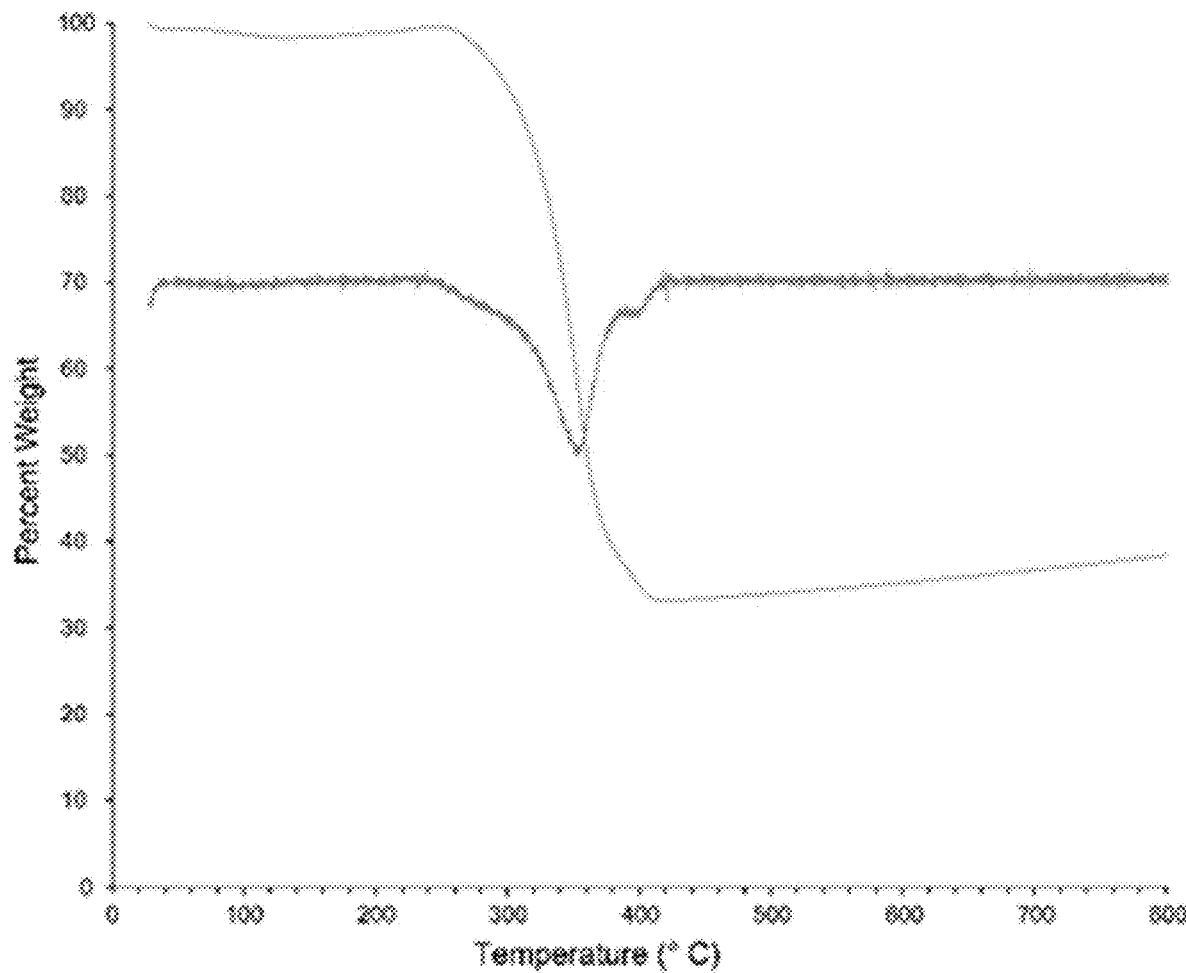
Figure 27G:
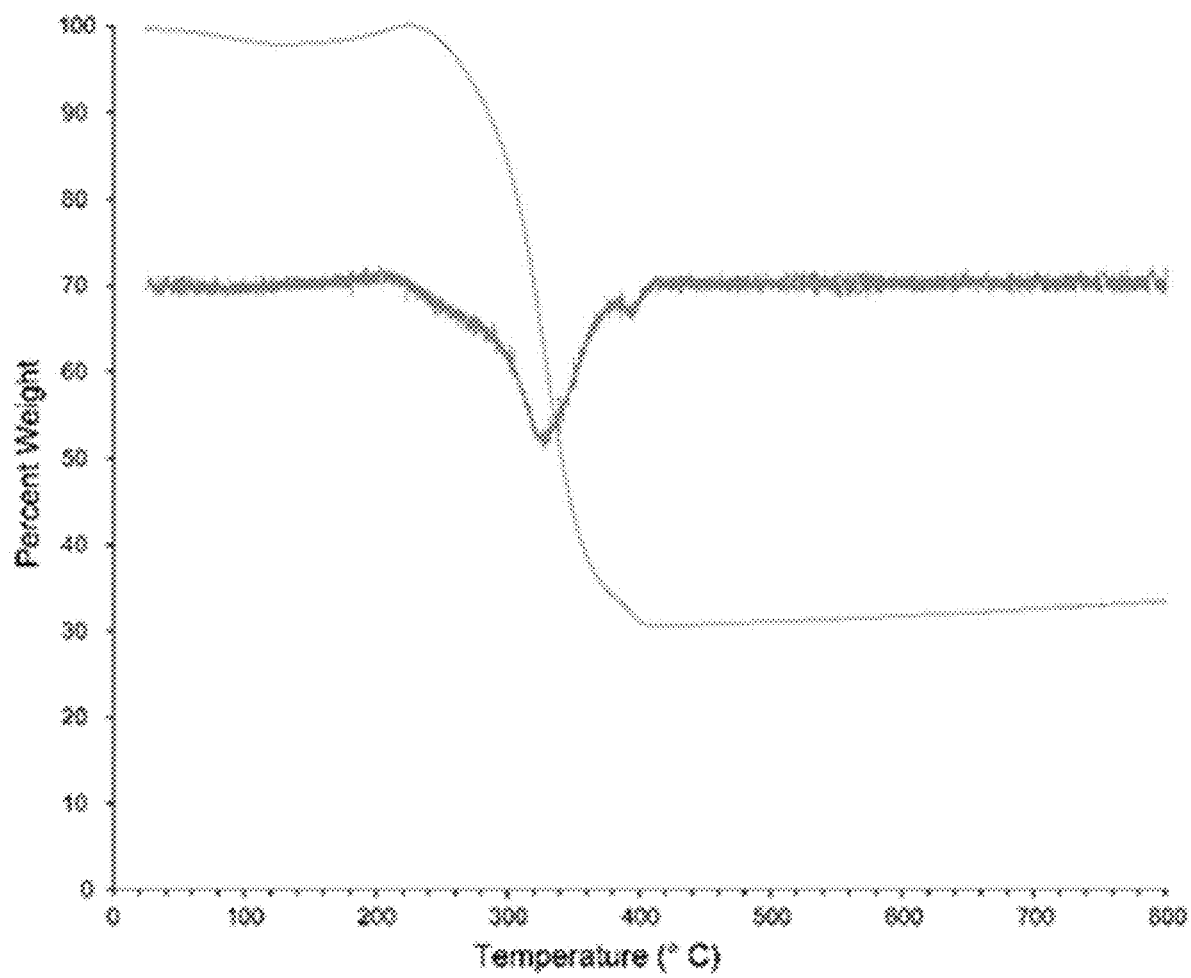

FIG. 26 is an example according to various embodiments illustrating 100% Fc PXRD before (bottom) and after (top) 1500 0.1 M sulfuric acid medium electrochemical cycles (*=FTO). Note that the only major difference in diffraction is a decrease in the intensity of the 111 peak.

Thermogravimetric Analysis

FIGS. 27A, 27B, 27C, 27D, 27E, 27F, and 27G are examples according to various embodiments illustrating TGA of Fc MOFs (blue line is linear, orange line is first derivative).

Infrared Spectroscopy

Figure 28:
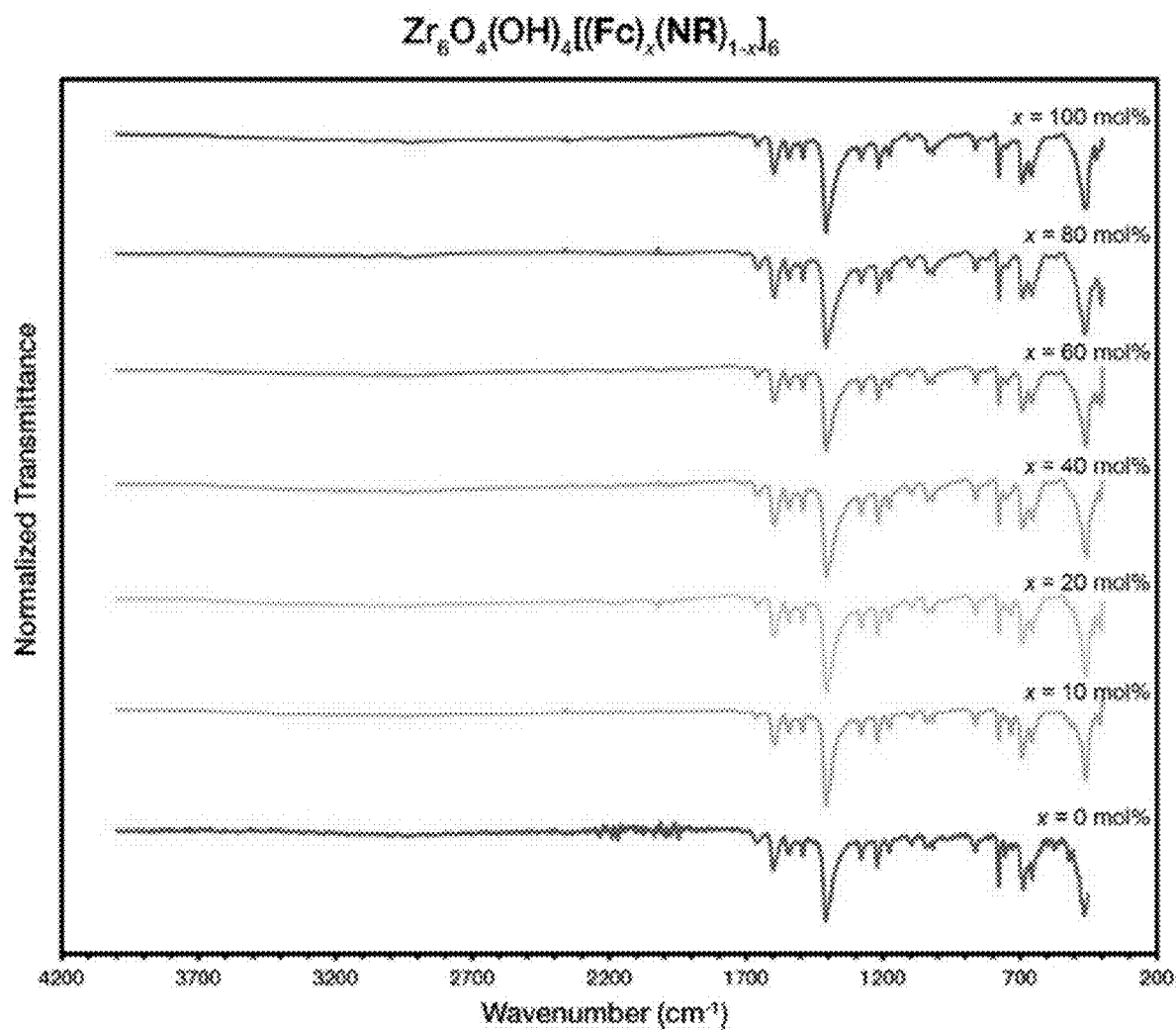
FIG. 28 is an example according to various embodiments illustrating FTIR of Fc MOFs.

FIG. 28 is an example according to various embodiments illustrating FTIR of Fc MOFs.

What is claimed is:

1. A method for producing a metal-organic framework (MOF) having a desired redox conductivity and comprising redox-active linkers, each having ω-alkyl-ferrocene groups, the method comprising:

combining, in a solvent comprising $ZrOCl_2$, one or more redox-active linkers and one or more redox-inactive linkers in a ratio sufficient to provide the MOF with the desired redox conductivity, wherein at least one of the one or more redox-active linkers comprise the following formula:

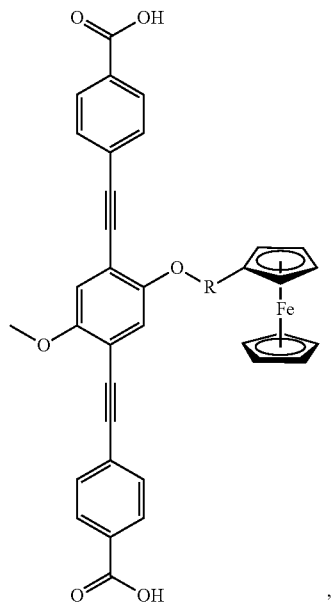

R being a $C_1$ to $C_{24}$ alkyl;

wherein at least one of the one or more redox-inactive linkers comprise the following formula:

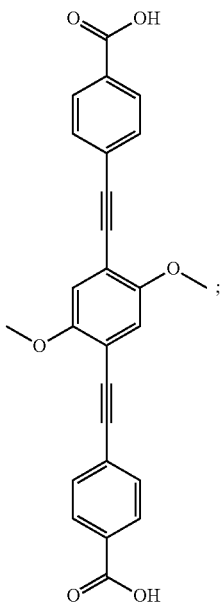

and wherein the produced MOF comprises the following formula:

$$Zr_6O_4(OH)_4[Fc_xNR_{1-x}]_6;$$

wherein Fc represents the plurality of redox-active linkers, wherein NR represents the one or more redox-inactive linkers, and wherein x is from 2 to 100.

2. The method according to claim 1, wherein the MOF displays a maximum electron conductivity of about 122 mS $cm^{-1}$.

3. The method according to claim 1, wherein the MOF displays crystallographic and electrochemical stability upon a number of redox cycles greater than 1,000.

* * * * *